United States Patent
Fujimori et al.

(10) Patent No.: US 7,255,971 B2
(45) Date of Patent: *Aug. 14, 2007

(54) POSITIVE RESIST COMPOSITION

(75) Inventors: Toru Fujimori, Shizuoka (JP); Yasumasa Kawabe, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 47 days.

This patent is subject to a terminal disclaimer.

(21) Appl. No.: 10/244,070

(22) Filed: Sep. 16, 2002

(65) Prior Publication Data
US 2003/0134225 A1  Jul. 17, 2003

(30) Foreign Application Priority Data

Sep. 19, 2001 (JP) .......................... P.2001-285180
Jan. 7, 2002 (JP) .......................... P.2002-000563

(51) Int. Cl.
G03C 1/73 (2006.01)
G03F 7/039 (2006.01)

(52) U.S. Cl. .................... 430/270.1; 430/326; 430/907

(58) Field of Classification Search ............ 430/270.1, 430/326, 905, 907, 909, 914
See application file for complete search history.

(56) References Cited

U.S. PATENT DOCUMENTS

| 5,876,900 A | 3/1999 | Watanabe et al. |
| 6,042,991 A * | 3/2000 | Aoai et al. ............... 430/285.1 |
| 6,106,993 A * | 8/2000 | Watanabe et al. ......... 430/270.1 |
| 6,291,130 B1 * | 9/2001 | Kodama et al. .......... 430/270.1 |
| 6,479,211 B1 * | 11/2002 | Sato et al. ............... 430/270.1 |
| 6,511,785 B1 | 1/2003 | Takemura et al. |
| 6,605,408 B2 * | 8/2003 | Nishi et al. ............... 430/270.1 |
| 2001/0008739 A1 * | 7/2001 | Nishiyama et al. ......... 430/176 |
| 2001/0026901 A1 * | 10/2001 | Maeda et al. ............ 430/270.1 |

FOREIGN PATENT DOCUMENTS

| EP | 0 520 654 A1 | 12/1992 |
| EP | 0 788 031 A1 | 8/1997 |
| EP | 0 803 775 A1 | 10/1997 |
| EP | 0 869 393 A1 | 10/1998 |
| EP | 1 122 604 A2 | 8/2001 |
| JP | 5-173333 A | 7/1993 |
| JP | 9-50126 * | 2/1997 |
| JP | 9-274320 A | 10/1997 |
| JP | 10-265524 A | 10/1998 |
| JP | 2000-66382 A | 3/2000 |
| JP | 2000-298349 A | 10/2000 |
| JP | 2001-83709 A | 3/2001 |
| JP | 2001-1422199 A | 5/2001 |
| WO | WO 00/01684 A1 | 1/2000 |

OTHER PUBLICATIONS

Machine-assisted English translation for JP 9-50126, provided by JPO.*
European Search Report dated Dec. 20, 2002.

* cited by examiner

Primary Examiner—Sin Lee
(74) Attorney, Agent, or Firm—Sughrue Mion, PLLC

(57) ABSTRACT

A positive resist composition comprising the components of: (A) a compound capable of generating an acid upon irradiation with one of an actinic ray and a radiation; (B) a resin that is insoluble or slightly soluble in alkalis, but becomes alkali-soluble under an action of an acid; (C) a basic compound; and (D) a compound comprising at least three hydroxyl groups or at least three substituted hydroxyl groups, and comprising at least one cyclic structure.

11 Claims, No Drawings

POSITIVE RESIST COMPOSITION

FIELD OF THE INVENTION

The present invention relates to a positive resist composition used in a process of manufacturing semiconductors such as ICs, for producing circuit boards of liquid crystal and thermal head, and in a photofabrication process for other devices. More specifically, the invention is concerned with a positive resist composition suitable for cases in which far ultraviolet light with wavelengths of 250 nm or shorter is used as an exposure light source or an electron beam is used as an irradiation source.

BACKGROUND OF THE INVENTION

Chemical amplification positive resist compositions are materials that form patterns on substrates as follows. When irradiated with far ultraviolet radiation or the like, those resist compositions generate acids in the irradiated areas, and undergo reaction utilizing the acids as a catalyst to cause a difference in solubility in a developer between the areas unirradiated and irradiated with the actinic rays, thereby enabling pattern formation.

In the case where KrF excimer laser is an exposure light source, resins containing as their basic skeletons poly(hydroxystyrene) showing weak absorption in the region of 240 nm are used as a main component. Therefore, such resist compositions have high sensitivity and can form good-quality patterns at high resolution, compared with traditional resist compositions containing naphthoquinone-diazide/navolak resin combinations.

However, when light sources of shorter wavelengths, such as ArF exceimer laser (193 nm), are used for exposure, even the aforementioned resist compositions of chemical amplification type are not satisfactory, because compounds having aryl groups intrinsically show strong absorption at wavelengths around 193 nm.

On the other hand, utilization of poly(meth)acrylate as a polymer showing weak absorption in the region of 193 nm is described in *J. Vac. Sci. Technol.*, B9, 3357 (1991). However, that polymer has a problem of being inferior to conventional phenol resins having aryl groups in resistance to dry etching generally carried out in the fabrication process for semiconductors.

In keeping with the recent trend toward finer patterning and higher throughput, it becomes increasingly important to reduce errors caused by exposure. The hitherto known resist compositions have narrow exposure margin and bad line edge roughness, which are impediments to heighten throughput.

Further, the recent finer patterning results in the aspect ratio being strict about the coating thickness also, and so the patterns formed have a tendency to topple easily. This tendency is observed noticeably in the cases of ArF resist, electron beam (EB) resist, vacuum ultraviolet (VUV) resist and extremely short ultraviolet (EUV) resist. Herein, the term "toppling of patterns" is intended to include all pattern-toppling phenomena regardless of what are their causes, e.g., whether the phenomenon is induced by lack of adhesion or coating strength.

SUMMARY OF THE INVENTION

It is therefore an aim of the invention to provide a positive resist composition satisfactory in line edge roughness.

A further aim of the invention is to provide a positive resist composition of excellent quality that can produce patterns prevented from toppling even when there are variations of focus and exposure in fine patterning.

These aims of the invention are attained by a positive resist composition containing the following ingredients (hereinafter designated as Embodiment (1)):

(A) a compound that can generate an acid when irradiated with actinic rays or radiation, (B) a resin that is insoluble or slightly soluble in alkalis, but becomes alkali-soluble under action of an acid, (C) a basic compound, and (D) a compound having at least three hydroxyl groups or substituted hydroxyl groups and at least one cyclic structure.

The following are preferred embodiments of the invention.

(2) A positive resist composition as described in Embodiment (1), wherein the compound (D) is a compound having at least three hydroxyl groups and at least one cyclic structure, wherein at least one of the hydroxyl groups and other groups of the compound is protected (blocked) with at least one acid-decomposable group.

(3) A positive resist composition as described in Embodiment (1) or (2), wherein the resin (B) is a resin having at least one phenolic hydroxyl group structure and capable of decomposing through action of an acid to increase in solubility in an alkaline developer.

(4) A positive resist composition as described in Embodiment (1) or (2), wherein the resin (B) is a resin having mono- or polycyclohydrocarbon structure (alicyclic hydrocarbon structure that is monocyclic or polycyclic) and capable of decomposing through action of an acid to increase in solubility in an alkaline developer.

(5) A positive resist composition as described in Embodiment (1) or (2), wherein the resin (B) is a resin having a structure that fluorine atoms are substituted in the main chain, side chains or both chains of the polymer skeleton and capable of decomposing through action of an acid to increase in solubility in an alkaline developer.

(6) A positive resist composition as described in any of Embodiments (1) to (5), further containing (E) a surfactant having at least one of fluorine-containing groups and silicon-containing groups.

(7) A positive resist composition as described in any of Embodiments (1) to (5), further containing (F) a mixture of a hydroxyl group-containing solvent and a hydroxyl group-free solvent.

DETAILED DESCRIPTION OF THE INVENTION

The compounds usable in the invention are described below in detail.

<<(A) Compounds Capable of Generating Acids when Irradiated with Actinic Rays or Radiation>>

The present composition contains as Component (A) a compound capable of generating an acid when irradiated with actinic rays or radiation (a photo-acid generator).

Such a photo-acid generator can be selected appropriately from photo-initiators for cationic photo-polymerization, photo-initiators for radical photo-polymerization, photo-decoloring agents for dyes, photo-discoloring agents, known compounds capable of generating acids when irradiated with actinic rays or radiation, or mixtures of two or more thereof.

Examples of a photo-acid generator usable in the invention include onium salts, such as diazonium salts, ammonium salts, phosphonium salts, iodonium salts, sulfonium salts, selenonium salts and arsonium salts; organic halogen compounds; organometallic/halogenated organic compounds; photo-acid generators having protecting groups of o-nitrobenzyl type; compounds generating sulfonic acid by photolysis as represented by iminosulfonate; and disulfone compounds.

In addition, it is also possible to use polymers having main or side chains in which are introduced the groups or compounds capable of generating acids when irradiated with actinic rays or radiation. Examples of such polymers include the compounds disclosed in U.S. Pat. No. 3,849,137, German Patent No. 3,914,407, and Japanese Patent Laid-Open Nos. 26653/1988, 164824/1980, 69263/1987, 146038/1988, 163452/1988, 153853/1987 and 146029/1988.

Further, the compounds capable of generating acids upon exposure to light as disclosed in U.S. Pat. No. 3,779,778 and European Patent No. 125,712 can be employed.

Of the compounds capable of generating acids when irradiated with actinic rays or radiation, the following compounds are used to particular advantage.

(1) Iodonium salts represented by the following formula (PAG1), or sulfonium salts represented by the following formula (PAG2):

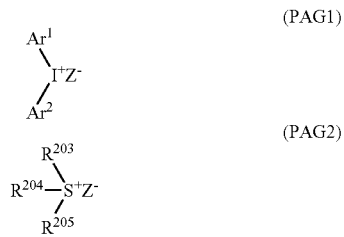

wherein, $Ar^1$ and $Ar^2$ independently represent a substituted or unsubstituted aryl group. As suitable examples of a substituent the aryl group can have, mention may be made of an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^{203}$, $R^{204}$ and $R^{205}$ independently represent a substituted or unsubstituted alkyl or aryl group. Preferably, they are each an aryl group having 6 to 14 carbon atoms (which may hereinafter be called as "a 6-14C aryl group"), a 1-8C alkyl group or a substituted derivative thereof.

As a substituent the aryl group can have, a 1-8C (1 to 8 carbon atoms-containing) alkoxy group, a 1-8C alkyl group, a nitro group, a carboxyl group, a hydroxyl group and a halogen atom are suitable. As a substituent the alkyl group can have, a 1-8C alkoxy group, a carboxyl group and an alkoxycarbonyl group are suitable.

$Z^-$ represents a counter ion, with examples including $BF_4^-$, $AsF_6^-$, $PF_6^-$, $SbF_6^-$, $SiF_6^{2-}$, $ClO_4^-$, perfluoroalkanesulfonic acid anions such as $CF_3SO_3^-$, pentafluorobenzenesulfonic acid anion, condensed polynuclear aromatic sulfonic acid anions such as naphthalene-1-sulfonic acid anion, anthraquinonesulfonic acid anion, and dyes containing sulfonic acid groups. However, the counter anion of $Z^-$ should not be construed as being limited to those examples.

In addition, any two of $R^{203}$, $R^{204}$ and $R^{205}$, and $Ar^1$ and $Ar^2$ may be combined with each other via their respective single bonds or substituent groups.

Examples of those onium salts are illustrated below, but these exemplified compounds should not be construed as limiting the scope of photo-acid generators usable in the invention.

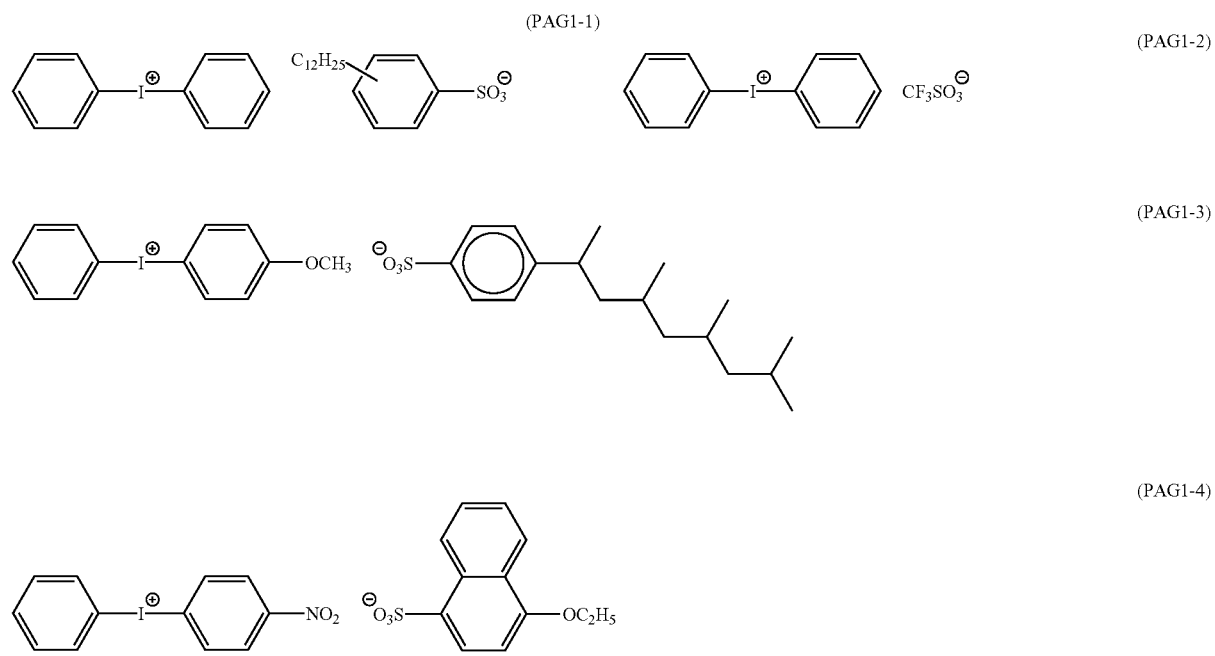

-continued
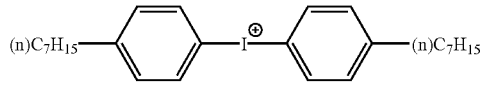 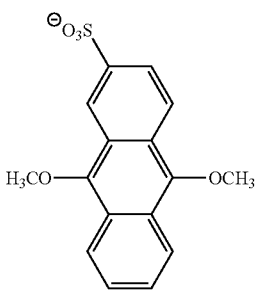
(PAG1-5)
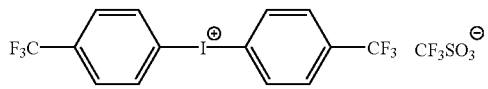 (PAG1-6) 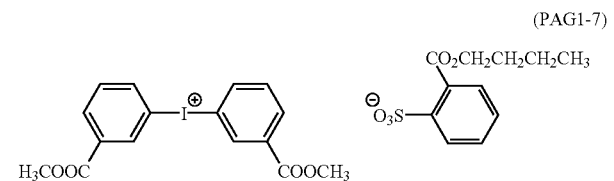 (PAG1-7)
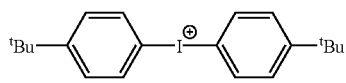 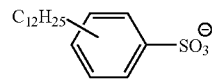 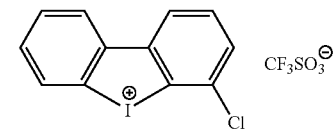
(PAG1-8) (PAG1-9)
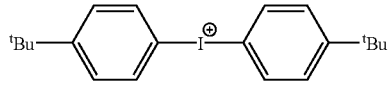 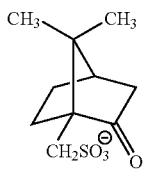
(PAG1-10)
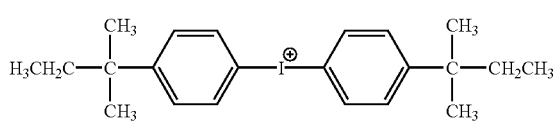 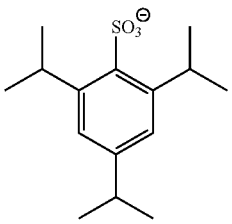
(PAG1-11)
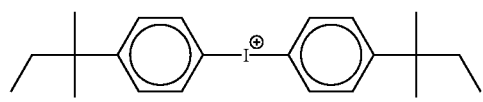  (PAG1-12) (PAG1-13)
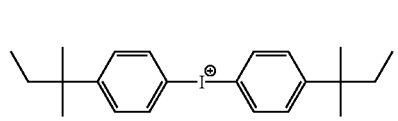 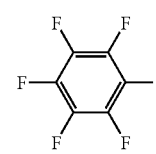
(PAG1-14) (PAG2-1)
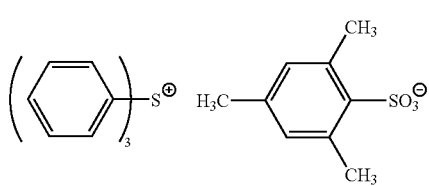  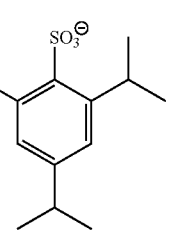
(PAG2-2) (PAG2-3)

-continued
(PAG2-4) 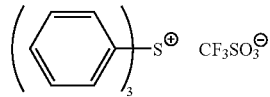
(PAG2-5) 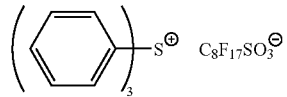
(PAG2-6) 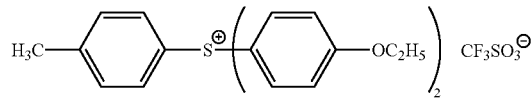
(PAG2-7) 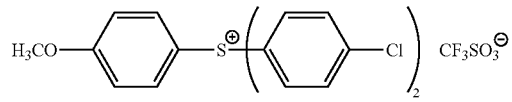
(PAG2-8) 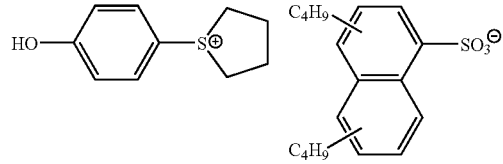
(PAG2-9) 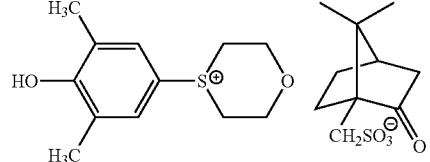
(PAG2-10) 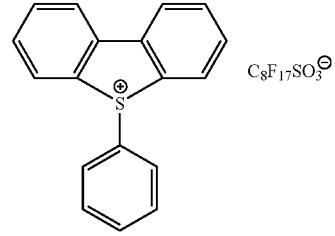
(PAG2-11) 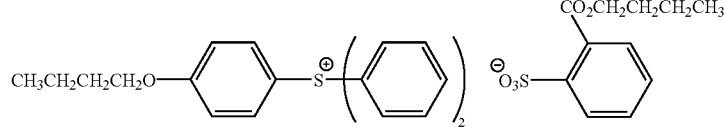
(PAG2-12) 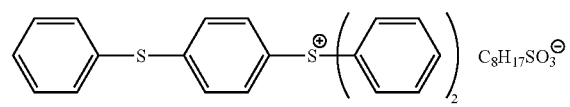
(PAG2-13) 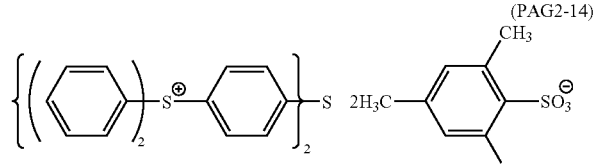
(PAG2-14) 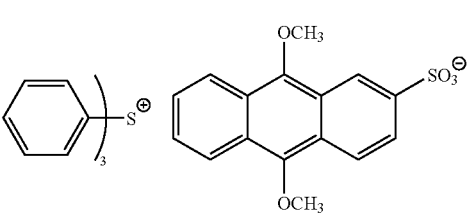
(PAG2-15) 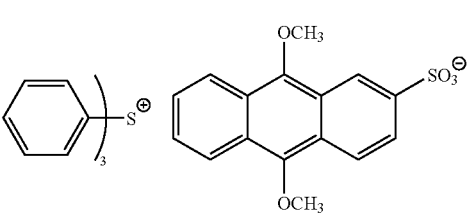
(PAG2-16) 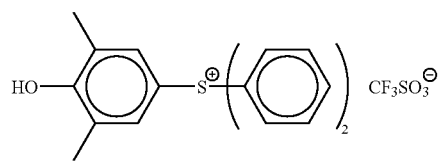
(PAG2-17) 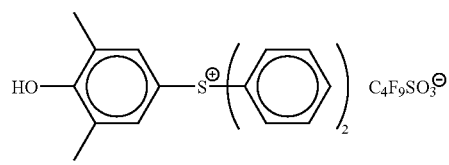
(PAG2-18) 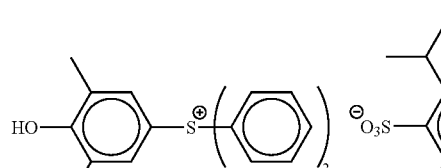
(PAG2-19) 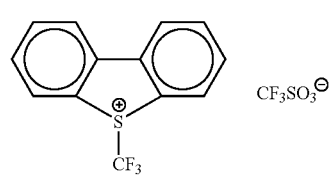

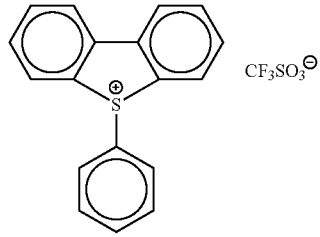
(PAG2-20)

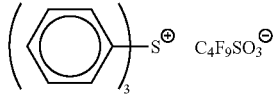
(PAG2-21)

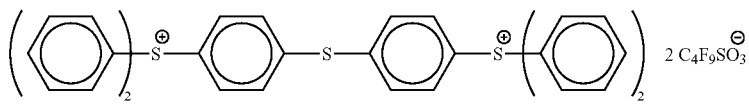
(PAG2-22)

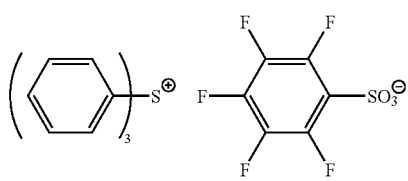
(PAG2-23)

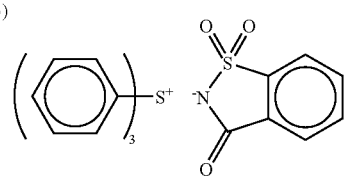
(PAG2-24)

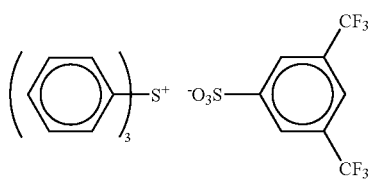
(PAG2-25)

The onium salts represented by formulae (PAG1) and (PAG2) respectively are known compounds, and can be synthesized using the methods as disclosed in U.S. Pat. Nos. 2,807,648 and 4,247,473, and Japanese Patent Laid-Open No. 101331/1978.

(2) Disulfone derivatives represented by the following formula (PAG3), or iminosulfonate derivatives represented by the following formula (PAG4):

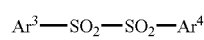
(PAG3)

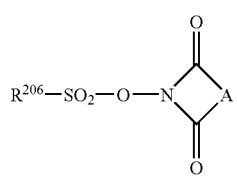
(PAG4)

wherein, Ar³ and Ar⁴ independently represent a substituted or unsubstituted aryl group, R²⁰⁶ represents a substituted or unsubstituted alkyl or aryl group, and A represents a substituted or unsubstituted alkylene, alkenylene or arylene group.

Examples of those derivatives are illustrated below, but these exemplified compounds should not be construed as limiting the scope of photo-acid generators usable in the invention.

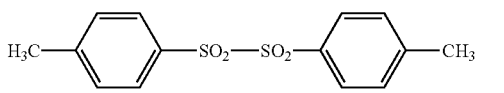
(PAG3-1)

(PAG3-2)

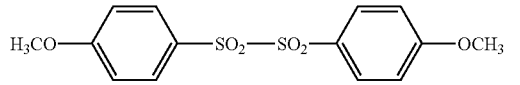
(PAG3-3)

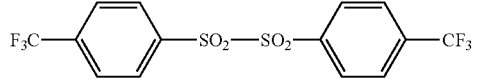
(PAG3-4)

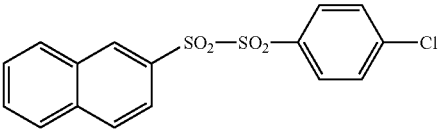
(PAG3-5)

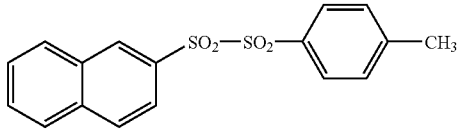
(PAG3-6)

-continued (PAG3-7)
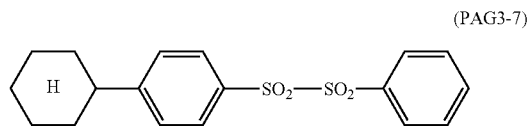

(PAG4-1)
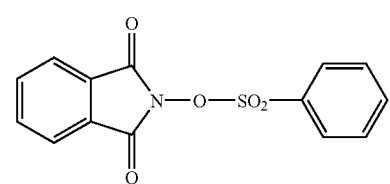

(PAG4-2)
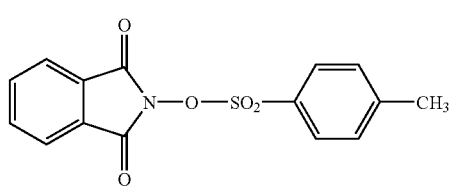

(PAG4-3)
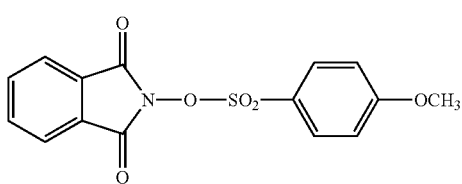

(PAG4-4)
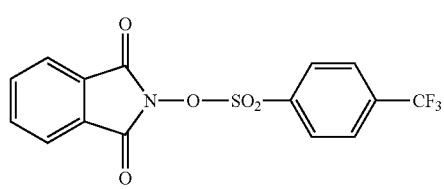

(PAG4-5)
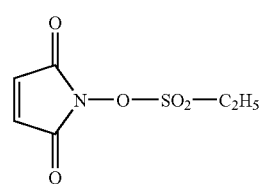

(PAG4-6)
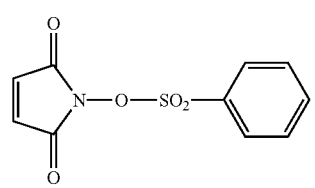

(PAG4-7)
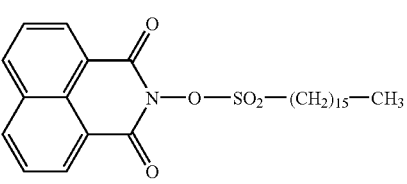

(3) Diazodisulfone derivatives represented by the following formula (PAG5):

(PAG5)
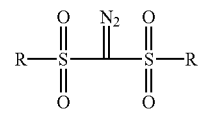

wherein, R represents a linear, branched or cyclic alkyl group, or an unsubstituted or substituted aryl group.

The following are examples of those derivatives, but these exemplified compounds should not be construed as limiting the scope of photo-acid generators usable in the invention.

(PAG5-1)

(PAG5-2)
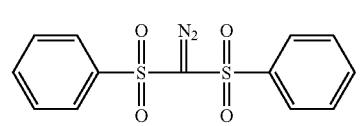

(PAG5-3)

(PAG5-4)
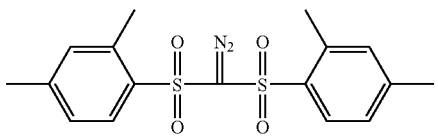

(PAG5-5)
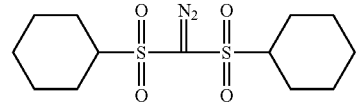

In addition to the compounds as recited above, compounds represented by the following general formula (PAG6) can be used effectively as acid generators of the present Component (A)

(PAG6)
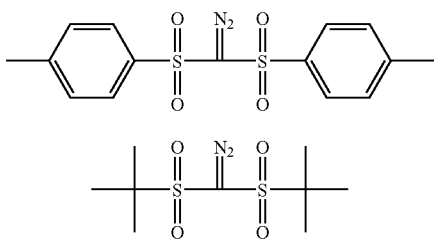

Herein, each of $R_1$ to $R_5$ represents a hydrogen atom, an alkyl group, an alkoxy group, a nitro group, a halogen atom, an alkyloxycarbonyl group or an aryl group, or at least two of $R_1$ to $R_5$ may combine with each other to form a cyclic structure.

$R_6$ and $R_7$ each represent a hydrogen atom, an alkyl group, a cyano group or an aryl group.

$Y_1$ and $Y_2$ each represent an alkyl group, an aryl group, an aralkyl group, or a hetero atom-containing aromatic group, or $Y_1$ and $Y_2$ may combine with each other to form a ring.

$Y_3$ represents a single bond or a divalent linkage group.

$X^-$ represents a non-nucleophilic anion.

Therein, however, it is required for at least one of $R_1$ to $R_5$ and at least either $Y_1$ or $Y_2$ to combine with each other to form a ring, or it is required for at least one of $R_1$ to $R_5$ and at least either $R_6$ and $R_7$ to combine with each other to form a ring.

Additionally, the compound may be a compound formed by combining at least two structures as represented by formula (PAG6) via a linkage group at the position of any of $R_1$ to $R_7$ or either $Y_1$ or $Y_2$ in each structure.

The alkyl group represented by each of $R_1$ to $R_7$ is a substituted or unsubstituted alkyl group, preferably a 1-5C alkyl group. Examples of such an unsubstituted alkyl group include methyl, ethyl, propyl, n-butyl, sec-butyl and t-butyl groups.

The alkoxy group represented by each of $R_1$ to $R_5$ or the alkoxy moiety of alkyloxycarbonyl group represented by each of $R_1$ to $R_5$ is a substituted or unsubstituted alkoxy group, preferably a 1-5C alkoxy group. Examples of such an unsubstituted alkoxy group include methoxy, ethoxy, propoxy and butoxy groups.

The aryl group represented by each of $R_1$ to $R_7$, $Y_1$ and $Y_2$ is a substituted or unsubstituted aryl group, preferably a 6-14C aryl group. Examples of such an unsubstituted aryl group include phenyl, tolyl and naphthyl groups.

The halogen atom represented by each of $R_1$ to $R_5$ is a fluorine, chlorine, bromine or iodine atom.

The alkyl group represented by each of $Y_1$ and $Y_2$ is a substituted or unsubstituted alkyl group, preferably a 1-30C alkyl group. Examples of such an unsubstitued alkyl group include linear and branched alkyl groups, such as methyl, ethyl, propyl, n-butyl, sec-butyl and t-butyl groups, and cyclic alkyl groups, such as cyclopropyl, cyclopentyl, cyclohexyl, adamantyl, norbornyl and bornyl groups.

The aralkyl group represented by each of $Y_1$ and $Y_2$ is a substituted or unsubstituted aralkyl group, preferably a 7-12C aralkyl group. Examples of such an unsubstituted aralkyl group include benzyl, phenetyl and cumyl groups.

The hetero atom-containing aromatic group is intended to include 6-14C aryl groups containing hetero atoms, such as nitrogen, oxygen and sulfur atoms, in their respective aromatic rings.

The hetero atom-containing aromatic group represented by each of Y1 and Y2 is a substituted or unsubstituted aromatic group containing a hetero atom or hetero atoms. As examples of such an aromatic group, mention may be made of heterocyclic aromatic hydrocarbon groups, such as furanyl, thiophenyl, pyrrolyl, pyridyl and indolyl groups.

$Y_1$ and $Y_2$ may be combined with each other and form a ring together with the $S^+$ in formula (PAG6).

In this case, the group formed by combining $Y_1$ and $Y_2$ is, e.g., a 4-10C alkylene group, preferably a butylene, pentylene or hexylene group, particularly preferably a butylene or pentylene group.

Further, the ring formed of the $Y_1$-$Y_2$ combination and the $S^+$ in formula (PAG6) may contain a hetero atom or hetero atoms.

Each of the alkyl, alkoxy, alkoxycarbonyl, aryl and aralkyl groups as recited above may have a substituent group, such as a nitro group, a halogen atom, a carboxyl group, a hydroxyl group, an amino group, a cyano group, an alkoxy group (preferably containing 1 to 5 carbon atoms).

Of the aryl and aralkyl groups, they each may further be substituted with an alkyl group (preferably containing 1 to 5 carbon atoms).

As substituents the alkyl group can have, halogen atoms are preferred.

$Y_3$ represents a single bond or a divalent linkage group. Suitable examples of such a divalent linkage group include alkylene and arylene groups which may have substituents, —O—, —S—, —CO—, —CONR— (wherein R is a hydrogen atom, an alkyl group or an acyl group), and linkage groups formed by combining at least two of the groups recited above.

The non-nucleophilic anion represented by $X^-$ is a sulfonic acid anion or a carboxylic acid anion.

The non-nucleophilic anion refers to the anion that has very poor capability to cause nucleophilic reaction and can prevent the compound from decomposing through intramolecular nucleophilic reaction with the lapse of time. By the presence of this anion, the storage stability of the resist is enhanced.

Examples of a sulfonic acid anion include alkylsulfonic acid anions, arylsulfonic acid anions and camphorsulfonic acid anions.

Examples of a carboxylic acid anion include alkylcarboxylic acid anions, arylcarboxylic acid anions and aralkylcarboxylic acid anions.

Suitable examples of an alkyl moiety present in each of the alkylsulfonic acid anions include 1-30C alkyl groups, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl and bornyl groups.

Suitable examples of an aryl moiety present in each of the arylsulfonic acid anions include 6-14C aryl groups, such as phenyl, tolyl and naphthyl groups.

The alkyl moieties in the alkylsulfonic acid anions and the aryl moieties in the arylsulfonic acid anions may have substituent groups.

Examples of such substituent groups include halogen atoms, alkyl groups, alkoxy groups and alkylthio groups.

Examples of such halogen atoms include chlorine, bromine, fluorine and iodine atoms.

Examples of such alkyl groups include methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups, preferably 1-15C alkyl groups.

Examples of such alkoxy groups include 1-5C alkoxy groups, such as methoxy, ethoxy, propoxy and butoxy groups.

Examples of such alkylthio groups include methylthio, ethylthio, propylthio, isopropylthio, n-butylthio, isobutylthio, sec-butylthio, pentylthio, neopentylthio, hexylthio, heptylthio, octylthio, nonylthio, decylthio, undecyltho, dodecylthio, tridecylthio, tetradecylthio, pentadecylthio, hexadecylthio, heptadecylthio, octadecylthio, nonadecylthio and eicosylthio groups, preferably 1-15C alkylthio groups. Additionally, the alkyl groups, the alkoxy groups and the alkylthio groups as recited above may further be substituted with halogen atoms (preferably fluorine atoms).

As examples of alkyl moieties in the alkylcarboxylic acid anions, mention may be made of the same alkyl groups as recited in the case of the alkylsulfonic acid anions.

As examples of aryl moieties in the arylcarboxylic acid anions, mention may be made of the same aryl groups as recited in the case of the arylsulfonic acid anions.

As suitable examples of aralkyl moieties in the aralkylcarboxylic acid anions, mention may be made of 6-12C aralkyl groups, such as benzyl, phenetyl, naphthylmethyl and naphthylethyl groups.

The alkyl, aryl and aralkyl moieties respectively present in the alkylcarboxylic, arylcarboxylic and aralkylcarboxylic acid anions may have substituent groups. Examples of such substituent groups include the same halogen atoms, alkyl groups, alkoxy groups and alkylthio groups as in the case of the arylsulfonic acid anions.

Examples of other non-nucleophilic anions include $PF_6^-$, $BF_4^-$ and $SbF_6^-$.

In the present formula (PAG6), a ring is formed by combining at least one of $R_1$ to $R_5$ with at least either $Y_1$ or $Y_2$, or by combining at least one of $R_1$ to $R_5$ with at least either $R_7$ or $R_8$. By forming the ring, the three-dimensional structure of the compound of formula (PAG6) is made fast, and the light resolution is enhanced.

Also, at least two structures as represented by formula (PAG6) may be combined via a linkage group at the position of any of $R_1$ to $R_7$ or either $Y_1$ or $Y_2$ in each structure, thereby forming a compound.

Of the compounds represented by formula (PAG6), compounds of the following formula (PAG6A) or (PAG6B) are preferred over the others:

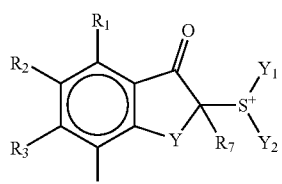

(PAG6A)

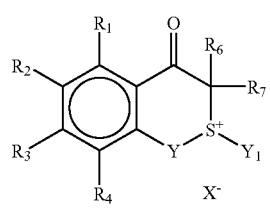

(PAG6B)

In formula (PAG6A), $R_1$ to $R_4$, $R_7$, $Y_1$, $Y_2$ and $X^-$ have the same meanings as in formula (PAG6), respectively, and Y represents a single bond or a divalent linkage group.

In formula (PAG6B), $R_1$ to $R_4$, $R_6$, $R_7$, $Y_1$ and $X^-$ have the same meanings as in formula (PAG6), respectively, and Y represents a single bond or a divalent linkage group.

Suitable examples of a divalent linkage group represented by Y include unsubstituted or substituted alkylene and alkenylene groups, —O—, —S—, —CO—, —CONR— (wherein R is a hydrogen atom, an alkyl group or an acyl group), and linkage groups formed by combinations of at least two of the groups recited above.

As the Y in formula (PAG6A), an alkylene group, an oxygen-containing alkylene group or a sulfur-containing alkylene group is suitable. Specifically, a methylene group, an ethylene group, a propylene group, —CH₂—O— and —CH₂—S— are preferred as Y. In particular, a linkage group capable of forming a 6-membered ring, such as an ethylene group, —CH₂—O— or —CH₂—S—, is advantageous. By forming the 6-membered ring, the carbonyl plane and the C—S⁺ bond become more perpendicular to each other, and the orbital interaction between them enables improvement in light resolution efficiency.

The compounds represented by formula (PAG6A) can be prepared by reacting the corresponding α-halogenated cyclic ketones with a sulfide compound, or by converting the corresponding cyclic ketones into silyl enol ethers and then reacting the ethers with a sulfoxide. The compounds represented by formula (PAG6B) can be prepared by reaction between arylalkylsulfides and α- or β-halogenated halide.

Examples of compounds represented by formula (PAG6) are illustrated below, but these examples should not be construed as limiting the scope of the invention in any way.

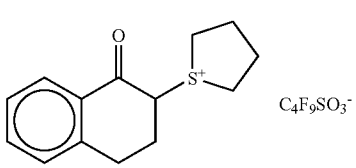

(PAG6A-1)

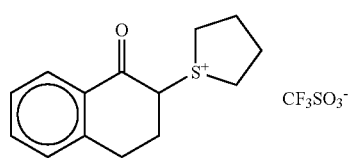

(PAG6A-2)

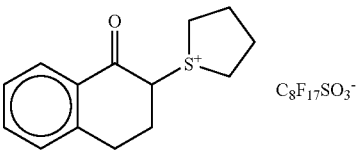

(PAG6A-3)

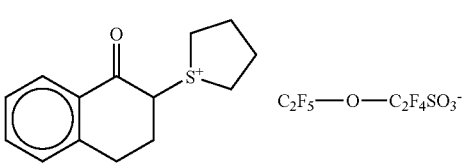

(PAG6A-4)

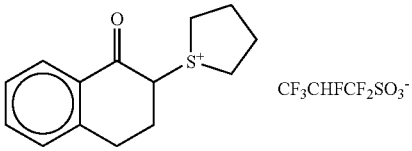

(PAG6A-5)

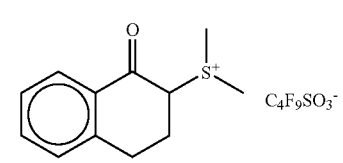

(PAG6A-6)

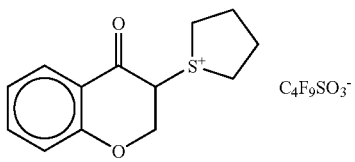

(PAG6A-7)

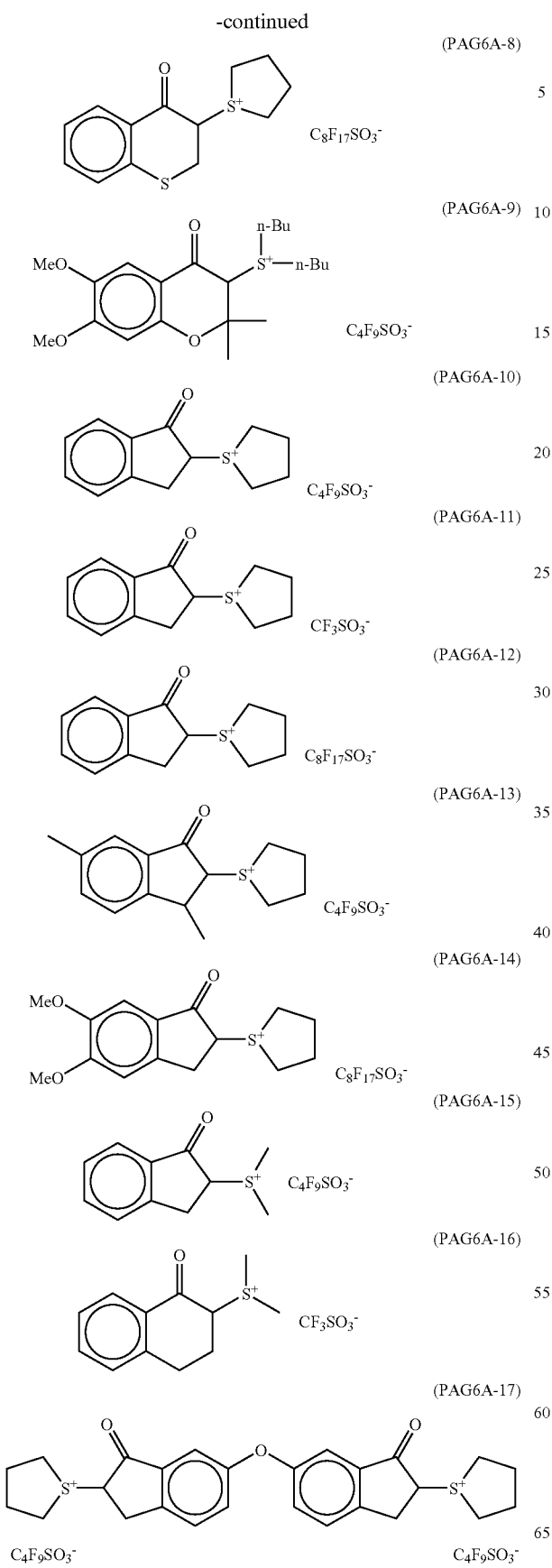
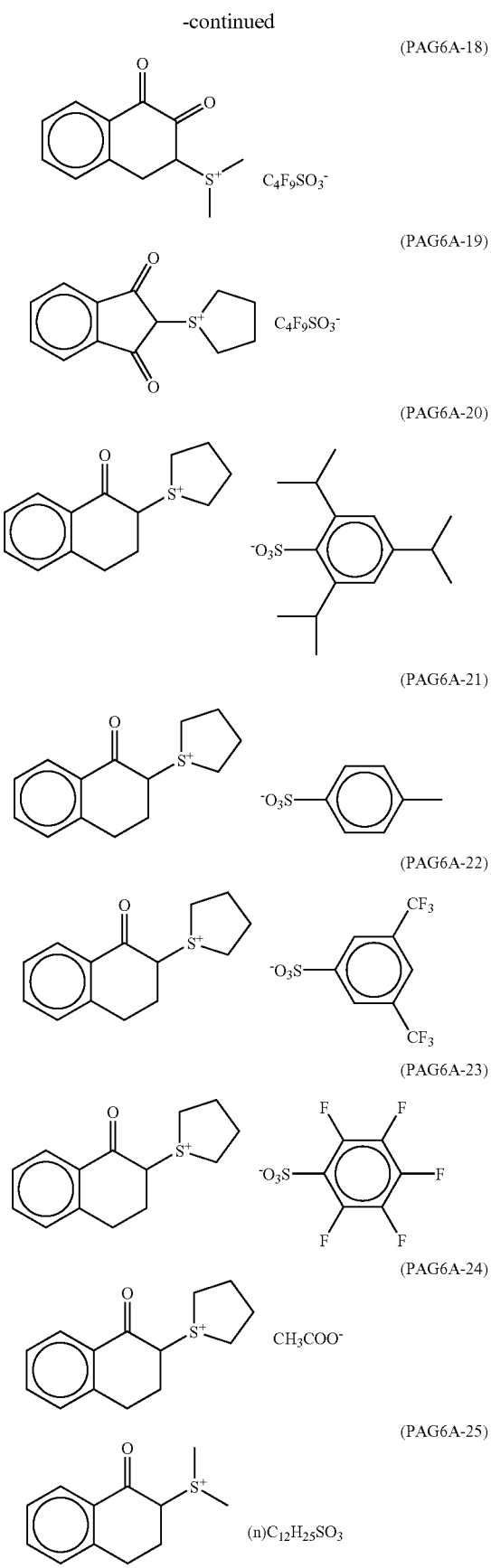

-continued
(PAG6A-26)
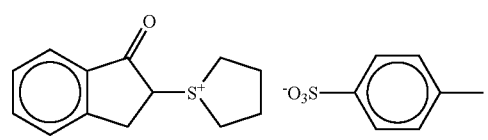
(PAG6A-27)
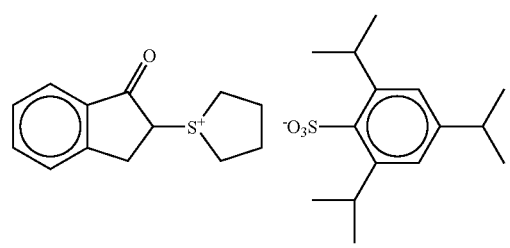
(PAG6A-28)
(PAG6A-29)
(PAG6A-30)
(PAG6A-31)
(PAG6A-32)
(PAG6A-33)
-continued
(PAG6A-34)
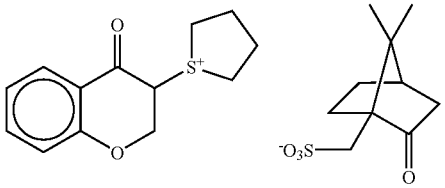
(PAG6A-35)
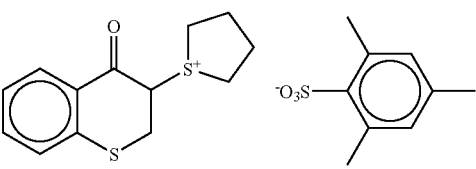
(PAG6A-36)
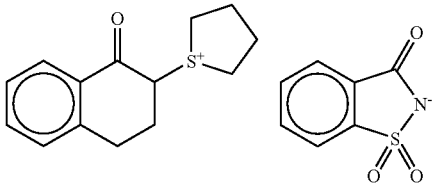
(PAG6A-37)
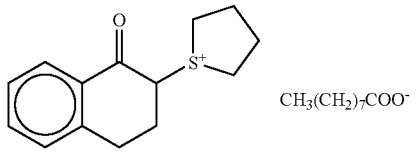
(PAG6A-38)
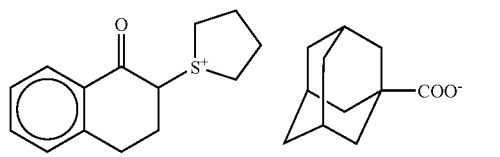
(PAG6B-1)
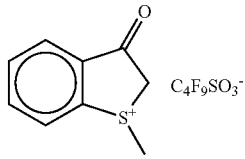
(PAG6B-2)
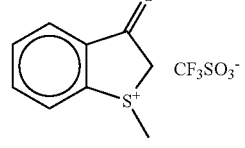
(PAG6B-3)
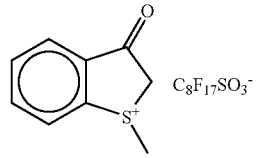
(PAG6B-4)
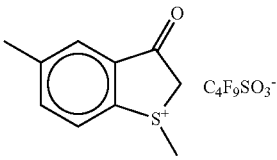

-continued
(PAG6B-5)
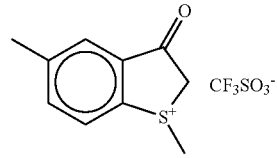 CF₃SO₃⁻
(PAG6B-6)
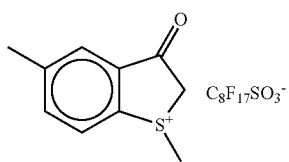 C₈F₁₇SO₃⁻
(PAG6B-7)
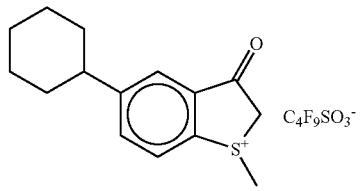 C₄F₉SO₃⁻
(PAG6B-8)
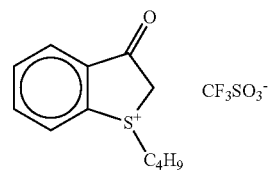 CF₃SO₃⁻
(PAG6B-9)
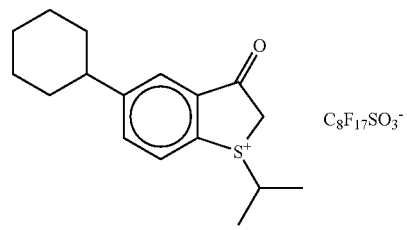 C₈F₁₇SO₃⁻
(PAG6B-10)
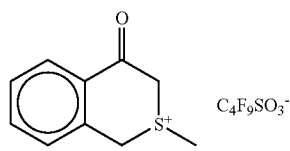 C₄F₉SO₃⁻
(PAG6B-11)
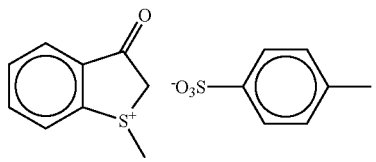 C₄F₉SO₃⁻
(PAG6B-12)
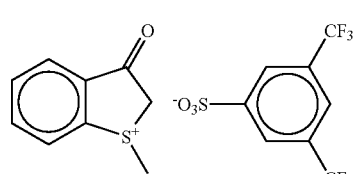
-continued
(PAG6B-13)
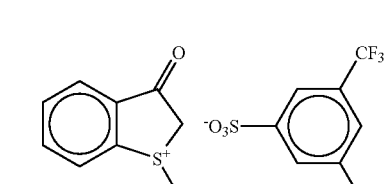
(PAG6B-14)
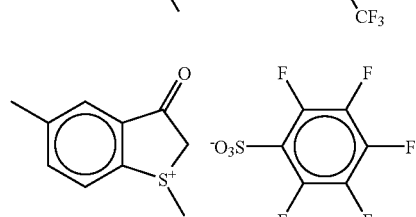
(PAG6B-15)
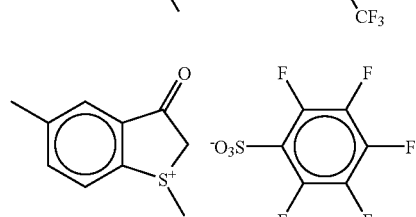
(PAG6B-16)
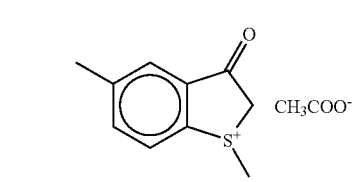 CH₃COO⁻
(PAG6B-17)
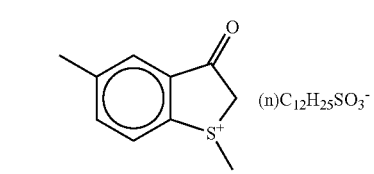 (n)C₁₂H₂₅SO₃⁻
(PAG6B-18)
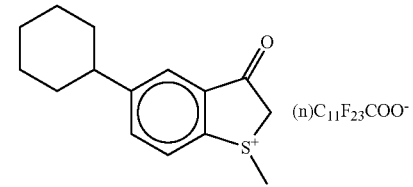 (n)C₁₁F₂₃COO⁻
(PAG6B-19)
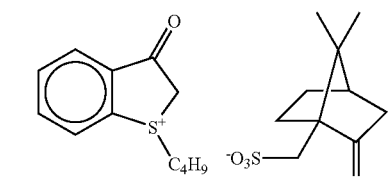
(PAG6B-20)
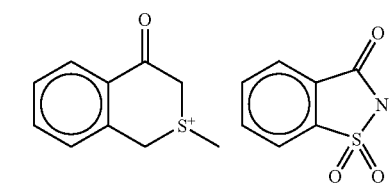

-continued

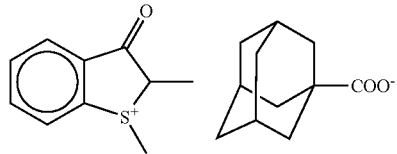
(PAG6B-21)

Among the compounds of formula (PAG6) exemplified above as photo-acid generators, the compounds (PAG6A-1) to (PAG6A-30) and (PAG6B-1) to (PAG6B-12) are preferred over the others.

The compounds represented by formula (PAG6) can be used alone or as combinations of any two or more thereof.

The suitable proportion of a compound of Component (A) in the present positive resist composition is from 0.1 to 20 weight %, preferably from 0.5 to 20 weight % (% by weight), particularly preferably from 1 to 15 weight %, based on the total solids in the composition.

As to the compounds capable of generating acids when irradiated with actinic rays or radiation, the following are examples of compounds especially preferred as Component (A) of the invention:

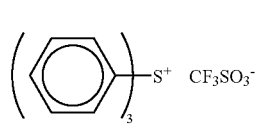 (z1)

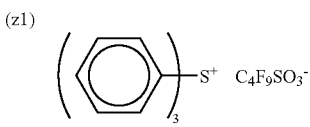 (z2)

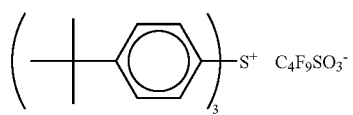 (z3)

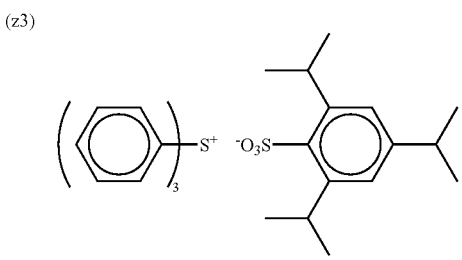 (z4)

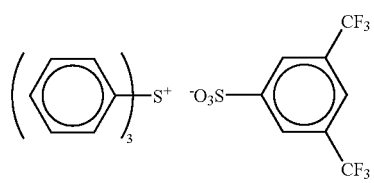 (z5)

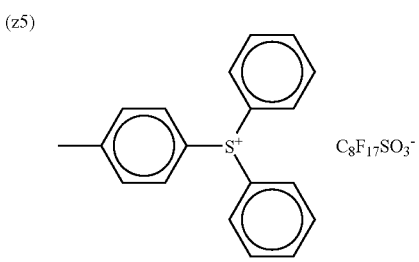 (z6)

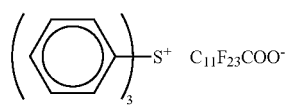 (z7)

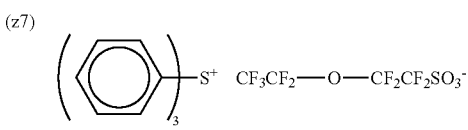 (z8)

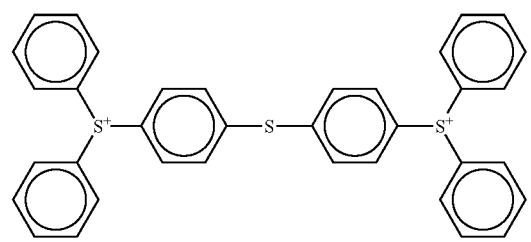 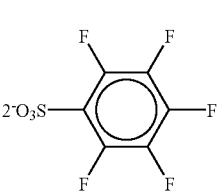 (z9)

-continued

-continued
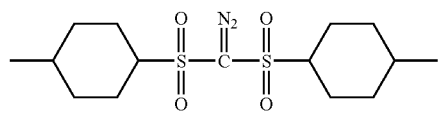 (z26)
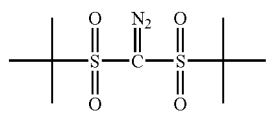 (z27)
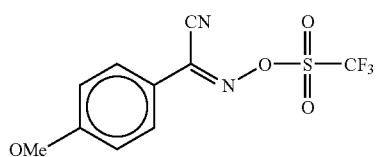 (z28)
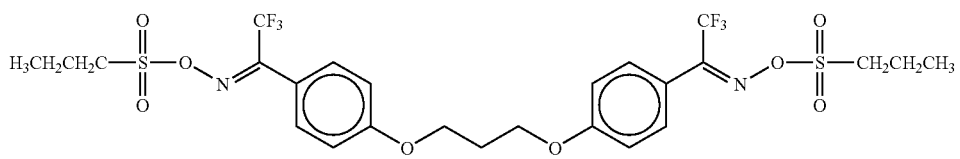 (z29)
 (z30)
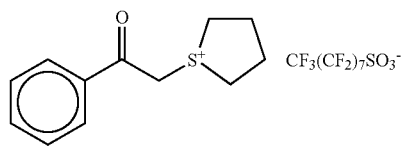 (z31)
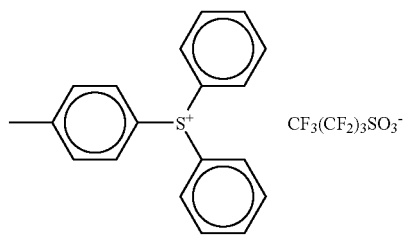 (z32)
(z33)
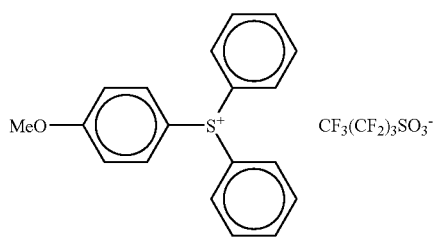 (z34)
(z35)
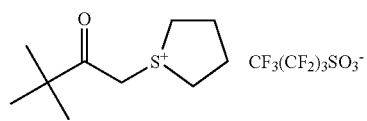 (z36)
(z37)
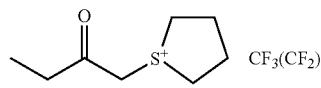 (z38)
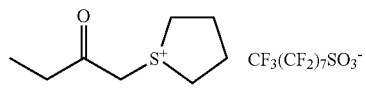 (z39)
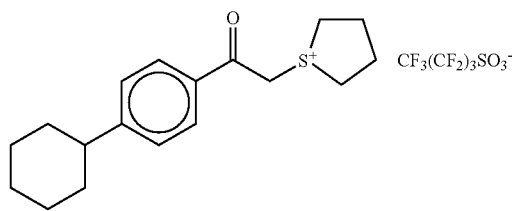 (z40)

<<(B) Resin that is Insoluble or Slightly Soluble in Alkalis, but Becomes Alkali-Soluble Under Action of Acids (Acid-Decomposable Resin)>>

The present acid-decomposable Resin (B) may be any resin as long as the resin is insoluble or slightly soluble in alkalis, but becomes alkali-soluble under action of acids. The functional groups suitable as alkali-soluble sites are phenolic hydroxyl group and carboxyl group.

The resins suitable as the present acid-decomposable Resin (B) are resins having at least one per molecule of phenolic hydroxyl group structure and decomposing through action of acids to have an increased solubility in an alkali developer. Specifically, resins containing at least p-hydroxystyrene units are suitable. Therein are preferably included poly(p-hydroxystyrene) in which a part of the poly(p-hydroxystyrene) is protected with acid-decomposable group(s), copolymers of p-hydroxystyrene and t-butylacrylate, and derivatives thereof.

For instance, the resins designated as (k-1) to (k-15), which are constituted of repeating units as illustrated below, are applicable to the invention.

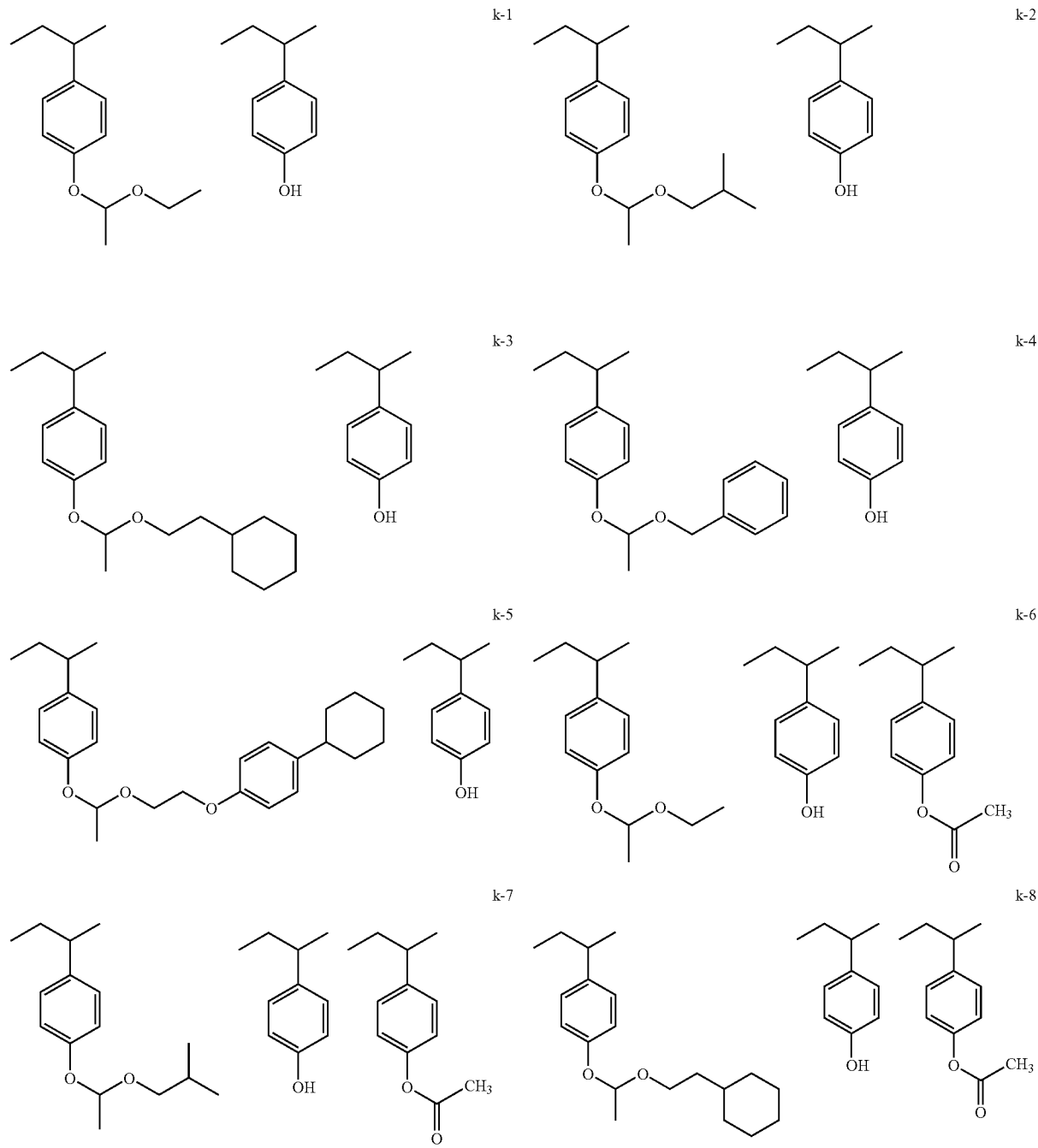

-continued

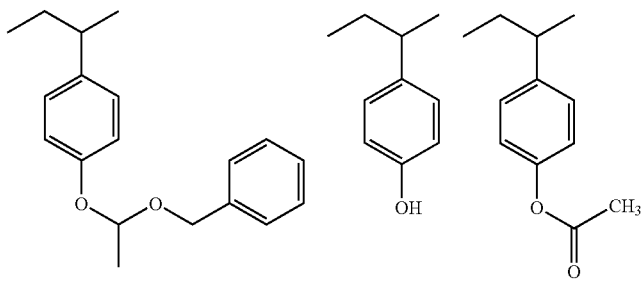

k-9

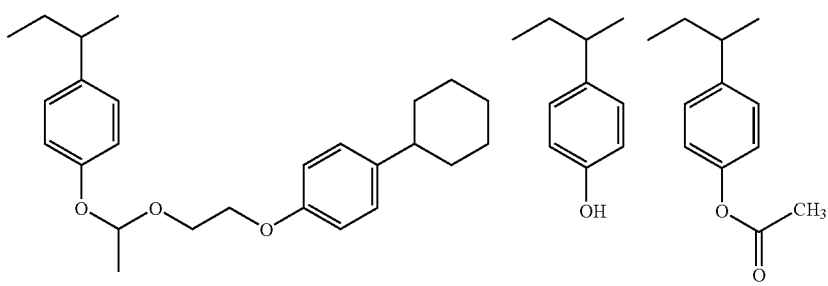

k-10

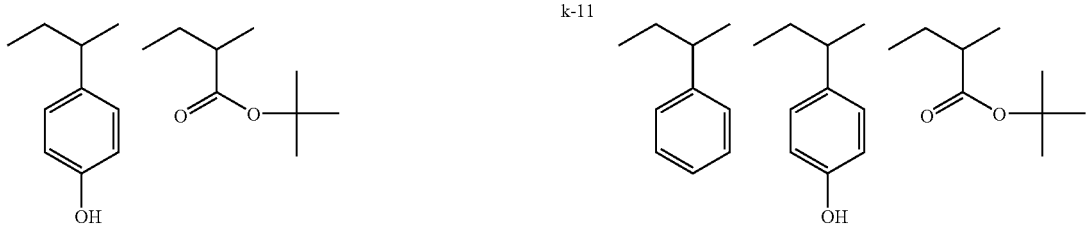

k-11 k-12

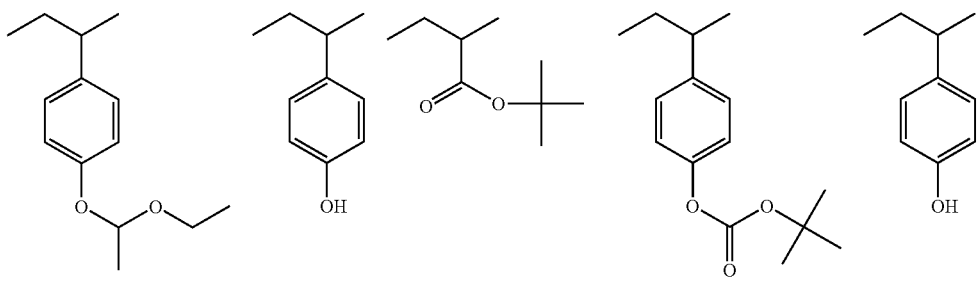

k-13 k-14

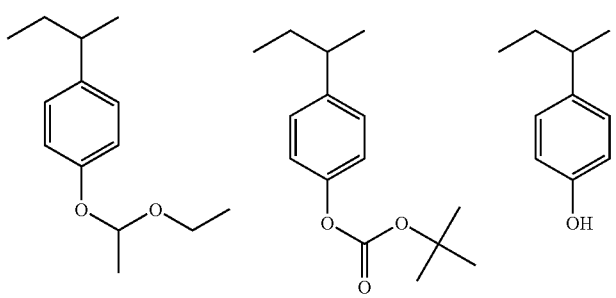

k-15

The present acid-decomposable Resin (B) is preferably a resin having alicyclic hydrocarbon structures, the alicyclic hydrocarbon being monocyclic or polycyclic and increasing its solubility in an alkali developer through action of acids, particularly preferably a resin having at least one kind of repeating units containing as partial structures alicyclic hydrocarbon moieties represented by the following formula (pI), (pII), (pIII), (pIV), (pV) or (pVI), or a resin containing at least one kind of repeating units represented by the following formula (II-AB).

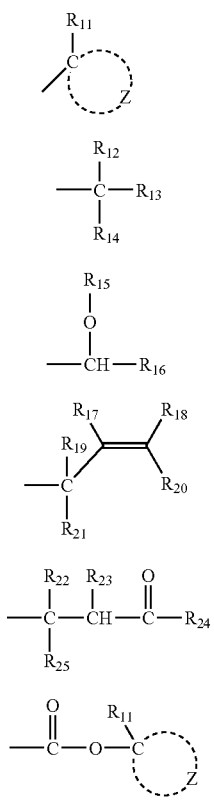

(pI)

(pII)

(pIII)

(pIV)

(pV)

(pVI)

wherein, $R_{11}$ represents a methyl group, an ethyl group, a n-propyl group, an isopropyl group, a n-butyl group, an isobutyl group or a sec-butyl group; Z represents atoms forming an alicyclic hydrocarbon group together with the carbon atom; $R_{12}$ to $R_{16}$ independently represent a 1-4C linear or branched alkyl group or an alicyclic hydrocarbon group, provided that at least one of $R_{12}$, $R_{13}$ and $R_{14}$ is an aliphatic hydrocarbon group and either $R_{15}$ or $R_{16}$ is an aliphatic hydrocarbon group; $R_{17}$ to $R_{21}$ independently represent a hydrogen atom, a 1-4C linear or branched alkyl group or an alicyclic hydrocarbon group, provided that at least one of $R_{17}$ to $R_{21}$ is an aliphatic hydrocarbon group and either $R_{19}$ or $R_{21}$ is a 1-4C linear or branched alkyl group or an alicyclic hydrocarbon group; $R_{22}$ to $R_{25}$ independently represent a 1-4C linear or branched alkyl group or an alicyclic hydrocarbon group, provided that at least one of $R_{22}$ to $R_{25}$ is an alicyclic hydrocarbon group, or $R_{23}$ and $R_{24}$ combine with each other to form a ring.

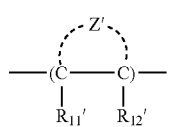

(II-AB)

In formula (II-AB), $R_{11}'$ and $R_{12}'$ independently represent a hydrogen atom, a cyano group, a halogen atom, or an unsubstituted or substituted alkyl group.

Z' represents atoms forming an unsubstituted or substituted alicyclic structure together with the two bonded carbon atoms.

The formula (II-AB) is preferably the following formula (II-A) or (II-B):

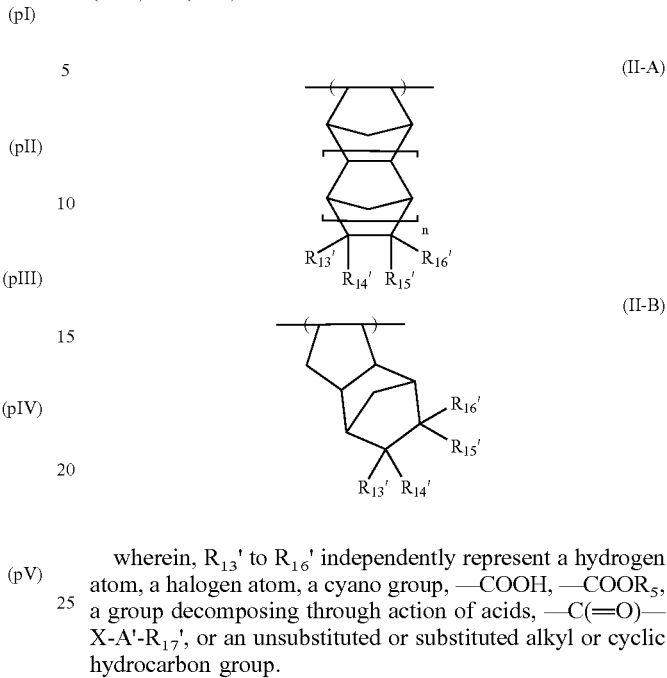

(II-A)

(II-B)

wherein, $R_{13}'$ to $R_{16}'$ independently represent a hydrogen atom, a halogen atom, a cyano group, —COOH, —COOR$_5$, a group decomposing through action of acids, —C(=O)—X-A'-$R_{17}'$, or an unsubstituted or substituted alkyl or cyclic hydrocarbon group.

Herein, $R_5$ represents an unsubstituted or substituted alkyl or cyclic hydrocarbon group, or —Y illustrated below.

X represents an oxygen atom, a sulfur atom, —NH—, —NHSO$_2$— or —NHSO$_2$NH—.

A' represents a single bond or a divalent linkage group.

Therein, at least two of the groups $R_{13}'$ to $R_{16}'$ may combine with each other to form a ring. n represents 0 or 1.

$R_{17}'$ represents —COOH, —COOR$_5$, —CN, a hydroxyl group, an unsubstituted or substituted alkoxy group, —CO—NH—$R_6$, —CO—NH—SO$_2$—$R_6$, or —Y illustrated below.

$R_6$ represents an unsubstituted or substituted alkyl or cyclic hydrocarbon group.

The group —Y is as follows:

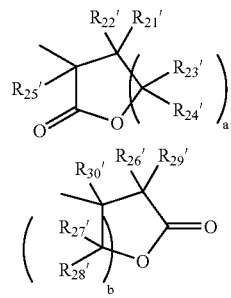

wherein $R_{21}'$ to $R_{30}'$ independently represent a hydrogen atom, or an unsubstituted or substituted alkyl group; and a and b are each 1 or 2.

In formulae (pI) to (pVI), the alkyl group represented by each of $R_{12}$ to $R_{25}$ is a substituted or unsubstituted, 1-4C linear or branched alkyl group. Examples of such an alkyl group include a methyl group, an ethyl group, a n-propyl group, an isopropyl group, a n-butyl group, an isobutyl group, a sec-butyl group and a t-butyl group.

As examples of a substituent the alkyl group can have, mention maybe made of a 1-4C alkoxy group, a halogen atom (e.g., fluorine, chlorine, bromine, iodine), an acyl group, an acyloxy group, a cyano group, a hydroxyl group, a carboxyl group, an alkoxycarbonyl group and a nitro group.

The alicyclic hydrocarbon group represented by each of $R_{11}$ to $R_{25}$ or formed by combining Z with the carbon atoms may be monocyclic or polycyclic. Specifically, such an alicyclic hydrocarbon group may have any of monocyclic, bicyclic, tricyclic and tetracyclic structures and contain at least 5 carbon atoms. Further, it is preferable that the number of carbon atoms constituting the cyclic structure be from 6 to 30, particularly from 7 to 25. These alicyclic hydrocarbon groups may have substituents.

Examples of an alicyclic moiety structure of the aforementioned alicyclic hydrocarbon group are illustrated below.

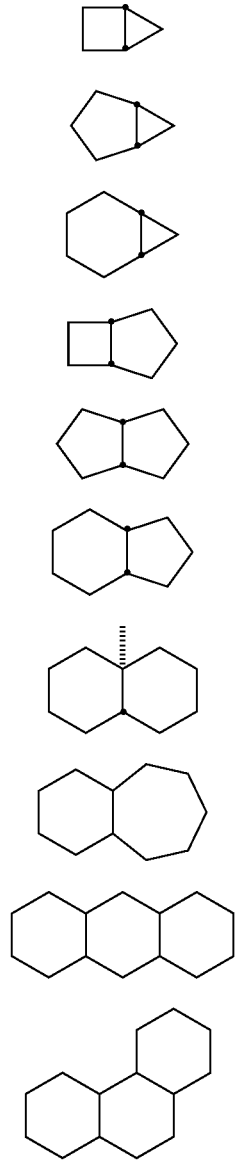

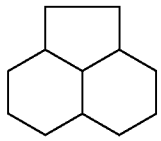

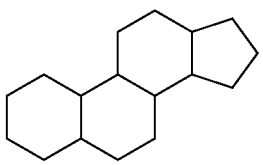

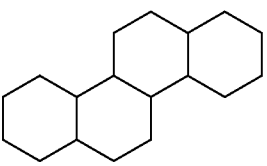

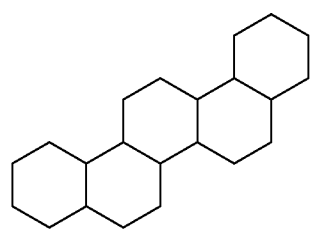

-continued
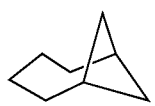 (22)
 (23)
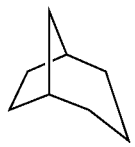 (24)
 (25)
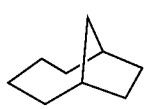 (26)
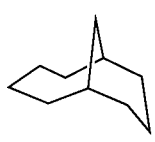 (27)
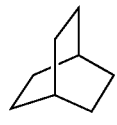 (28)
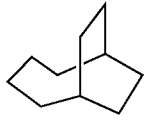 (29)
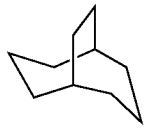 (30)
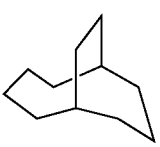 (31)
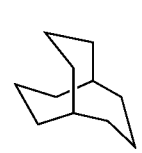 (32)
-continued
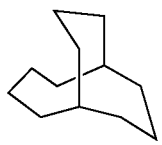 (33)
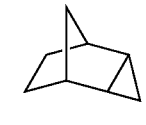 (34)
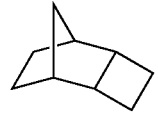 (35)
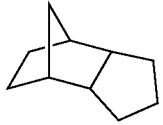 (36)
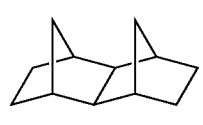 (37)
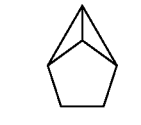 (38)
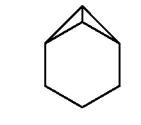 (39)
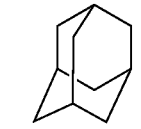 (40)
 (41)
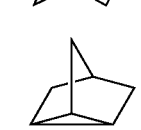 (42)
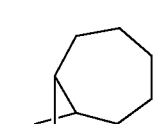 (43)
 (44)

-continued

(45)

(46)

(47)

(48)

(49)

(50)

Examples of an alicyclic moiety suitable for the invention include an adamantyl group, a noradamantyl group, a decaline residue, a tricyclodecanyl group, a tetracyclododecanyl group, a norbornyl group, a sedorol group, a cyclohexyl group, a cycloheptyl group, a cyclooctyl group, a cyclodecanyl group and a cyclododecanyl group. Of these groups, an adamantyl group, a decaline residue, a norbornyl group, a sedorol group, a cyclohexyl group, a cycloheptyl group, a cyclooctyl group, a cyclodecanyl group and a cyclododecanyl group are preferred over the others.

As examples of a substituent the alicyclic hydrocarbon group as recited above may have, mention may be made of an unsubstituted and substituted alkyl group, a halogen atom, a hydroxyl group, an alkoxy group, a carboxyl group and an alkoxycarbonyl group. Examples of an unsubstituted alkyl group suitable as the substituent include lower alkyl groups such as methyl, ethyl, propyl, isopropyl and butyl groups, preferably methyl, ethyl, propyl and isopropyl groups. Examples of a substituent of the substituted alkyl group include a hydroxyl group, a halogen atom and an alkoxy group. Examples of an alkoxy group suitable as the substituent include 1-4C alkoxy groups, such as methoxy, ethoxy, propoxy and a butoxy groups.

The structures represented by formulae (pI) to (pVI) in Resin (B) can be used for alkali-soluble group protection. Examples of an alkali-soluble group include various groups known in this technical field.

Specifically, carboxyl, sulfo, phenol and thiol groups, preferably carboxyl and sulfo groups, are examples of an alkali-soluble group.

As suitable examples of alkali-soluble groups protected by the structures represented by formulae (pI) to (pVI), mention may be made of groups represented by the following formulae (pVII) to (pXI)

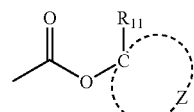
(pVII)

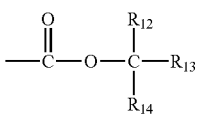
(pVIII)

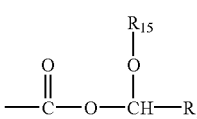
(pIX)

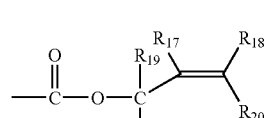
(pX)

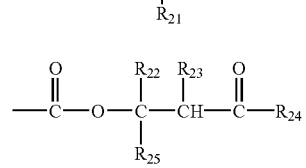
(pXI)

wherein $R_{11}$ to $R_{25}$ and Z have the same meanings as defined hereinbefore.

As the repeating units having alkali-soluble groups protected by structures represented by formulae (pI) to (pVI), repeating units represented by the following formula (pA) are preferred:

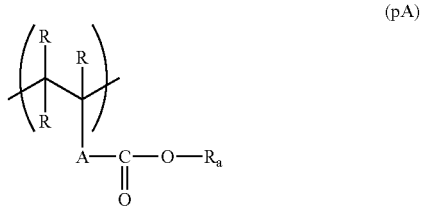
(pA)

wherein, each R represents a hydrogen atom, a halogen atom, or a 1-4C substituted or unsubstituted, linear or branched alkyl group, and three R groups may be the same or different.

A represents a single group or a combination of at least two groups selected from the class consisting of a single bond, an unsubstituted alkylene group, a substituted alkylene group, an ether group, a thioether group, a carbonyl group, an ester group, an amido group, a sulfonamido group, an urethane group and an urea group.

$R_a$ represents any of the groups represented by formulae (pI) to (pVI).

Examples of a monomer corresponding to the repeating unit represented by formulae (pA) are illustrated below.

-continued
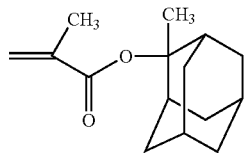
1
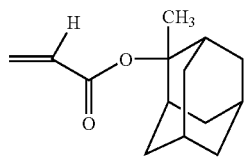
2
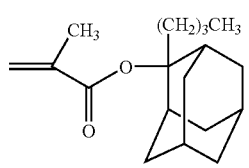
3
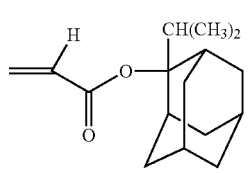
4
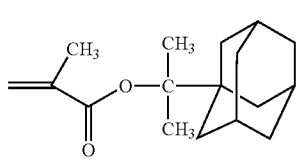
5
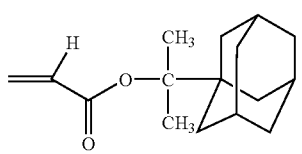
6
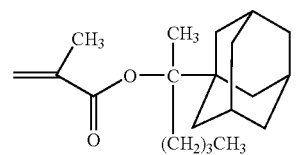
7
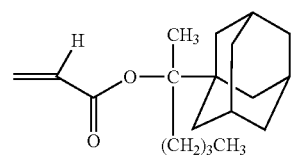
8
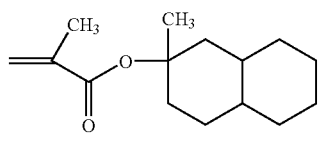
9
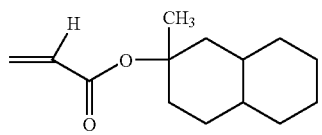
10
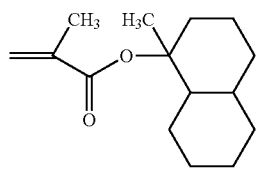
11
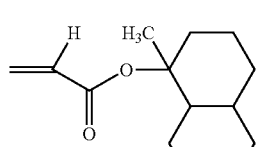
12
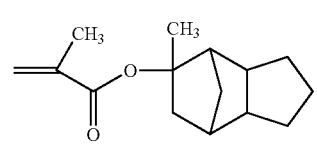
13
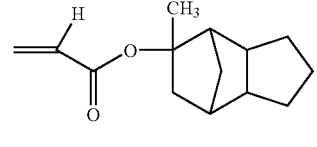
14
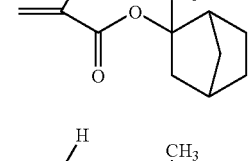
15
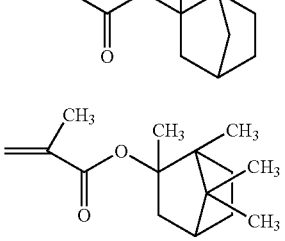
16
17
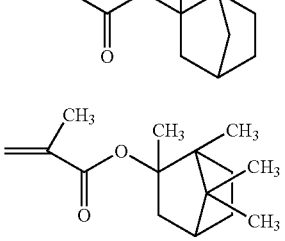
18
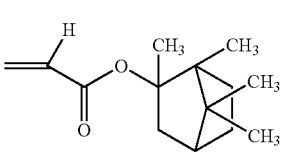
19
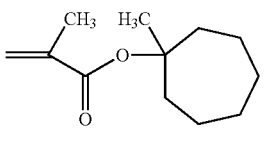
20

-continued

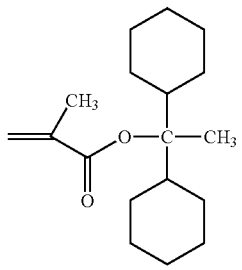
21

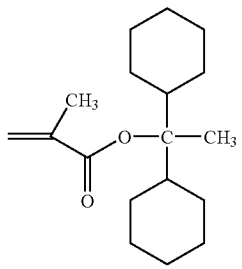
22

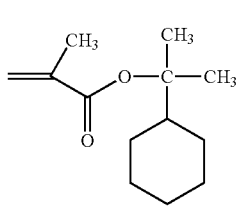
23

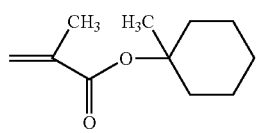
24

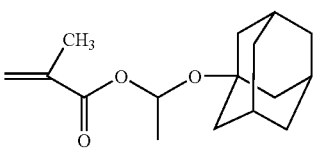
25

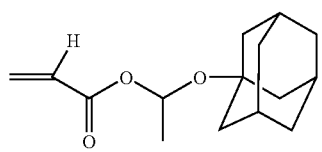
26

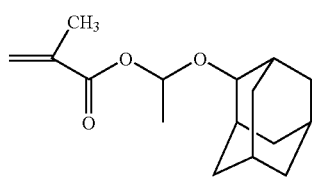
27

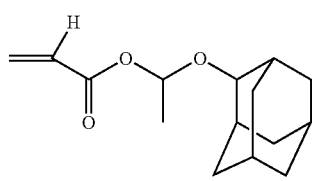
28

-continued

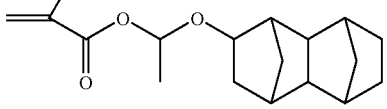
29

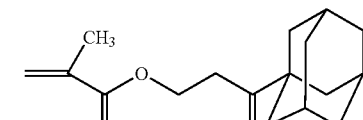
30

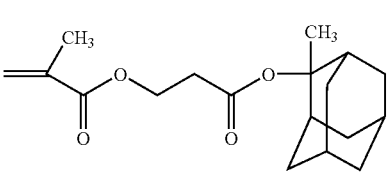
31

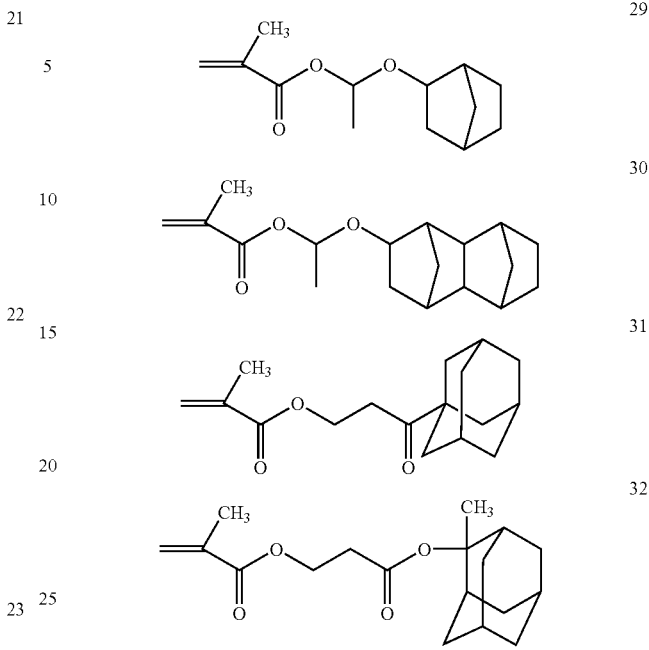
32

In formula (II-AB), $R_{11}'$ and $R_{12}'$ independently represent a hydrogen atom, a cyano group, a halogen atom, or an unsubstituted or substituted alkyl group.

Z' represents atoms forming an unsubstituted or substituted alicyclic structure in which the two bonded carbon atoms (C—C) are contained.

The halogen atom represented by $R_{11}'$ and $R_{12}'$ each can be a chlorine, bromine, fluorine or iodine atom.

The alkyl group represented by $R_{11}'$, $R_{12}'$ and $R_{21}'$ to $R_{30}'$ each is desirably a 1-10C linear or branched alkyl group, preferably a 1-6C linear or branched alkyl group, particularly preferably a methyl group, an ethyl group, a propyl group, an isopropyl group, a n-butyl group, an isobutyl group, a sec-butyl group or a t-butyl group.

The above-cited alkyl group can have a substituent, such as a hydroxyl group, a halogen atom, a carboxyl group, an alkoxy group, an acyl group, a cyano group or an acyloxy group. Examples of the halogen atom include chlorine, bromine, fluorine and iodine atoms. Examples of the alkoxy group include 1-4C alkoxy groups, such as methoxy, ethoxy, propoxy and butoxy groups. Examples of the acyl group include a formyl group and an acetyl group. And an example of the acyloxy group is an acetoxy group.

The atoms that are represented by Z' and form an alicyclic structure are atoms for incorporating in Resin (B) repeating units having unsubstituted or substituted alicyclic hydrocarbon groups. In particular, the atoms forming a bridged alicyclic structure to constitute bridged alicyclic hydrocarbon repeating units are preferred.

The structures illustrated below are examples of the skeleton of an alicyclic hydrocarbon formed.

(1)

-continued
(2) 
(3) 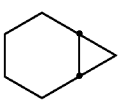
(4) 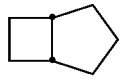
(5) 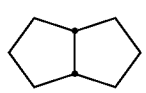
(6) 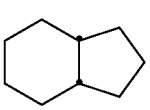
(7) 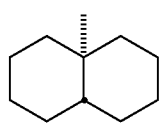
(8) 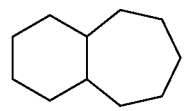
(9) 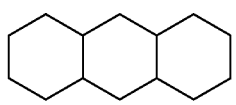
(10) 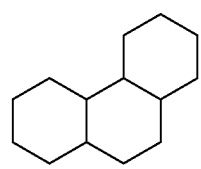
(11) 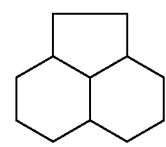
(12) 
(13) 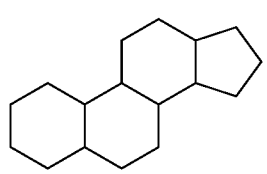
-continued
(14) 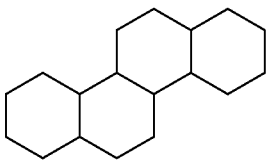
(15) 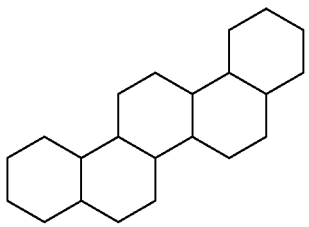
(16) 
(17) 
(18) 
(19) 
(20) 
(21) 
(22) 
(23) 
(24) 
(25) 

-continued

(26) 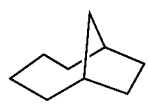

(27) 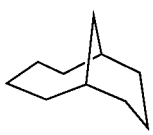

(28) 

(29) 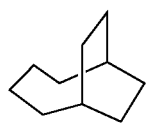

(30) 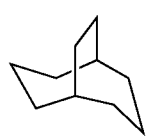

(31) 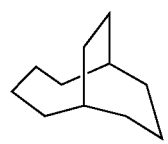

(32) 

(33) 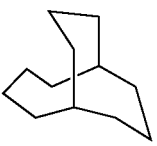

(34) 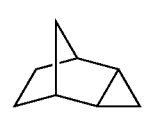

(35) 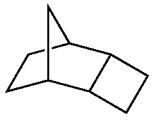

(36) 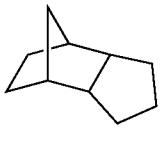

(37) 

-continued

(38) 

(39) 

(40) 

(41) 

(42) 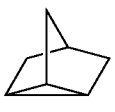

(43) 

(44) 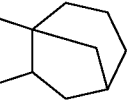

(45) 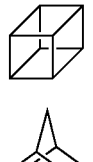

(46) 

(47) 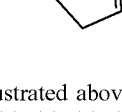

Of the structures illustrated above, the bridged alicyclic hydrocarbon skeletons (5), (6), (7), (9), (10), (13), (14), (15), (23), (28), (36), (37), (42) and (47) are preferred over the others.

The alicyclic hydrocarbon skeletons illustrated above may have substituents. As examples of such substituents, mention may be made of $R_{13}'$ to $R_{16}'$ in formulae (II-A) and (II-B).

Of the repeating units having the bridged alicyclic hydrocarbon moieties, the repeating units represented by formulae (II-A) and (II-B) are much preferred.

In formulae (II-A) and (II-B), $R_{13}'$ to $R_{16}'$ independently represent a hydrogen atom, a halogen atom, a cyano group, —COOH, —COOR$_5$, an acid-decomposable group, —C(═O)—X-A'-R$_{17}'$, or an unsubstituted or substituted alkyl or cyclic hydrocarbon group.

R$_5$ represents an unsubstituted or substituted alkyl or cyclic hydrocarbon group, or the group —Y as defined hereinbefore.

X represents —O—, —S—, —NH—, —NHSO$_2$— or —NHSO$_2$NH—.

A' represents a single bond or a divalent linkage group.

And at least two of $R_{13}'$ to $R_{16}'$ may combine with each other to form a ring. n represents 0 or 1.

$R_{17}'$ represents —COOH, —COOR$_5$, —CN, a hydroxyl group, an unsubstituted or substituted alkoxy group, —CO—NH—R$_6$, —CO—NH—SO$_2$—R$_6$, or the group —Y as defined hereinbefore.

R$_6$ represents an unsubstituted or substituted alkyl or cyclic hydrocarbon group.

In the group —Y, $R_{21}'$ to $R_{30}'$ independently represent a hydrogen atom, or an unsubstituted or substituted alkyl group, and a and b are each 1 or 2.

In the resins relating to the invention, acid-decomposable groups may be included in —C(═O)—X-A'-R$_{17}'$ defined above, or as substituents of Z' in formula (II-AB).

The structure of an acid-decomposable group is represented by formula —C(═O)—X$_1$-R$_0$.

Examples of R$_0$ in the formula include a tertiary alkyl group such as t-butyl or t-amyl group, an isobornyl group, a 1-alkoxyethyl group such as 1-ethoxyethyl, 1-butoxyethyl, 1-isobutoxyethyl or 1-cyclohexyloxyethyl group, an alkoxymethyl group such as 1-methoxymethyl or 1-ethoxymethyl group, a 3-hydroxyalkyl group, a tetrahydropyranyl group, a tetrahydrofuranyl group, a trialkylsilyl ester group, a 3-hydroxycyclohexyl ester group, a 2-methyl-2-adamantyl group, and a mevalonic lactone residue. X$_1$ has the same meaning as the foregoing X.

As examples of a halogen atom represented by $R_{13}'$ to $R_{16}'$ each, mention may be made of chlorine, bromine, fluorine and iodine atoms.

The alkyl group represented by R$_5$, R$_6$ and $R_{13}'$ to $R_{16}'$ each is desirably a 1-10C linear or branched alkyl group, preferably a 1-6C linear or branched alkyl group, particularly preferably a methyl group, an ethyl group, a propyl group, an isopropyl group, a n-butyl group, an isobutyl group, a sec-butyl group or a t-butyl group.

The cyclic hydrocarbon group represented by R$_5$, R$_6$ and $R_{13}'$ to $R_{16}'$ each includes a cycloalkyl group and a bridged hydrocarbon group, with examples including cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy, mentyl, isomentyl, neomentyl and tetracyclododecanyl groups.

The ring formed by combining at least two of $R_{13}'$ to $R_{16}'$ includes 5-12C rings such as cyclopentene, cyclohexene, cycloheptane and cyclooctane.

The alkoxy group represented by R17' includes 1-4C alkoxy groups, such as methoxy, ethoxy, propoxy and butoxy groups.

As examples of substituents the alkyl, cyclic hydrocarbon and alkoxy groups can further have, mention may be made of a hydroxyl group, a halogen atom, a carboxyl group, an alkoxy group, an acyl group, a cyano group, an acyloxy group, an alkyl group and a cyclic hydrocarbon group. Examples of the halogen atom include chlorine, bromine, fluorine and iodine atoms. Examples of the alkoxy group include 1-4C alkoxy groups, such as methoxy, ethoxy, propoxy and butoxy groups. Examples of the acyl group include a formyl group and an acetyl group. An example of the acyloxy group is an acetoxy group.

Further, the alkyl group and the cyclic hydrocarbon group include the same ones as recited above.

The divalent linkage group represented by the A' includes a single group and a combination of at least two groups selected from the class consisting of an unsubstituted alkylene group, a substituted alkylene group, an ether group, a thioether group, a carbonyl group, an ester group, an amido group, a sulfonamido group, an urethane group and an urea group.

As examples of a unsubstituted or substituted alkylene group represented by A', mention may be made of groups represented by the following formula:

—[C(Ra)(Rb)]$_r$— wherein Ra and Rb, which may be the same or different, each represent a hydrogen atom, an unsubstiuted or substituted alkyl group, a halogen atom, a hydroxyl group, or an alkoxy group. The alkyl group suitable for Ra and Rb each is a lower alkyl group, such as methyl, ethyl, propyl, isopropyl and butyl groups, preferably methyl, ethyl, propyl and isoproyl groups. As examples of a substituent the substituted alkyl group can have, mention may be made of a hydroxyl group, a halogen atom and an alkoxy group. The alkoxy group of Ra and Rb each is a 1-4C alkoxy group, such as methoxy, ethoxy, propoxy or butoxy group. The halogen atom of Ra and Rb each is a chlorine atom, a bromine atom, a fluorine atom or an iodine atom. r is an integer of 1 to 10.

The resins relating to the invention can contain groups decomposing through action of acids in at least one kind of repeating units selected from the repeating units containing as their partial structures alicyclic hydrocarbon moieties represented by any of formulae (pI) to (pVI), the repeating units represented by formula (II-AB), or repeating units derived from comonomers as described hereinafter.

The various substituents of $R_{13}'$ to $R_{16}'$ in each of formulae (II-A) and (II-B) constitute substituents of the atomic group Z which forms an alicyclic structure or a bridged alicyclic structure in formula (II-AB).

The repeating units [II-1] to [II-103] shown below are examples of repeating units represented by formulae (II-A) and (II-B), but these examples should not be construed as limiting the scope of the invention in any way.

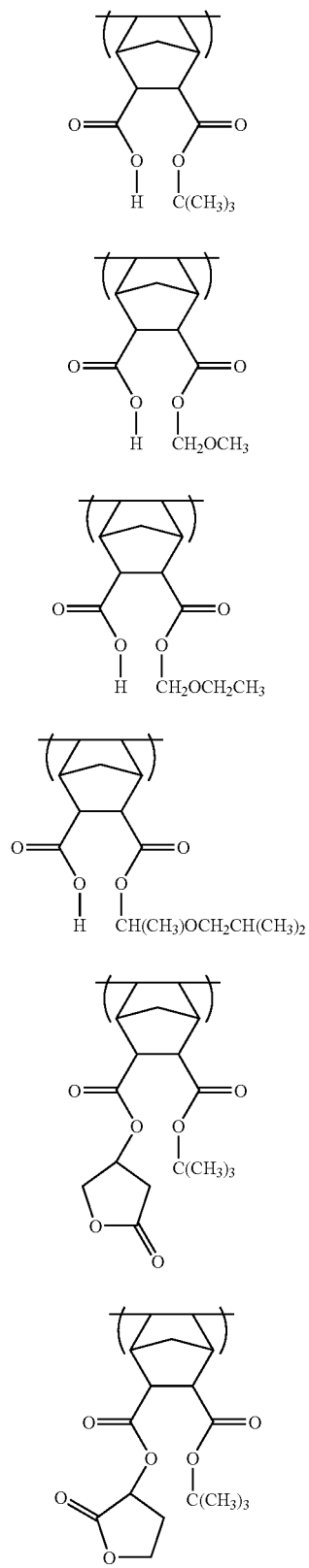
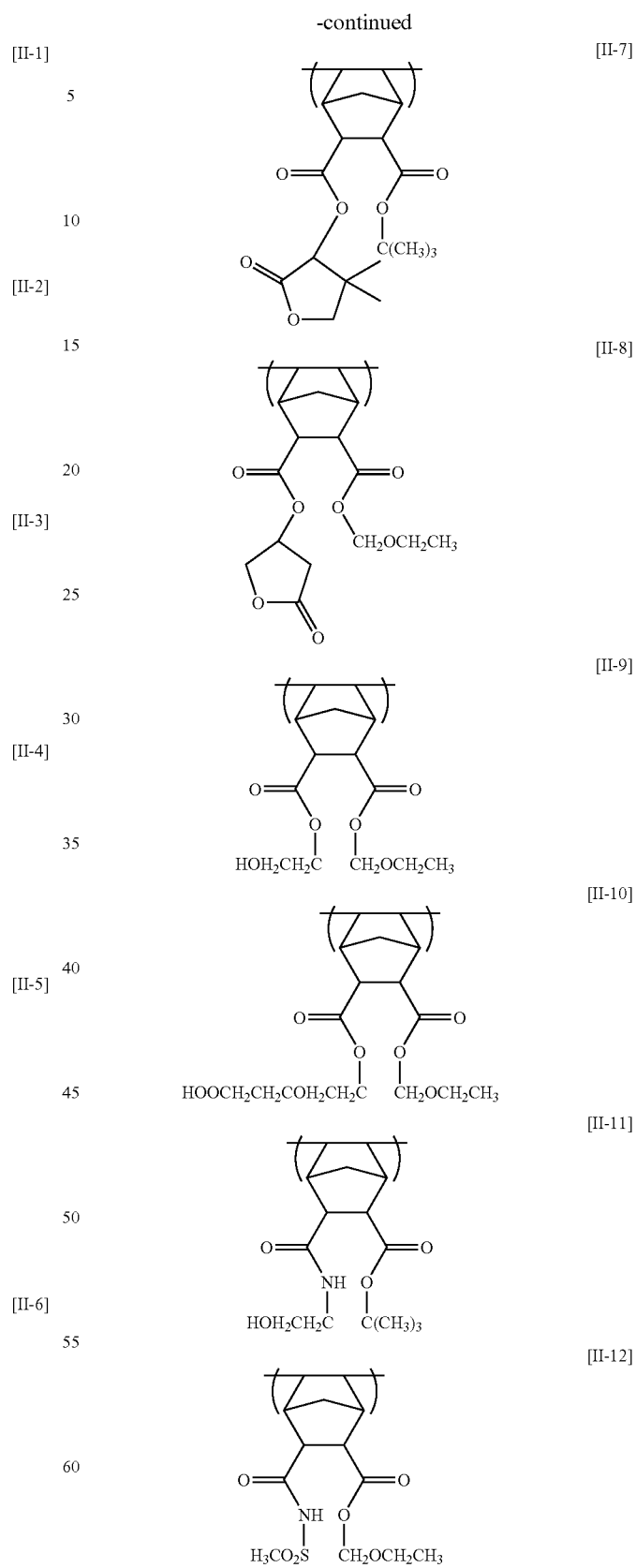

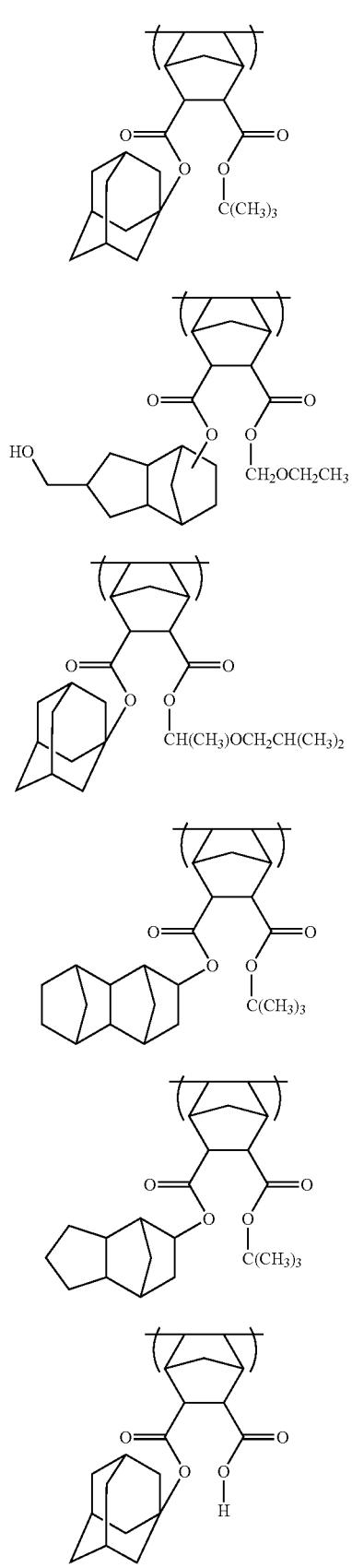
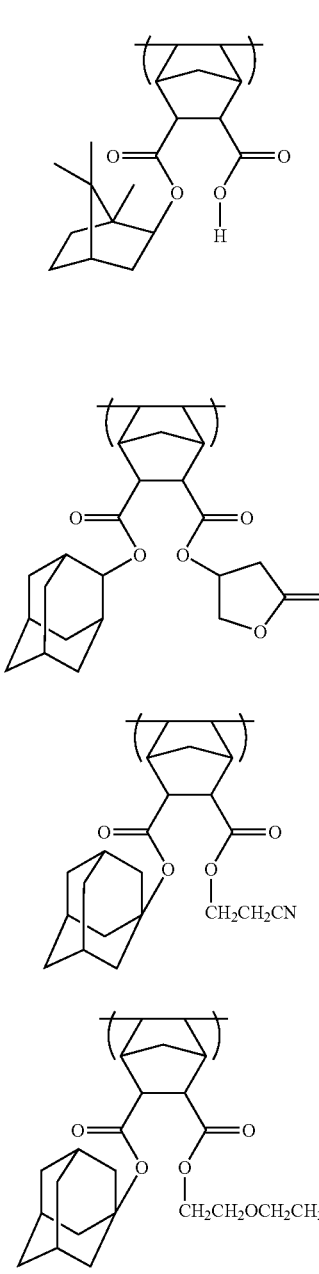

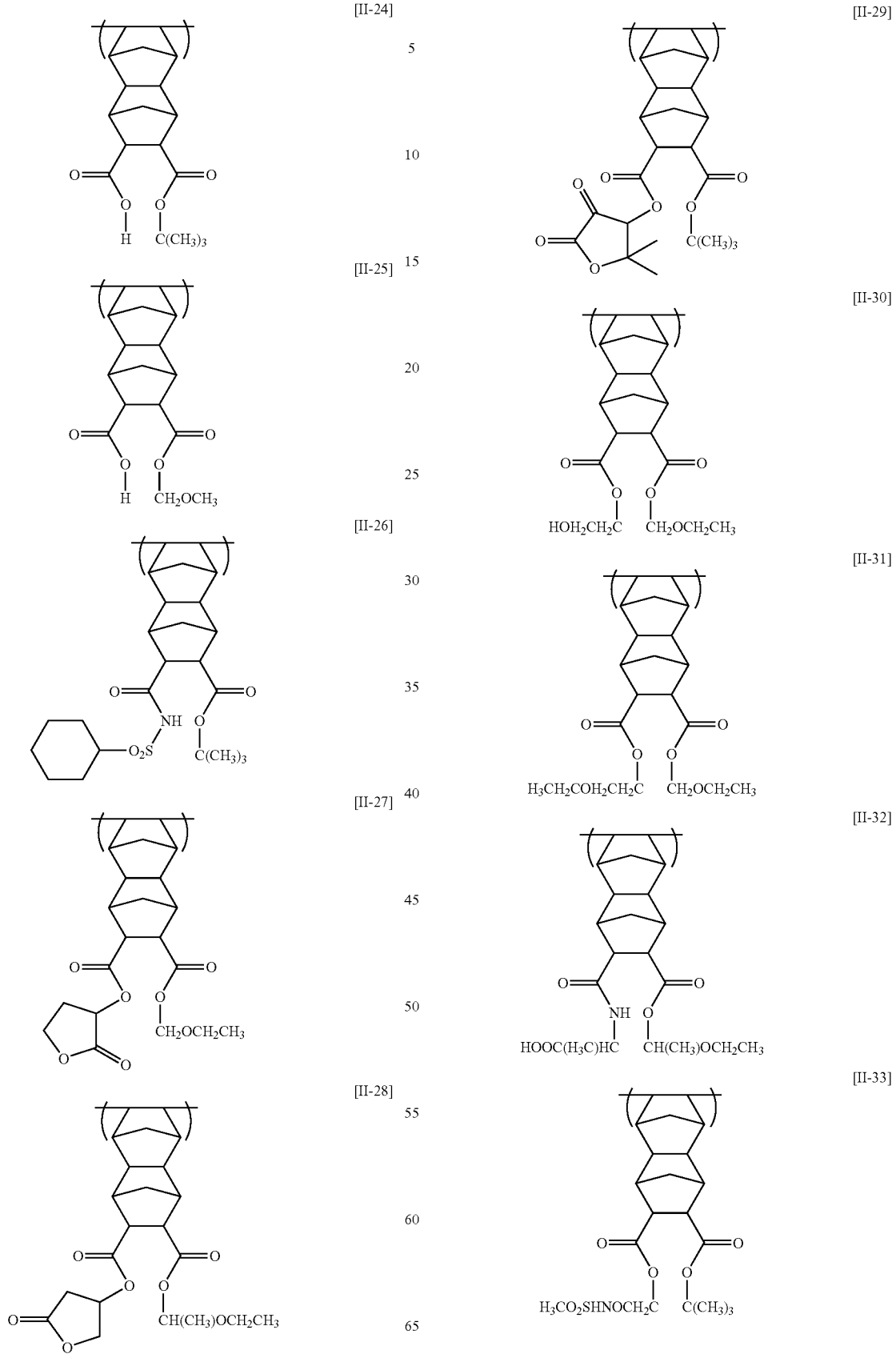

[II-34]
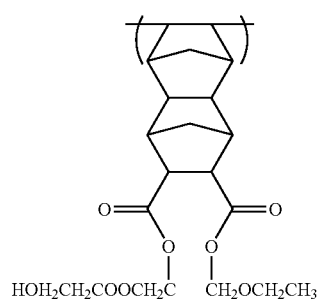
[II-35]
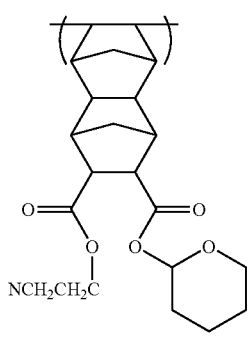
[II-36]
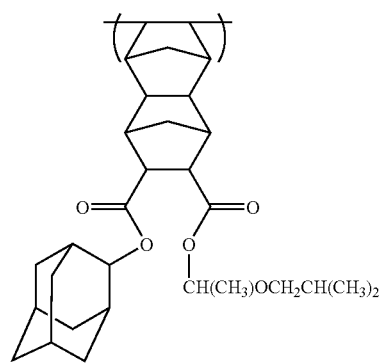
[II-37]
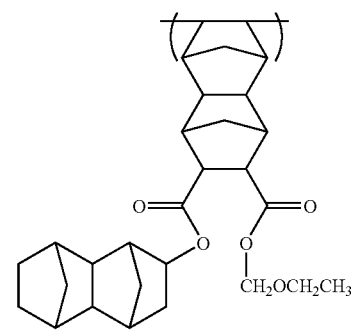
[II-38]
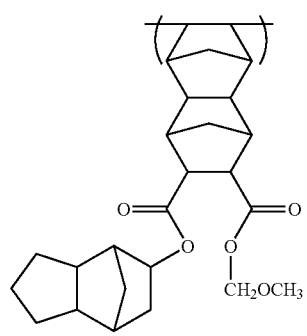
[II-39]
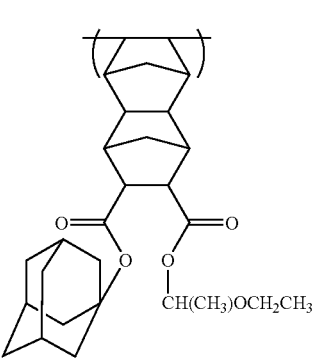
[II-40]
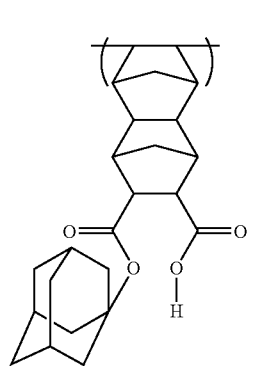
[II-41]
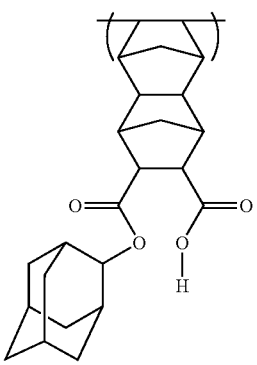

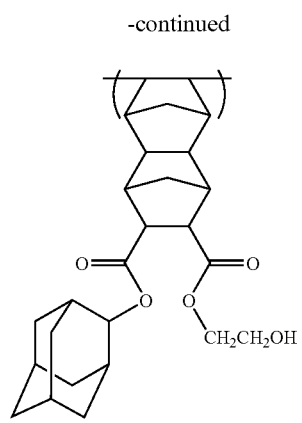
[II-42]
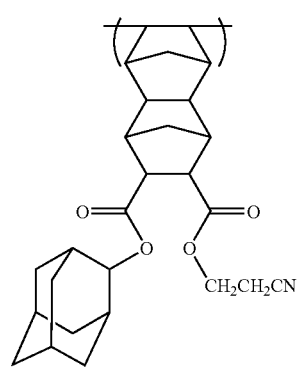
[II-43]
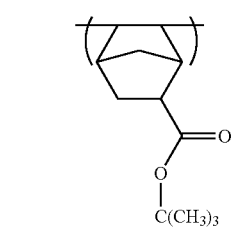
[II-44]
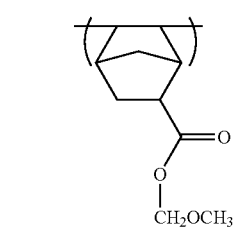
[II-45]
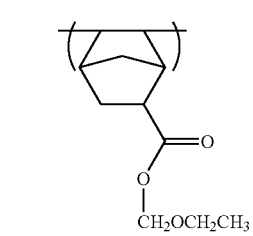
[II-46]
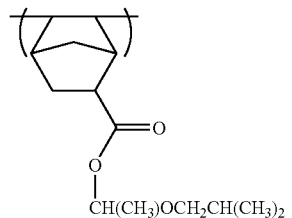
[II-47]
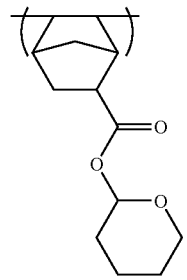
[II-48]
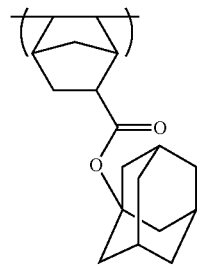
[II-49]
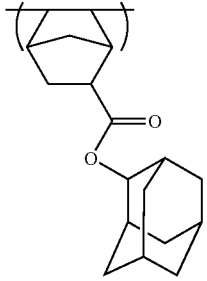
[II-50]
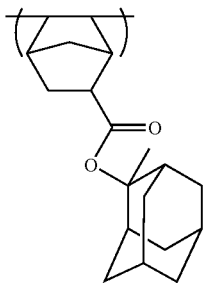
[II-51]

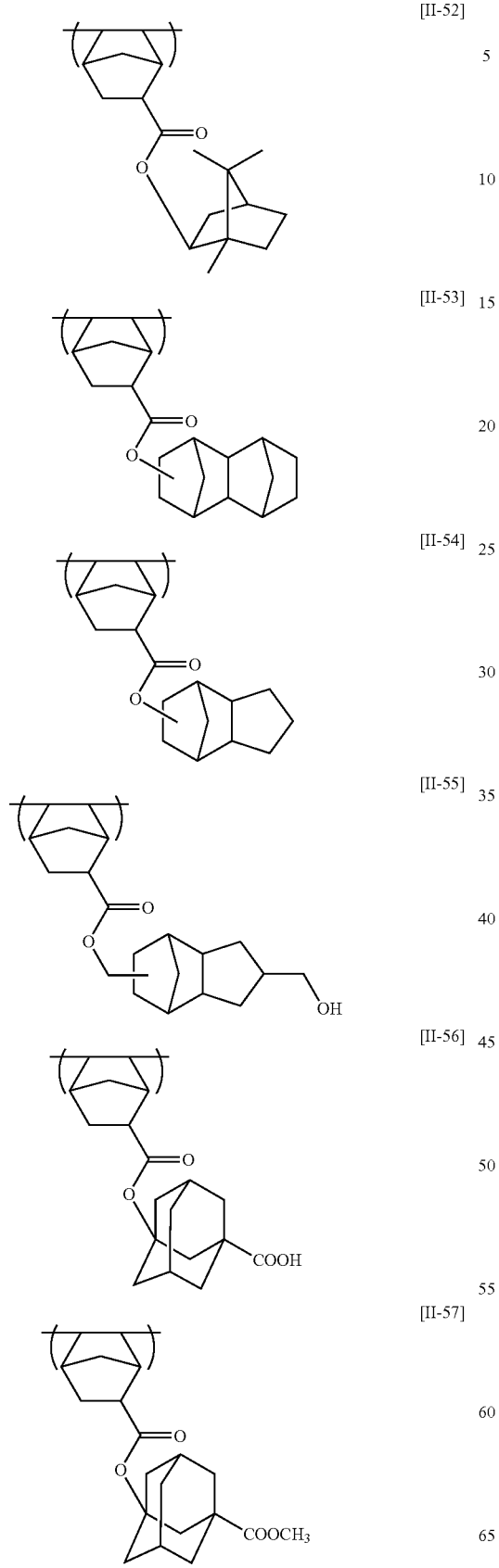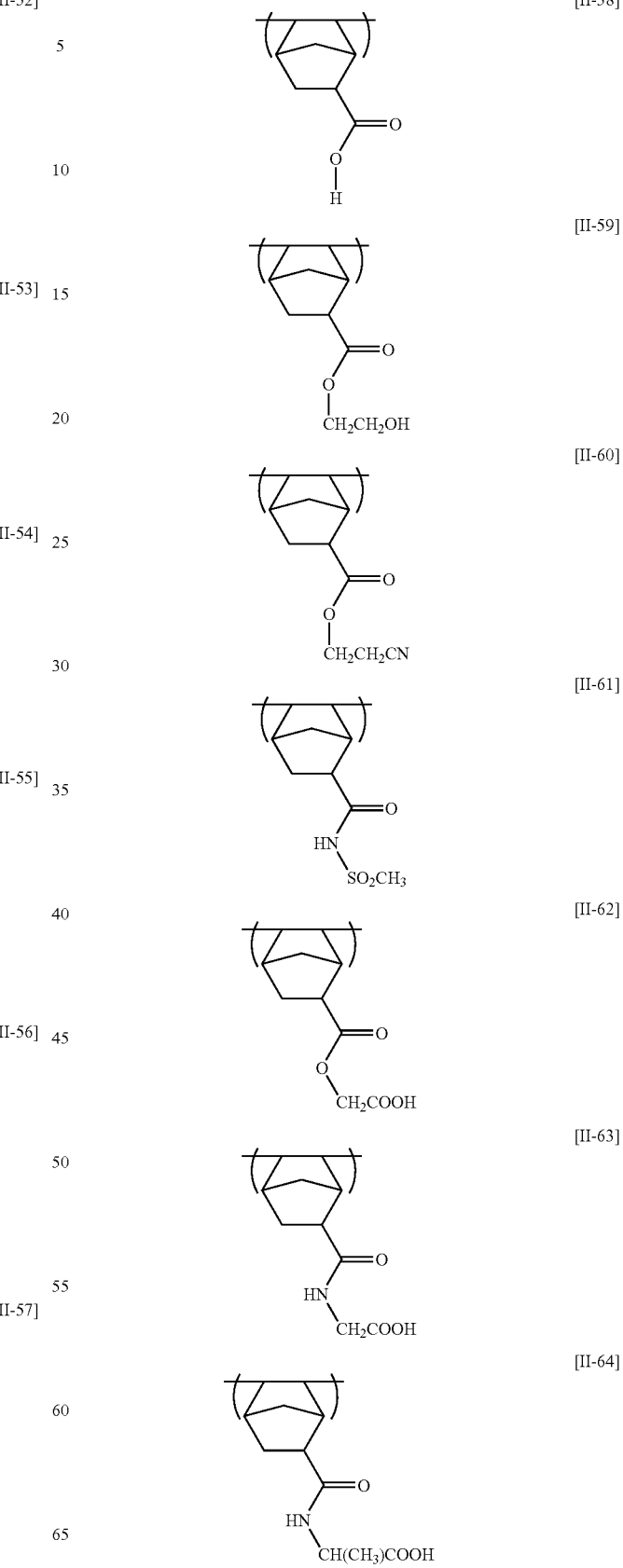

-continued
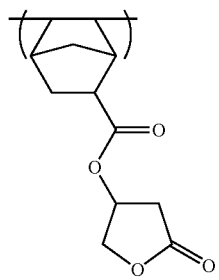 [II-65]
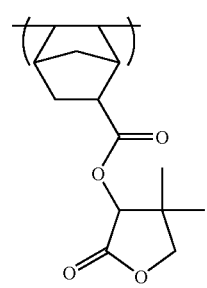 [II-66]
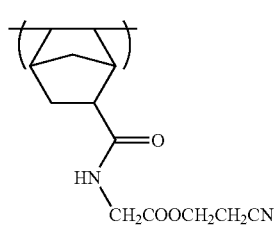 [II-67]
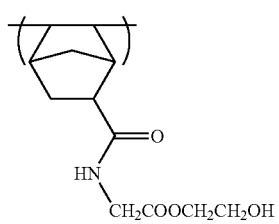 [II-68]
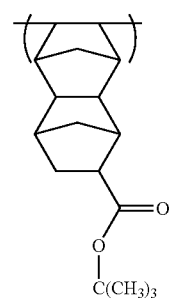 [II-69]
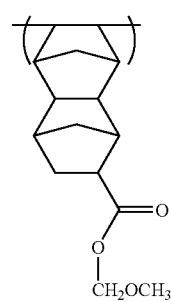 [II-70]
-continued
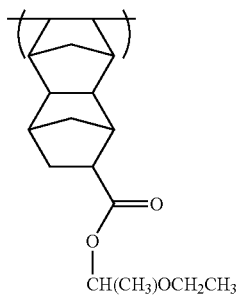 [II-71]
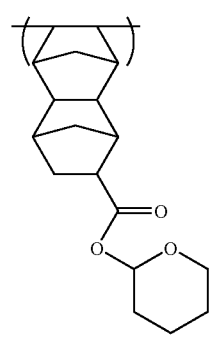 [II-72]
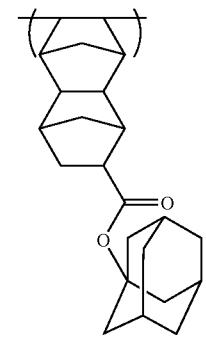 [II-73]
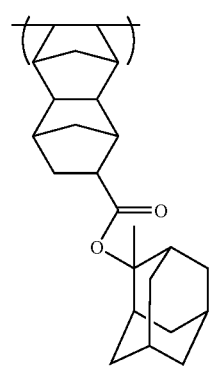 [II-74]

[II-75]
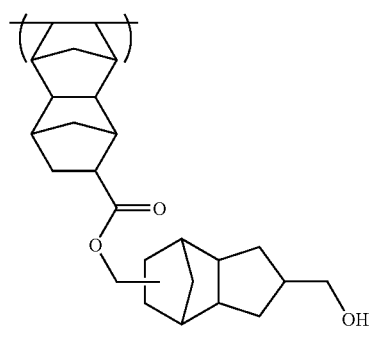
[II-76]
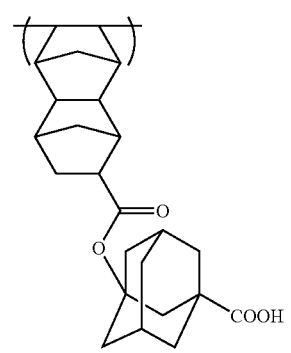
[II-77]
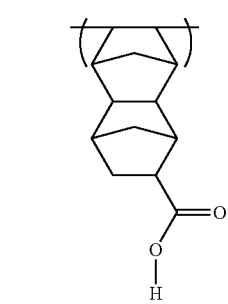
[II-78]
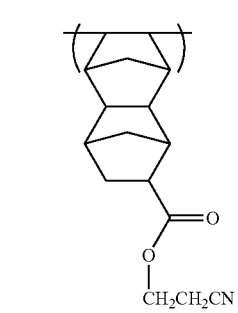
[II-79]
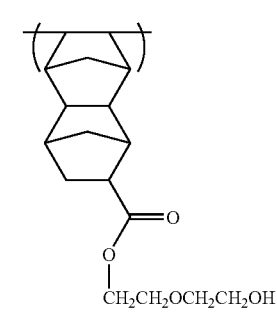
[II-80]
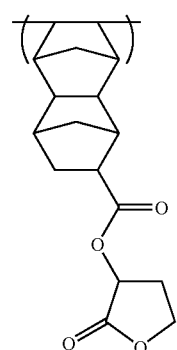
[II-81]
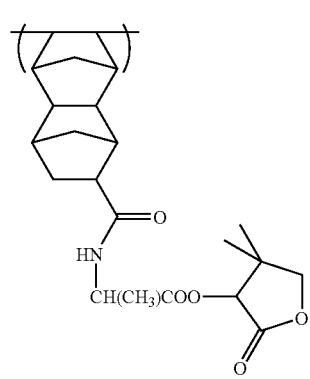
[II-82]
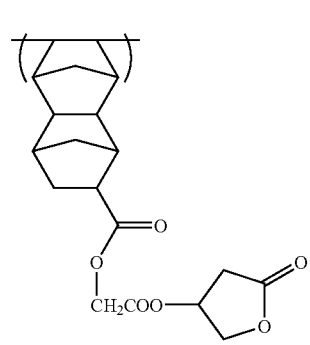
[II-83]
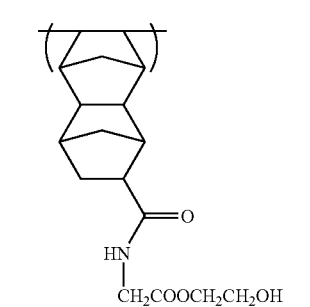

[II-84]
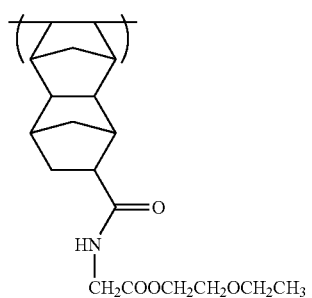
[II-85]
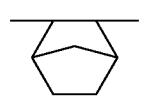
[II-86]
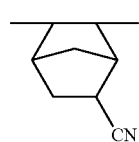
[II-87]
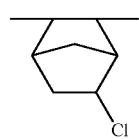
[II-88]
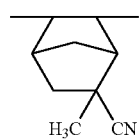
[II-89]
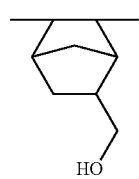
[II-90]
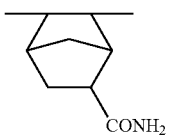
[II-91]
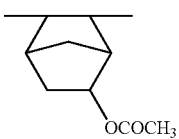
[II-92]
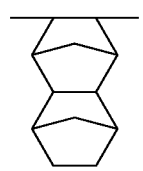
[II-93]
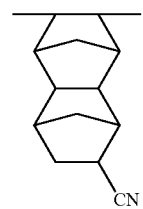
[II-94]
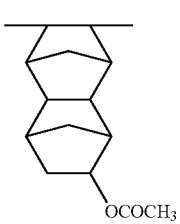
[II-95]
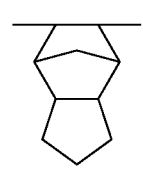
[II-96]
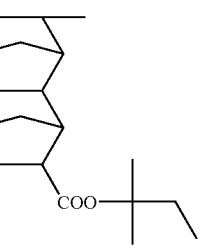
[II-97]
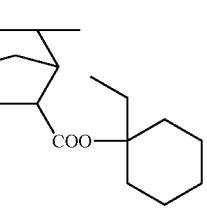
[II-98]
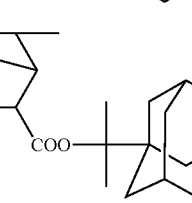
[II-99]
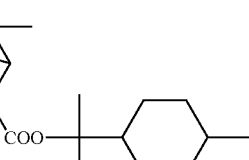
[II-100]
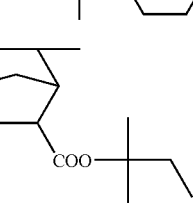

-continued

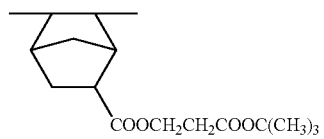
[II-101]

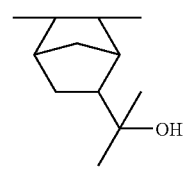
[II-102]

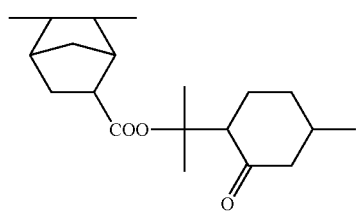
[II-103]

The present acid-decomposable resin can further have lactone structure-containing repeating units represented by the following formula (IV):

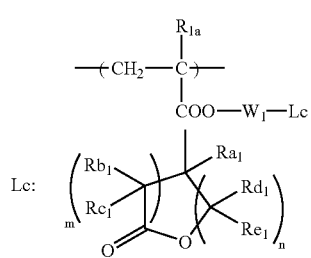
(IV)

wherein, $R_{1a}$ represents a hydrogen atom or a methyl group.

$W_1$ represents a single bond, an alkylene group, an ether group, a thioether group, a carbonyl group, an ester group, or a group formed by combining at least two of these groups.

$R_{a1}$, $R_{b1}$, $R_{c1}$, $R_{d1}$ and $R_{e1}$ independently represent a hydrogen atom or a 1-4C alkyl group. m and n independently represents an integer of 0 to 3, provided that m+n is from 2 to 6.

Examples of a 1-4C alkyl group represented by $R_{a1}$ to $R_{e1}$ each include a methyl group, an ethyl group, a propyl group, an isopropyl group, a n-butyl group, an isobutyl group, a sec-butyl group and a t-butyl group.

Examples of an alkylene group represented by $W_1$ in formula (IV) include groups represented by the following formula:

—[C(Rf)(Rg)]$_{r_1}$— wherein Rf and Rg each represent a hydrogen atom, an unsubstituted or substituted alkyl group, a halogen atom, a hydroxyl group or an alkoxy group, and they both may be the same or different. As the alkyl group, a lower alkyl group, such as methyl, ethyl, propyl, isopropyl or butyl group, is suitable. Preferably, the alkyl group is a methyl, ethyl, propyl or isopropyl group. As examples of a substituent the alkyl group can have, mention may be made of a hydroxyl group, a halogen atom and an alkoxy group. Examples of the alkoxy group include 1-4C alkoxy groups, such as methoxy, ethoxy, propoxy and butoxy groups. As examples of the halogen atom, mention may be made of chlorine, bromine, fluorine and iodine atoms. $r_1$ is an integer of 1 to 10.

As examples of a substituent group the alkyl group can further have, mention may be made of a carboxyl group, an acyloxy group, a cyano group, an unsubstituted or substituted alkyl group, a halogen atom, a hydroxyl group, an unsubstituted or substituted alkoxy group, an acetylamido group, an alkoxycarbonyl group and an acyl group.

Therein, the alkyl group can be a lower alkyl group, such as methyl, ethyl, propyl, isopropyl, butyl, cyclopropyl, cyclobutyl or cyclopentyl group. The substituent of the substituted alkyl group can be a hydroxyl group, a halogen atom, or an alkoxy group. The substituent of the substituted alkoxy group can be an alkoxy group. The alkoxy group can be a lower alkoxy group, such as methoxy, ethoxy, propoxy or butoxy group. The acyloxy group can be an acetoxy group. The halogen atom can be a chlorine atom, a bromine atom, a fluorine atom or an iodine atom.

Examples of repeating units represented by formula (IV) are illustrated below, but these examples should not be construed as limiting the scope of the invention.

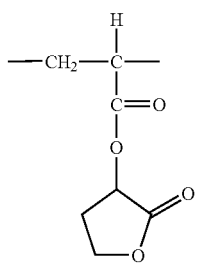
(IV-1)

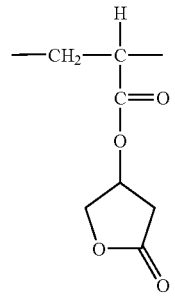
(IV-2)

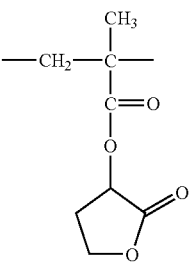
(IV-3)

-continued
(IV-4)
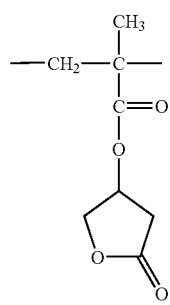
(IV-5)
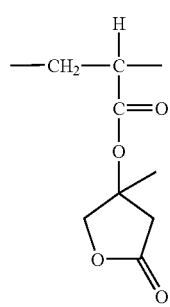
(IV-6)
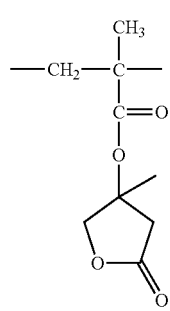
(IV-7)
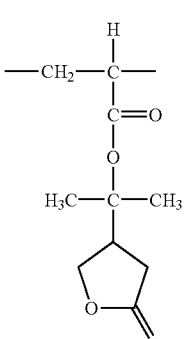
(IV-8)
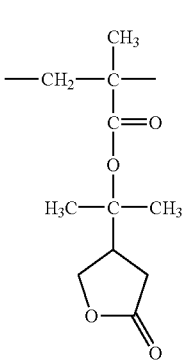
-continued
(IV-9)
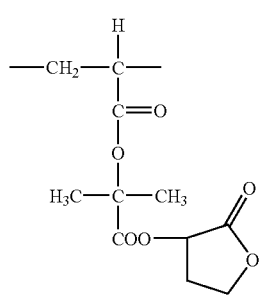
(IV-10)
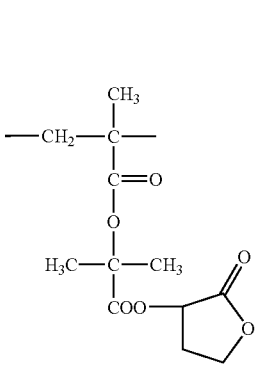
(IV-11)
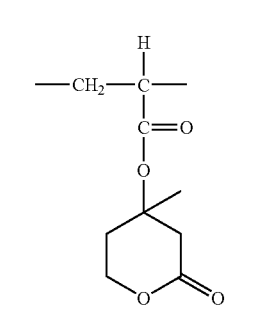
(IV-12)
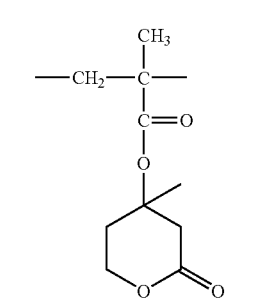
(IV-13)
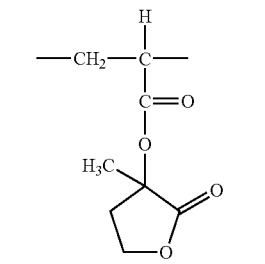

-continued
(IV-14) 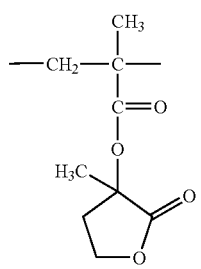
(IV-15) 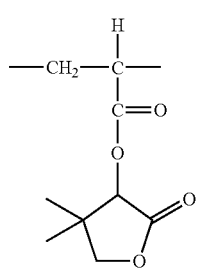
(IV-16) 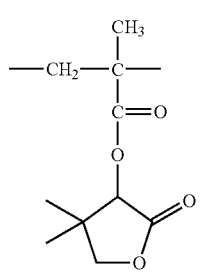
(IV-17) 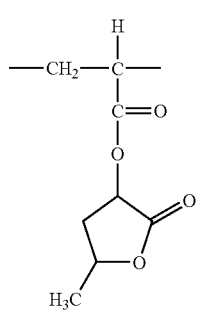
(IV-18) 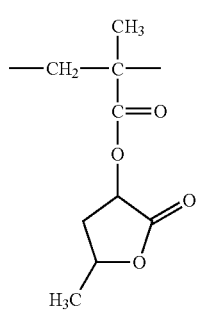
-continued
(IV-19) 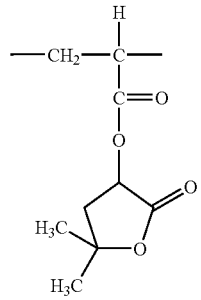
(IV-20) 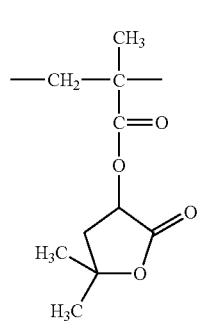
(IV-21) 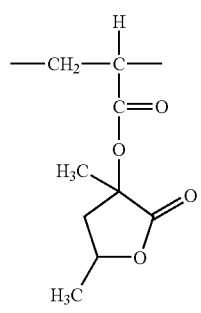
(IV-22) 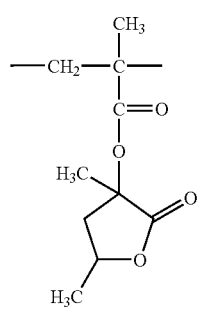
(IV-23) 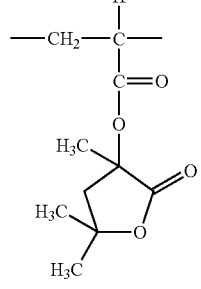

-continued
(IV-24)
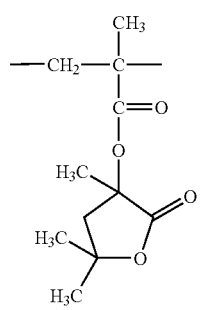
(IV-25)
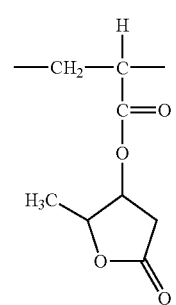
(IV-26)
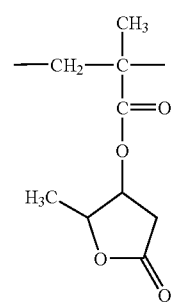
(IV-27)
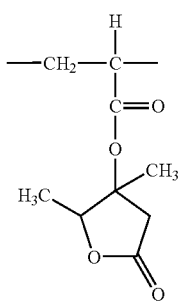
(IV-28)
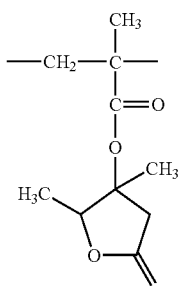
-continued
(IV-29)
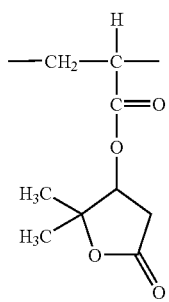
(IV-30)
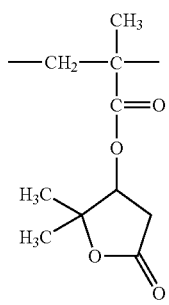
(IV-31)
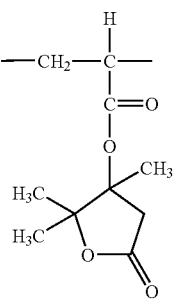
(IV-32)
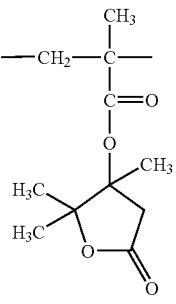
(IV-33)
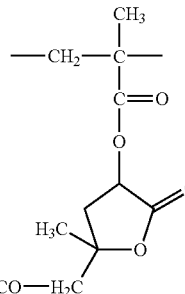

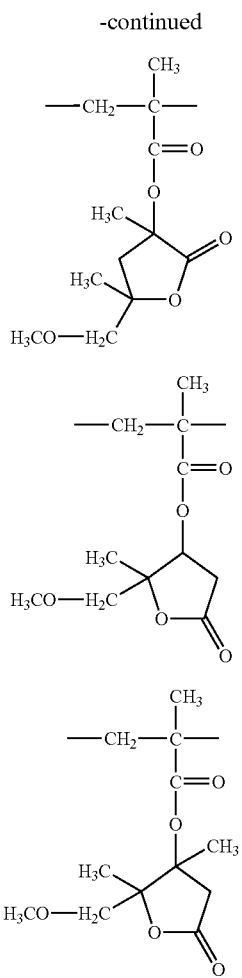

(IV-34)

(IV-35)

(IV-36)

Of these repeating units exemplifying formula (IV), the repeating units (IV-17) to (IV-36) are preferred over the others, because they can improve exposure margin.

Further, it is desirable from the viewpoint of improving edge roughness that the acrylate structure be included in the formula (IV).

In addition to the repeating units as recited above, the repeating units containing any of the groups represented by the following formulae (V-1) to (V-4) may be contained in the present acid-decomposable resin.

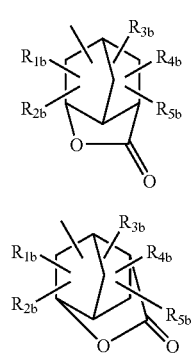

(V-1)

(V-2)

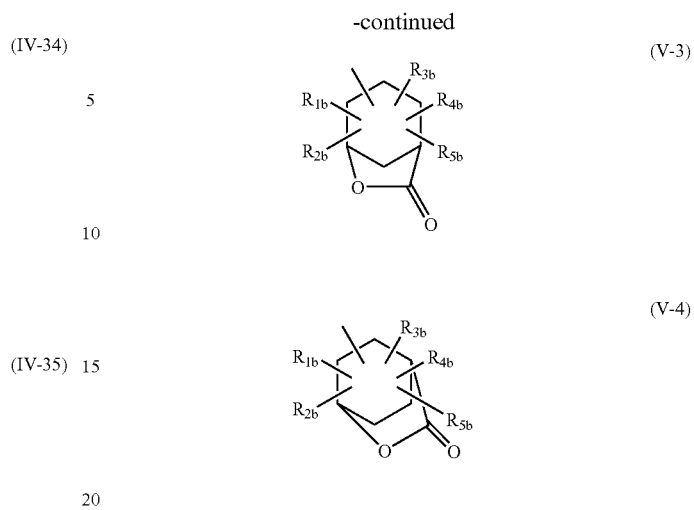

(V-3)

(V-4)

In formulae (V-1) to (V-4), $R_{1b}$ to $R_{5b}$ independently represent a hydrogen atom, or an unsubstituted or substituted alkyl, cycloalkyl or alkenyl group. Any two of $R_{1b}$ to $R_{5b}$ may combine with each other to form a ring.

The alkyl group represented by each of $R_{1b}$ to $R_{5b}$ in formulae (V-1) to (V-4) has either linear or branched structure, and may have a substituent.

Suitable examples of such a linear and branched alkyl group include 1-12C linear and branched alkyl groups, preferably 1-10C linear and branched alkyl groups. Specifically, methyl, ethyl, propyl, isopropyl, n-butyl, isobutyl, sec-butyl, t-butyl, pentyl, hexyl, heptyl, octyl, nonyl and decyl groups are preferred.

Suitable examples of a cycloalkyl group represented by $R_{1b}$ to $R_{5b}$ each include 3-8C cycloalkyl groups, such as cyclopropyl, cyclopentyl, cyclohexyl, cycloheptyl and cyclooctyl groups.

Suitable examples of an alkenyl group represented by $R_{1b}$ to $R_{5b}$ each include 2-6C alkenyl groups, such as vinyl, propenyl, butenyl and hexenyl groups.

Examples of a ring formed by combining any two of $R_{1b}$ to $R_{5b}$ include 3- to 8-menbered rings, such as cyclopropane, cyclobutane, cyclopentane, cyclohexane and cyclooctane rings.

Additionally, $R_{1b}$ to $R_{5b}$ in formulae (V-1) to (V-4) may be attached to any of carbons constituting a cyclic skeleton.

As suitable examples of substituents the alkyl, cycloalkyl and alkenyl groups may have, mention may be made of 1-4C alkoxy groups, halogen atoms (fluorine, chlorine, bromine and iodine atoms),2-5C acyl groups, 2-5C acyloxy groups, a cyano group, a hydroxyl group, a carboxyl group, 2-5C alkoxycarbonyl groups and a nitro group.

As the repeating units having groups represented by formulae (V-1) to (V-4) respectively, mention may be made of the repeating units represented by formula (II-A) or (II-B) so long as at least one of $R_{13}'$ to $R_{16}'$ is a group represented by formula (V-1), (V-2), (V-3) or (V-4) (for example, the $R_5$ of —$COOR_5$ is a group represented by each of formulae (V-1) to (V-4)), and repeating units represented by the following formula (AI):

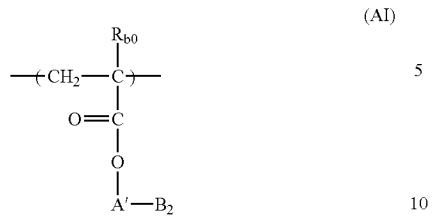
(AI)

wherein, $R_{b0}$ represents a hydrogen atom, a halogen atom, or a 1-4C substituted or unsubstituted alkyl group. As suitable examples of a substituent the alkyl group represented by $R_{b0}$ may have, mention may be made of the groups recited above as the substituents the alkyl group represented by $R_{1b}$ in each of formulae (V-1) to (V-4) may suitably have.

Examples of a halogen atom represented by $R_{b0}$ include a fluorine atom, a chlorine atom, a bromine atom and an iodine atom. Preferably, $R_{b0}$ is a hydrogen atom.

A' represents a single bond, an ether group, an ester group, a carbonyl group, an alkylene group or a divalent group formed by combining at least two of these groups.

$B_2$ represents a group represented by any of formulae (V-1) to (V-4).

Examples of a combined divalent group represented by A' include those of the following formulae:

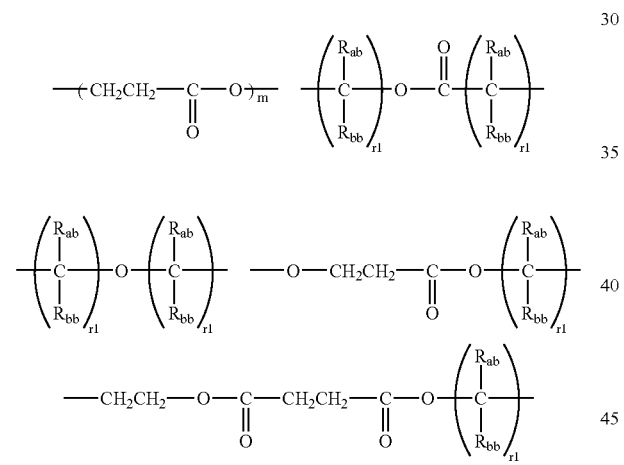

wherein, $R_{ab}$ and $R_{bb}$ each represent a hydrogen atom, an unsubstituted or substituted alkyl group, a halogen atom, a hydroxyl group or an alkoxy group, and they both may be the same or different.

The unsubstituted alkyl group suitable as $R_{ab}$ and $R_{bb}$ each is a lower alkyl group, such as methyl, ethyl, propyl, isopropyl or butyl group, preferably methyl, ethyl, propyl or isopropyl group. As examples of a substituent the alkyl group can have, mention may be made of a hydroxyl group, a halogen atom and 1-4C alkoxy groups.

Examples of an alkoxy group include 1-4C alkoxy groups, such as methoxy, ethoxy, propoxy and butoxy groups. Examples of a halogen atom include a chlorine atom, a bromine atom, a fluorine atom and an iodine atom. r1 is an integer of 1 to 10, preferably an integer of 1 to 4. m is an integer of 1 to 3, preferably 1 or 2.

Examples of repeating units represented by formula (AI) are illustrated below, but these examples should not be construed as limiting the scope of the invention.

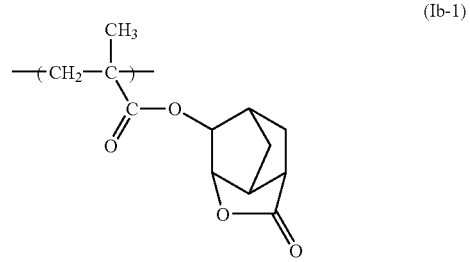
(Ib-1)

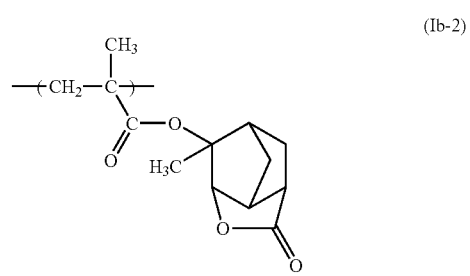
(Ib-2)

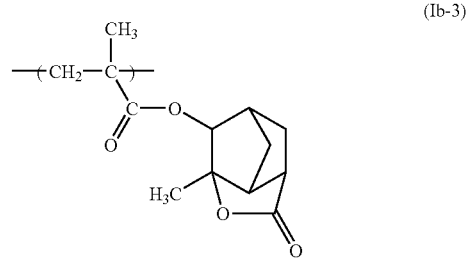
(Ib-3)

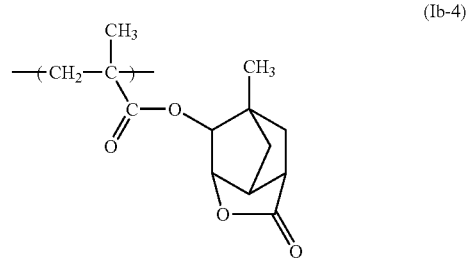
(Ib-4)

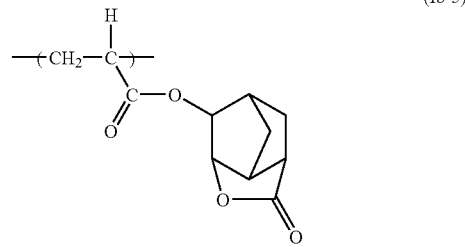
(Ib-5)

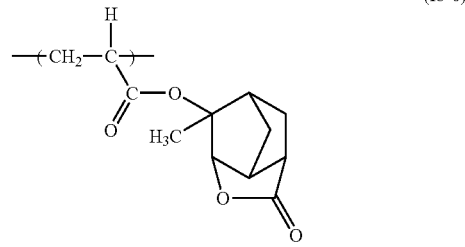
(Ib-6)

-continued
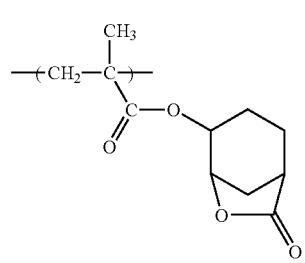
(Ib-7)
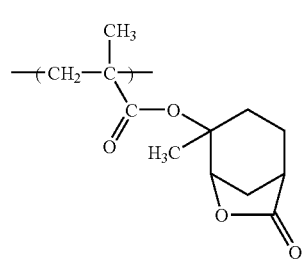
(Ib-8)
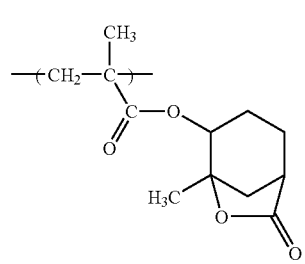
(Ib-9)
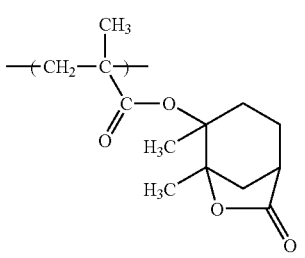
(Ib-10)
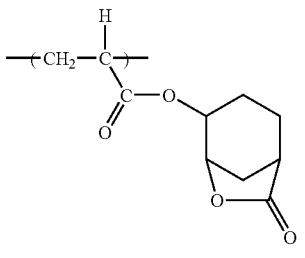
(Ib-11)
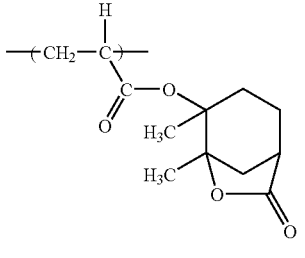
(Ib-12)
-continued
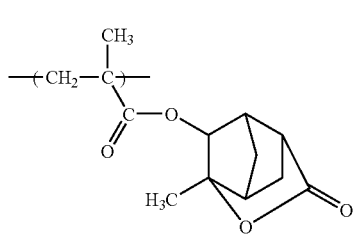
(Ib-13)
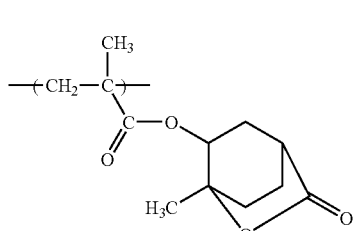
(Ib-14)
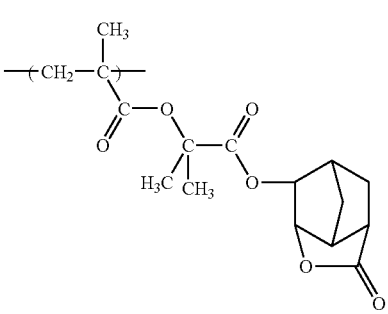
(Ib-15)
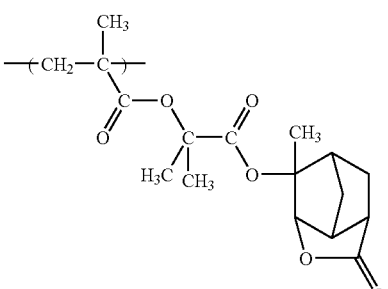
(Ib-16)
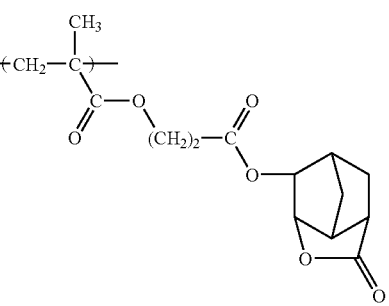
(Ib-17)

(Ib-18) 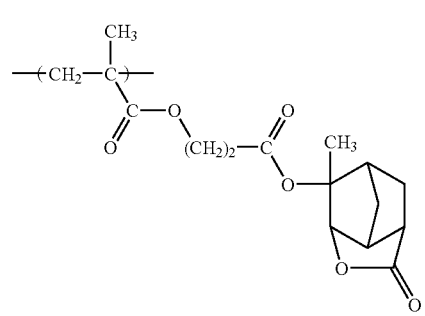
(Ib-19) 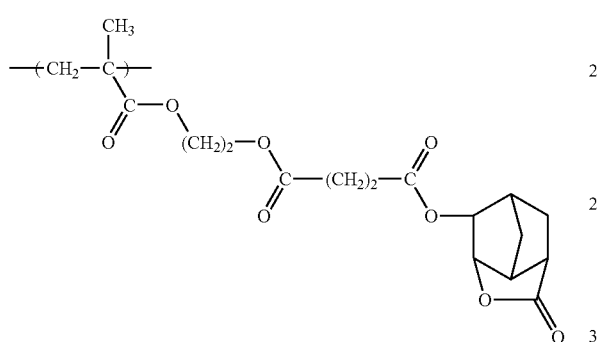
(Ib-20) 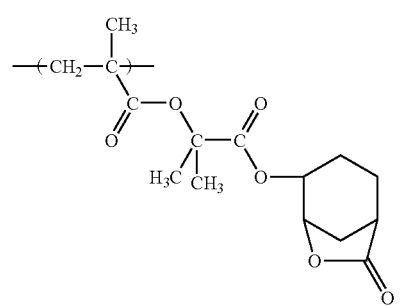
(Ib-21) 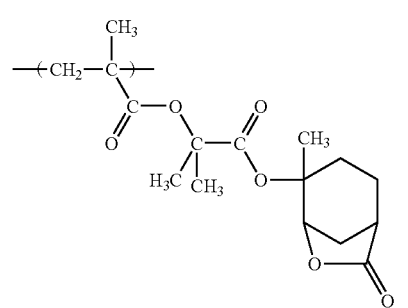
(Ib-22) 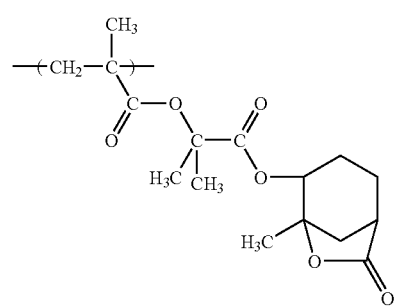
(Ib-23) 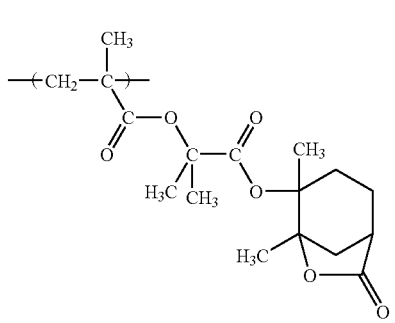
(Ib-24) 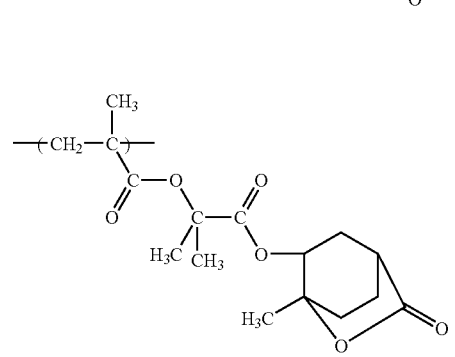
(Ib-25) 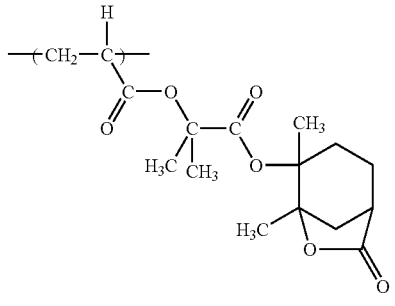
(Ib-26) 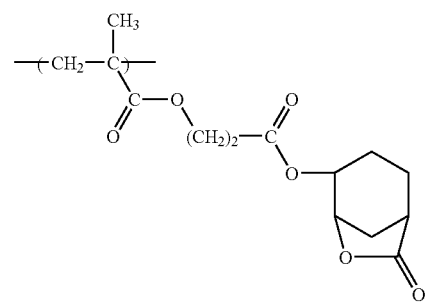
(Ib-27) 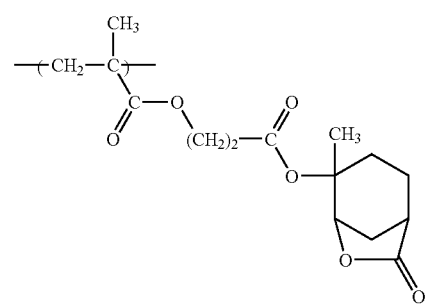

(Ib-28)
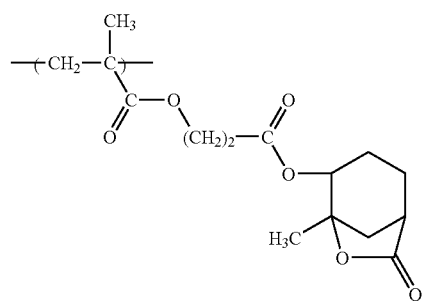

(Ib-29)
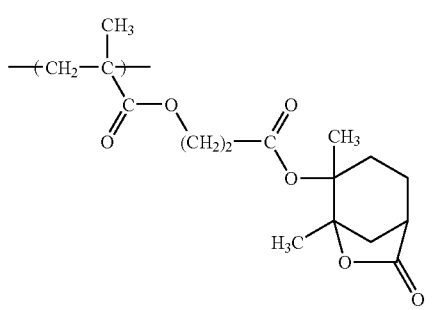

(Ib-30)
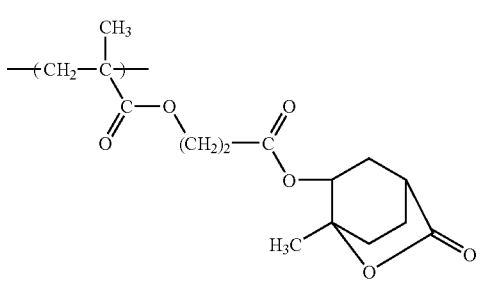

(Ib-31)
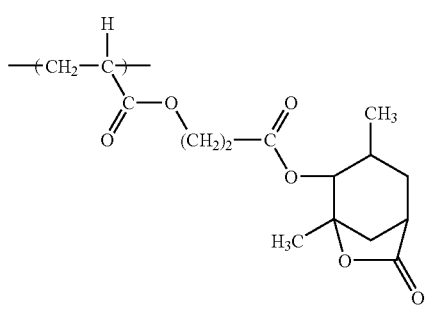

Further, the present acid-decomposable resin can contain repeating units represented by the following formula (VI):

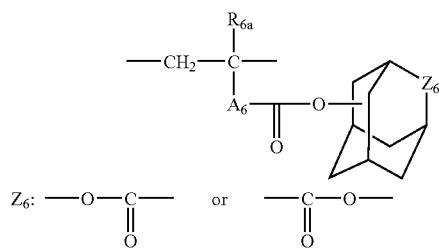
(VI)

wherein $A_6$ represents a single bond, an alkylene group, a cycloalkylene group, an ether group, a thioether group, a carbonyl group, an ester group or a group formed by combining any two or more of these groups; and $R_{6a}$ represents a hydrogen atom, a 1-4C alkyl group, a cyano group, or a halogen atom.

Examples of an alkylene group as $A_6$ in formula (VI) include groups represented by the following formula:

—[C(Rnf)(Rng)]r— wherein Rnf and Rng each represent a hydrogen atom, an unsubstituted or substituted alkyl group, a halogen atom, a hydroxyl group or an alkoxy group, and they both may be the same or different. As the alkyl group, a lower alkyl group, such as methyl, ethyl, propyl, isopropyl or butyl group, is suitable. Preferably, the lower alkyl group is methyl, ethyl, propyl or isopropyl group. As examples of a substituent the alkyl group can have, mention may be made of a hydroxyl group, a halogen atom and an alkoxy group. Examples of the alkoxy group include 1-4C alkoxy groups, such as methoxy, ethoxy, propoxy and butoxy groups. As examples of the halogen atom, mention may be made of chlorine, bromine, fluorine and iodine atoms. r is an integer of 1 to 10.

Examples of a cycloalkylene group as $A_6$ in formula (VI) include those containing 3 to 10 carbon atoms, such as cyclopentylene, cyclohexylene and cyclooctylene groups.

The $Z_6$-containing bridged alicyclic ring may have a substituent. As examples of a substituent such a ring may have, mention maybe made of a halogen atom, an alkoxy group (preferably containing 1 to 4 carbon atoms), an alkoxycarbonyl group (preferably containing 1 to 5 carbon atoms), an acyl group (e.g., formyl, benzoyl), an acyloxy group (e.g., propylcarbonyloxy, benozyloxy), an alkyl group (preferably containing 1 to 4 carbon atoms), a carboxyl group, a hydroxyl group, and an alkylsulfonylcarbamoyl group (e.g., —CONHSO$_2$CH$_3$). Additionally, the alkyl group as a substituent may further be substituted with a hydroxyl group, a halogen atom or an alkoxy group (preferably containing 1 to 4 carbon atoms).

The oxygen atom of the ester group linked to $A_6$ in formula (VI) may be attached to any of carbon atoms constituting the $Z_6$-containing bridged alicyclic ring structure.

Examples of repeating units represented by formula (VI) are illustrated below, but these examples should not be construed as limiting the scope of the invention.

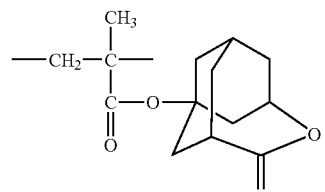

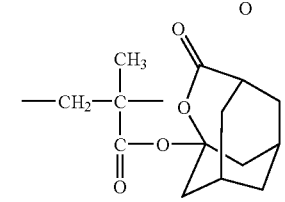

-continued
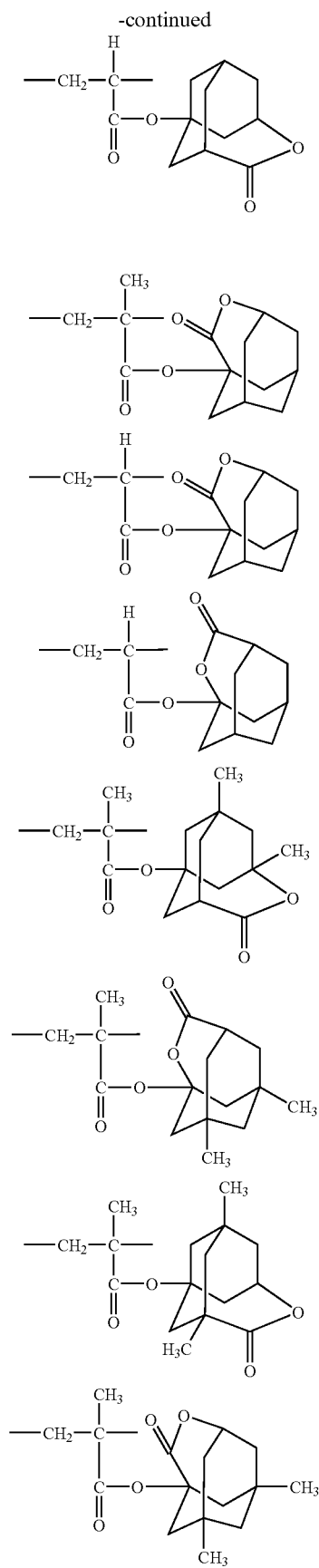
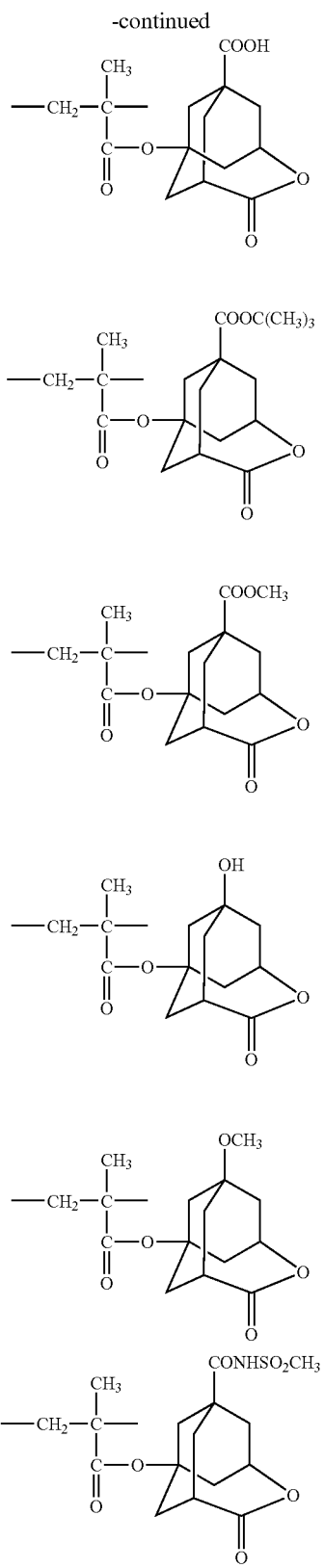
Furthermore, the present acid-decomposable resin may contain repeating units having groups represented by the following formula (VII):

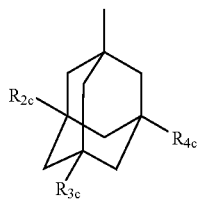

(VII)

wherein $R_{2c}$ to $R_{4c}$ independently represent a hydrogen atom or a hydroxyl group, provided that at least one of them represents a hydroxyl group.

The group represented by formula (VII) is preferably a dihydroxy- or monohydroxy-substituted group, particularly preferably a dihydroxy-substituted group.

As the repeating units having groups represented by formula (VII), mention may be made of the repeating units represented by formula (II-A) or (II-B) so long as at least one of $R_{13}'$ to $R_{16}'$ is a group represented by formula (VII) (for example, the $R_5$ of —COOR$_5$ is a group represented by formula (VII)), and repeating units represented by the following formula (AII).

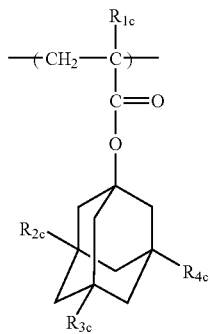

(AII)

wherein $R_{1c}$ represents a hydrogen atom or a methyl group, and $R_{2c}$ to $R_{4c}$ independently represents a hydrogen atom or a hydroxyl group, provided that at least one of $R_{2c}$ to $R_{4c}$ is a hydroxyl group.

Examples of a repeating unit having the structure represented by formula (AII) are illustrated below, but these examples should not be construed as limiting the scope of the invention.

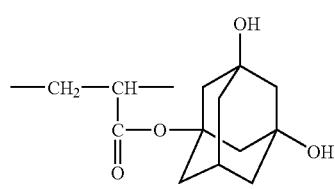

(1)

-continued

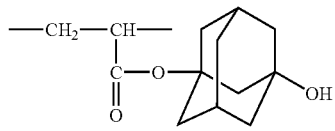

(2)

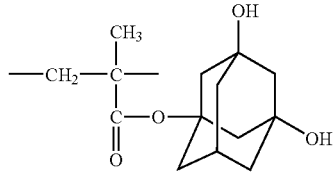

(3)

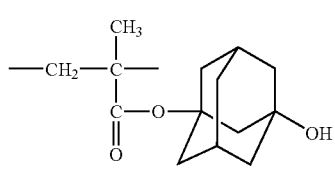

(4)

In addition, the repeating units represented by the following formula (VIII) may be contained;

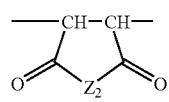

(VIII)

wherein, $Z_2$ represents —O— or —N(R$_{41}$)—, wherein $R_{41}$ represents a hydrogen atom, a hydroxyl group, an alkyl group, a haloalkyl group or —OSO$_2$—R$_{42}$ (wherein $R_{42}$ represents an alkyl group, a haloalkyl group, a cycloalkyl group or a camphor residue).

Suitable examples of an alkyl group represented by $R_{41}$ and $R_{42}$ each include 1-10C linear and branched alkyl groups, preferably 1-6C linear and branched alkyl groups, particularly preferably a methyl group, an ethyl group, a propyl group, an isopropyl group, a n-butyl group, an isobutyl group, a sec-butyl group and a t-butyl group.

Examples of a haloalkyl group represented by $R_{41}$ and $R_{42}$ each include a trifluoromethyl group, a nanoflurobutyl group, a pentadecafluorooctyl group and a trichloromethyl group. Examples of a cycloalkyl group represented by $R_{42}$ include a cyclopentyl group, a cyclohexyl group and a cyclooctyl group.

The alkyl groups as $R_{41}$ and $R_{42}$, and the cycloalkyl group or the camphor residue as $R_{42}$ may have substituents. Examples of such substituents include a hydroxyl group, a carboxyl group, a cyano group, halogen atoms (e.g., chlorine, bromine, fluorine, iodine), alkoxy groups (preferably containing 1 to 4 carbon atoms, such as methoxy, ethoxy, propoxy and butoxy groups), acyl groups (preferably containing 2 to 5 carbon atoms, such as formyl and acetyl groups), acyloxy groups (preferably containing 2 to 5 carbon atoms, such as an acetoxy group), and aryl groups (preferably containing 6 to 14 carbon atoms, such as a phenyl group).

Examples of a repeating unit represented by formula (VIII) include the repeating units [I'-1] to [I'-7] illustrated below, but these examples should not be construed as limiting the scope of the invention in any way.

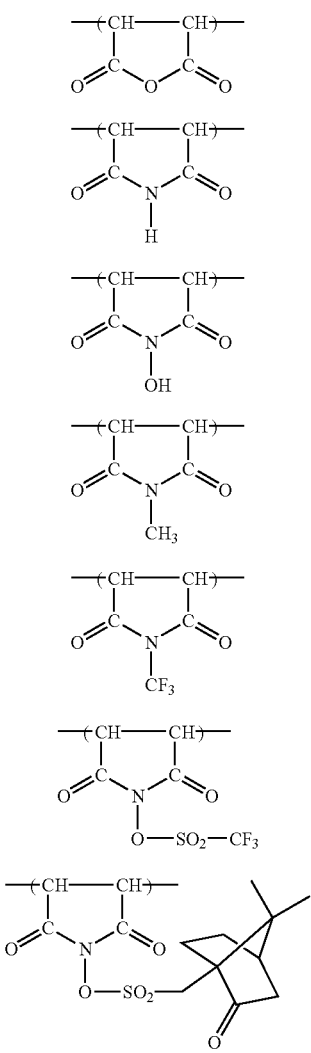

In addition to the repeating units as recited above, the acid-decomposable resin of Component (B) can contain various repeating units for the purposes of adjusting dry etching resistance, standard developer suitability, adhesion to substrates, resist profile and other characteristics required for resist, such as resolution, heat resistance and sensitivity.

Examples of repeating units that can meet those purposes include the repeating units corresponding to the monomers described below, but these examples should not be construed as limiting the scope of the invention.

Incorporation of these repeating units enables fine adjustments of capabilities required for acid-decomposable resins, especially:
(1) Coating solvent solubility
(2) Film formability (glass transition temperature)
(3) Alkali developability
(4) Thinning of resist coating (choices of which hydrophobic group and which alkali-soluble group to introduce)
(5) Adhesion to unexposed substrate
(6) Dry etching resistance.

As examples of monomers from which those repeating units are derived, mention may be made of compounds having one addition-polymerizable unsaturated bond per molecule, which can be selected from acrylic acid esters, methacrylic acid esters, acrylamides, methacrylamides, allyl compounds, vinyl ethers or vinyl esters.

More specifically, those compounds include the following monomers:

acrylic acid esters (preferably alkyl acrylates which contain 1 to 10 carbon atoms in their respective alkyl moieties), such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, bezyl acrylate, methoxybenzyl acrylate, furfuryl acrylate and tetrahydrofurfuryl acrylate;

methacrylic acid esters (preferably alkyl methacrylates which contain 1 to 10 carbon atoms in their respective alkyl moieties), such as methyl methacrylate, ethyl methacrylate, propylmethacrylate, isopropylmethacrylate, amylmethacrylate, hexyl methacrylatae, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate;

acrylamides, such as acrylamide, N-alkylacrylamides (the alkyl moieties of which contain 1 to 10 carbon atoms per molecule, with examples including methyl, ethyl, t-butyl, ethylhexyl, hydroxyethyl and cyclohexyl groups), N,N-dialkylacrylamides (the alkyl moieties of which contain 1 to 10 carbon atoms per molecule, with examples including methyl, ethyl, butyl, isobutyl, ethylhexyl and cyclohexyl groups), N-hydroxyethyl-N-methylacrylamide and N-2-acetamidoethyl-N-acetylacrylamide;

methacrylamides, such as methacrylamide, N-alkylmethacrylamides (the alkyl moieties of which contain 1 to 10 carbon atoms per molecule, with examples including methyl, ethyl, t-butyl, ethylhexyl, hydroxyethyl and cyclohexyl groups), N,N-dialkylmethacrylamides (the alkyl moieties of which include ethyl, propyl and butyl groups) and N-hydroxyethyl-N-methylmethacrylamide;

allyl compounds, such as allyl esters (e.g., allyl acetate, allyl caproate, allyl caprylate, allyl laurate, allyl palmitate, allyl stearate, allyl benzoate, allyl acetoacetate and allyl lactate) and allyloxyethanol;

vinyl ethers including alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, dimethylaminoethyl vinyl ether, diethylaminoethyl vinyl ether, butylaminoethyl vinyl ether, benzyl vinyl ether and tetrahydrofurfuryl vinyl ether);

vinyl esters, such as vinyl butyrate, vinyl isobutyrate, vinyl trimethylacetate, vinyldiethyl acetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

dialkyl itaconates, such as dimethyl itaconate, diethyl itaconate and dibutyl itaconate;

dialkyl fumarates and monoalkyl fumarates, such as dibutyl fumarate; and other monomers including crotonic acid, itaconic acid, maleic anhydride, maleimide, acrylonitrile, methacrylonitrile and maleylonitrile.

And besides, any of addition-polymerizable unsaturated compounds may undergo copolymerization so long as they can be copolymerized with monomers corresponding to the various repeating units recited above.

As to the present acid-decomposable resin, the molar ratio between repeating units of different kinds is determined appropriately for adjusting the resultant resist to have the desired dry etching resistance, standard developer suitability, adhesion to substrates and resist profile, and besides, generally required capabilities, such as resolution, heat resistance and sensitivity.

Preferred embodiments of the present acid-decomposable resin are as follows:

(1) Resins containing the repeating units having in parts alicyclic hydrocarbon-containing structures represented by any of formulae (pI) to (pVI) (Side-chain type),
(2) Resins containing repeating units represented by formula (II-AB) (Main-chain type), and
(3) Resins broadly included in (2),but further containing maleic anhydride derivatives and (meth)acrylate structures in addition to the repeating units represented by formula (II-AB) (Hybrid type).

The suitable proportion of the repeating units having in parts alicyclic hydrocarbon-containing structures represented by any of formulae (pI) to (pVI) is from 30 to 70 mole %, preferably from 35 to 65 mole %, particularly preferably from 40 to 60 mole %, of the total repeating units in acid-decomposable resin.

The suitable proportion of the repeating units represented by formula (II-AB) is from 10 to 60 mole %, preferably from 15 to 55 mole %, particularly preferably from 20 to 50 mole %, of the total repeating units in acid-decomposable resin.

The proportion of repeating units derived from the other monomers as comonomer constituents in the acid-decomposable resin can be appropriately determined depending on the desired resist properties. In general, their suitable proportion to the total mole number of repeating units having in parts alicyclic hydrocarbon-containing structures represented by any of formulae (pI) to (pVI) and repeating units represented by formula (II-AB) is at most 99 mole %, preferably at most 90 mole %, particularly preferably at most 80 mole %.

When the present composition is intended for ArF exposure, it is desirable for the resin to have no aromatic groups from the viewpoint of transparency to ArF light.

In addition, resins having fluorine-substituted structures in the main and/or side chains of their respective polymer skeletons and decomposing under action of acids to increase their solubility in alkali developers (hereinafter referred to as fluorinated group-containing resins) are preferred as the present acid-decomposable Resin (B). Specifically, the preferred resins are resins having at least one moiety selected from perfluoroalkylene groups or perfluoroarylene groups in the main chain of their respective polymer skeletons, and fluorinated group-containing resins having in side chains of their respective polymer skeletons at least one moiety selected from perfluoroalkyl groups, perfluoroaryl groups, hexafluoro-2-propernol or OH-protected hexafluoro-2-propanol.

More specifically, those resins are resins having repeating units of at least one kind represented by any of the following formulae (I) to (X):

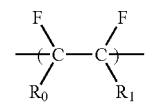
(I)

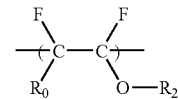
(II)

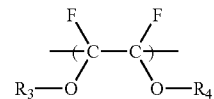
(III)

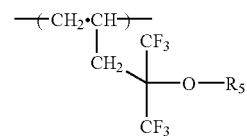
(IV)

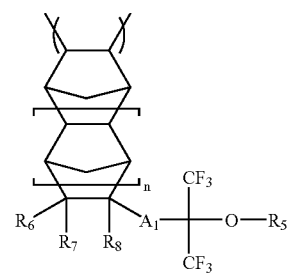
(V)

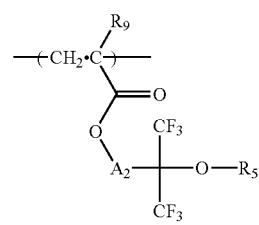
(VI)

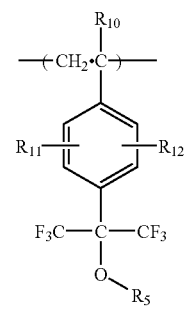
(VII)

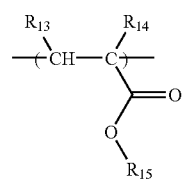
(VIII)

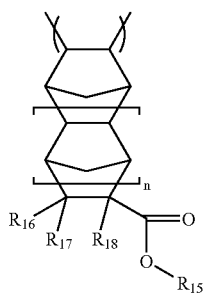

(IX)

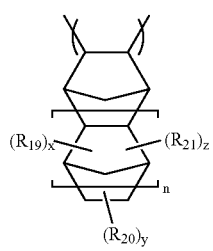

(X)

In the above formulae, $R_0$ and $R_1$ each represent a hydrogen atom, a fluorine atom, or an unsubstituted or substituted alkyl, perfluoroalkyl, cycloalkyl or aryl group.

$R_2$ to $R_4$ each represent an unsubstituted or substituted alkyl, perfluoroalkyl, cycloalkyl or aryl group, or a ring may be formed by combining $R_0$ with $R_1$, $R_0$ with $R_2$, or $R_3$ with $R_4$.

$R_5$ represents a hydrogen atom, or an unsubstituted or substituted alkyl, perfluoroalkyl, mono- or polycycloalkyl, acyl or alkoxycarbonyl group.

$R_6$, $R_7$ and $R_8$ may be the same or different, and they each represent a hydrogen atom, a halogen atom, or an unsubstituted or substituted alkyl, perfluoroalkyl or alkoxy group.

$R_9$ and $R_{10}$ may be the same or different, and they each represent a hydrogen atom, a halogen atom, a cyano group, or an unsubstituted or substituted alkyl or haloalkyl group.

$R_{11}$ and $R_{12}$ may be the same or different, and they each represent a hydrogen atom, a hydroxyl group, a halogen atom, a cyano group, an alkoxy group, an acyl group, or an unsubstituted or substituted alkyl, cycloalkyl, alkenyl, aralkyl or aryl group.

$R_{13}$ and $R_{14}$ may be the same or different, and they each represents a hydrogen atom, a halogen atom, a cyano group, or an unsubstituted or substituted alkyl or haloalkyl group.

$R_{15}$ represents a fluorine-containing alkyl, mono- or polycycloalkyl, alkenyl, aralkyl or aryl group.

$R_{16}$, $R_{17}$ and $R_{18}$ may be the same or different, and they each represent a hydrogen atom, a halogen atom, a cyano group, or an unsubstituted or substituted alkyl, perfluoroalkyl, alkoxy or —CO—O—$R_{15}$ group.

$R_{19}$, $R_{20}$ and $R_{21}$, which may be the same or different, each represent a hydrogen atom, a fluorine atom, or a fluorine-containing alkyl, mono- or polycycloalkyl, alkenyl, aralkyl, aryl or alkoxy group, provided that at least one of $R_{19}$, $R_{20}$ and $R_{21}$ is a group other than a hydrogen atom.

$A_1$ and $A_2$ each represent a single bond, an unsubstituted or substituted divalent alkylene, alkenylene, cycloallkylene or arylene group, or —O—CO—$R_{22}$—, —CO—O—$R_{23}$ or —CO—N($R_{24}$)—$R_{25}$—.

$R_{22}$, $R_{23}$ and $R_{25}$ may be the same or different, and they each represent a single bond, or a divalent alkylene, alk-enylene, cycloalkylene or arylene group which may contain an ether, ester, amido, urethane or ureido group.

$R_{24}$ represents a hydrogen atom, or an unsubstituted or substituted alkyl, cycloalkyl, aralkyl or aryl group.

n is 0 or 1, and x, y and z are each an integer of 0 to 4.

Resins preferred as Resin (B) in the invention are resins containing repeating units represented by at least one of the following formulae (XI), (XII) and (XIII) and having acid-decomposable groups and fluorinated groups:

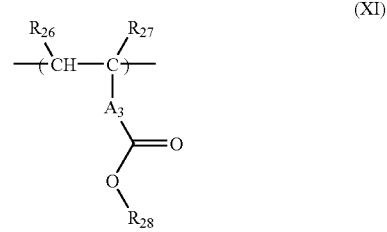

(XI)

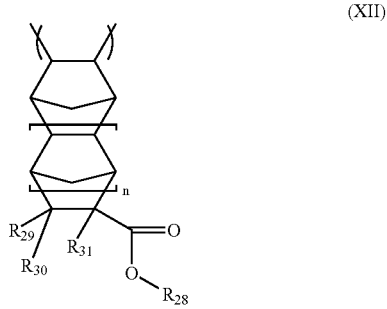

(XII)

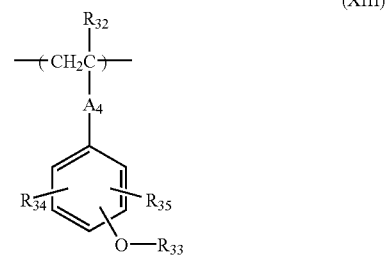

(XIII)

In the above formulae, $R_{26}$, $R_{27}$ and $R_{32}$ may be the same or different, and they each represent a hydrogen atom, a halogen atom, a cyano group, or an unsubstituted or substituted alkyl or haloalkyl group.

$R_{28}$ and $R_{33}$ each represent —C($R_{36}$)($R_{37}$)($R_{38}$), —C($R_{36}$)($R_{37}$)(O$R_{39}$), or a group of the following formula (XIV):

(XIV)

wherein $R_{29}$, $R_{30}$ and $R_{31}$ may be the same or different, and they each represent a hydrogen atom, a halogen atom, a cyano group, or an unsubstituted or substituted alkyl, perfluoroalkyl, alkoxy or —CO—O—$R_{28}$ group.

$R_{34}$ and $R_{35}$ may be the same or different, and they each represent a hydrogen atom, a hydroxyl group, a halogen atom, a cyano group, an alkoxy group, an acyl group, or an unsubstituted or substituted alkyl, cycloalkyl, alkenyl, aralkyl or aryl group.

$R_{36}$, $R_{37}$, $R_{38}$ and $R_{39}$ may be the same or different, and they each represent an unsubstituted or substituted alkyl, cycloalkyl, alkenyl, alkynyl, aralkyl or aryl group. Any two of $R_{36}$, $R_{37}$ and $R_{38}$, or any two of $R_{36}$, $R_{37}$ and $R_{39}$ may combine with each other to form a ring, and the ring formed may contain an oxo group.

$R_{40}$ represents an unsubstituted or substituted alkyl, cycloalkyl, alkenyl, alkynyl, aralkyl or aryl group.

$A_3$ and $A_4$ each represent a single bond, or an unsubstituted or substituted divalent alkylene, alkenylene, cycloalkylene or arylene group, or —O—CO—$R_{22}$—, —CO—O—$R_{23}$— or —CO—N($R_{24}$)—$R_{25}$—.

$R_{22}$ to $R_{25}$ in those groups have the same meanings as mentioned above, respectively.

Z represents atoms constituting a monocyclic or polycyclic alicyclic group together with the carbon atom. n represents 0 or 1.

For the purposes of adjusting their physical properties, such as hydrophobicity, glass transition temperature and transparency to exposure light, or controlling the polymerizability in polymer syntheses, the fluorinated group-containing resins may further contain repeating units derived from at least one of maleic anhydride, a vinyl ether and a cyano group-containing vinyl compound represented by the following formulae (XV) to (XVII) respectively:

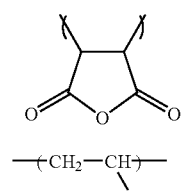
(XV)

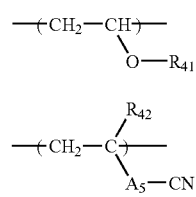
(XVI)

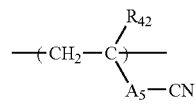
(XVII)

wherein, $R_{41}$ represents an unsubstituted or substituted alkyl, cycloalkyl, aralkyl or aryl group.

$R_{42}$ represents a hydrogen atom, a halogen atom, a cyano group, or an unsubstituted or substituted alkyl or haloalkyl group.

$A_5$ represents a single bond, an unsubstituted or substituted divalent alkylene, alkenylene, cycloalkylene or arylene group, or —O—CO—$R_{22}$—, —CO—O—$R_{23}$— or —CO—N($R_{24}$)—$R_{25}$—.

$R_{22}$ to $R_{25}$ in those groups have the same meanings as mentioned above, respectively.

Resins far preferred as the fluorinated group-containing resins suitable for the invention include resins having at least two kinds of repeating units represented by the following formulae (IA) and (IIA) respectively, or resins having at least two kinds of repeating units represented by the following formulae (IIA) and (VIA) respectively.

These preferred resins each may further have repeating units represented by the foregoing formulae (I) to (V).

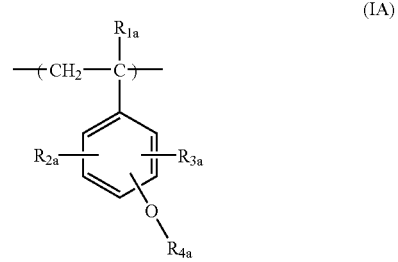
(IA)

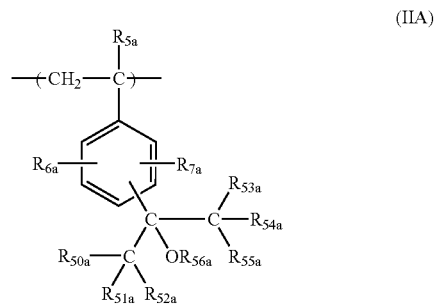
(IIA)

In formulae (IA) and (IIA), $R_{1a}$ and $R_{5a}$ may be the same or different, and they each represent a hydrogen atom, a halogen atom, a cyano group, or an unsubstituted or substituted alkyl group.

$R_{2a}$, $R_{3a}$, $R_{6a}$ and $R_{7a}$ may be the same or different, and they each represent a hydrogen atom, a halogen atom, a cyano group, a hydroxyl group, or an unsubstituted or substituted alkyl, cycloalkyl, alkoxy, acyl, acyloxy, alkenyl, aryl or aralkyl group.

$R_{50a}$ to $R_{55a}$ may be the same or different, and they each represent a hydrogen atom, a fluorine atom, or an unsubstituted or substituted alkyl group, provided that at least one of them represents a fluorine atom or an alkyl group at least one hydrogen of which is substituted by fluorine atom.

$R_{56a}$ represents a hydrogen atom, or an unsubstituted or substituted alkyl, cycloalkyl, acyl or alkoxycarbonyl group, preferably a hydrogen atom.

$R_{4a}$ represents a group of the following formula (IVA) or (VA):

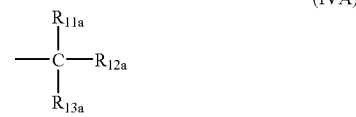
(IVA)

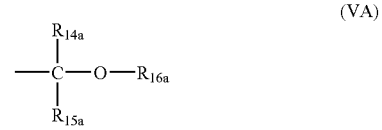
(VA)

In formula (IVA), $R_{11a}$, $R_{12a}$ and $R_{13a}$ may be the same or different, and they each represent an unsubstituted or substituted alkyl, cycloalkyl, alkenyl, aralkyl or aryl group.

In formula (VA), $R_{14a}$ and $R_{15a}$ may be the same or different, and they each represent a hydrogen atom, or an unsubstituted or substituted alkyl group. $R_{16a}$ represents an unsubstituted or substituted alkyl, cycloalkyl, aralkyl or aryl group. Any two of $R_{14a}$ to $R_{16a}$ may combine with each other to form a ring.

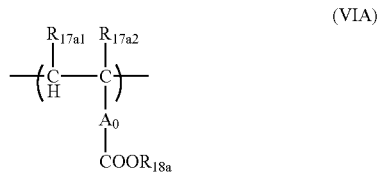

(VIA)

In formula (VIA), $R_{17a1}$ and $R_{17a2}$ may be the same or different, and they each represent a hydrogen atom, a halogen atom, a cyano group, or an unsubstituted or substituted alkyl group. $R_{18a}$ represents —$C(R_{18a1})(R_{18a2})(R_{18a3})$ or —$C(R_{18a1})(R_{18a2})(OR_{18a4})$. $R_{18a1}$ to $R_{18a4}$ may be the same or different, and they each represent a hydrogen atom, or an unsubstituted or substituted alkyl, cycloalkyl, alkenyl, aralkyl or aryl group. Any two of $R_{18a1}$ to $R_{18a3}$, or any two of $R_{18a1}$, $R_{18a2}$ and $R_{18a4}$ may combine with each other to form a ring. $A_0$ represents a single bond or an unsubstituted or substituted divalent linkage group, preferably a single bond.

As to these fluorinated group-containing resins, it is preferable that $R_{18a}$ in formula (VIA) be a group represented by the following formula (VIA-A) or (VIA-B). In addition, it is appropriate that at least one of $R_{1a}$ in formula (IA), $R_{5a}$ in formula (IIA) and $R_{17a2}$ in formula (VIA) be a trifluoromethyl group.

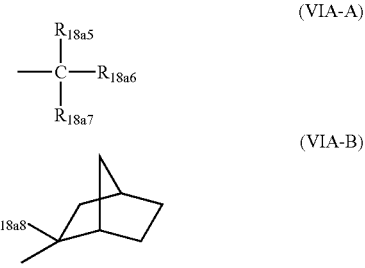

In formula (VIA-A), $R_{18a5}$ and $R_{18a6}$ may be the same or different, and they each represent an unsubstituted or substituted alkyl group. $R_{18a7}$ represents an unsubstituted or substituted cycloalkyl group.

In formula (VIA-B), $R_{18a8}$ represents an unsubstituted or substituted alkyl, alkenyl, alkynyl, aralkyl or aryl group.

The resins having at least two kinds of repeating units represented by formula (IA) and (IIA) respectively and the resins having at least two kinds of repeating units represented by formula (IIA) and (VIA) respectively may further have at least either repeating units represented by the following formula (IIIA) or repeating units represented by the following formula (VIIA).

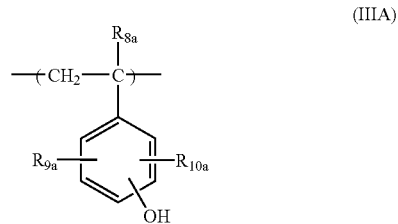

(IIIA)

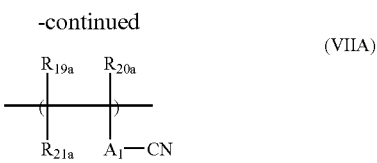

(VIIA)

In formula (IIIA), $R_{8a}$ represents a hydrogen atom, a halogen atom, a cyano group, or an unsubstituted or substituted alkyl group. $R_{9a}$ and $R_{10a}$ may be the same or different, and they each represent a hydrogen atom, a halogen atom, a cyano group, or an unsubstituted or substituted alkyl, cycloalkyl, alkoxy, acyl, acyloxy, alkenyl, aryl or aralkyl group.

In formula (VIIA), $R_{19a}$ and $R_{20a}$ maybe the same or different, and they each represent a hydrogen atom, a halogen atom, a cyano group, or an unsubstituted or substituted alkyl group. $R_{21a}$ represents a hydrogen atom, a halogen atom, an unsubstituted or substituted alkyl group, or a group of formula —$A_1$—CN. $A_1$ represents a single bond or a divalent linkage group.

In the fluorinated group-containing resins as recited above, the alkyl groups are, e.g., 1-8C alkyl groups. Suitable examples thereof include methyl, ethyl, propyl, n-butyl, sec-butyl, hexyl, 2-ethylhexyl and octyl groups.

The cycloalkyl groups may be either monocyclic or polycyclic ones. Suitable examples of the monocyclic ones include 3-8C cycloalkyl groups such as cyclopropyl, cyclopentyl, cyclohexyl, cycloheptyl and cyclooctyl groups. Suitable examples of the polycyclic ones include 6-20C cycloalkyl groups such as adamantyl, norbornyl, isobornyl, camphanyl, dicyclopentyl, α-pinenyl, tricyclodecanyl, tetracyclododecyl and androstanyl groups. Additionally, carbon atoms in the mono- or polycycloalkyl groups recited above may be replaced by hetero atoms including oxygen atom.

The perfluoroalkyl groups are, e.g., those containing 4 to 12 carbon atoms. Suitable examples thereof include perfluorobutyl, perfluorohexyl, perfluorooctyl, perfluorooctylethyl and perfluorododecyl groups.

The haloalkyl groups are, e.g., those containing 1 to 4 carbon atoms. Suitable examples thereof include chloromethyl, chloroethyl, chloropropyl, chlorobutyl, bromomethyl and bromoethyl groups.

The aryl groups are, e.g., 6-15C aryl groups. Suitable examples thereof include phenyl, tolyl, dimethylphenyl, 2,4,6-trimethylphenyl, naphthyl, anthryl and 9,10-dimethoxyanthryl groups.

The aralkyl groups are, e.g., 7-12C aralkyl groups. Suitable examples thereof include benzyl, phenetyl and naphthylmethyl groups.

The alkenyl groups are, e.g., 2-8C alkenyl groups. Suitable examples thereof include vinyl, allyl, butenyl and cyclohexenyl groups.

The alkoxy groups are, e.g., 1-8C alkoxy groups. Suitable examples thereof include methoxy, ethoxy, n-propoxy, isopropoxy, butoxy, pentoxy, allyloxy and octoxy groups.

The acyl groups are, e.g., 1-10C acyl groups. Suitable examples thereof include formyl, acetyl, propanoyl, butanoyl, pivaloyl, octanoyl and benzoyl groups.

The acyloxy groups are, e.g., 2-12C acyloxy groups. Suitable examples thereof include acetoxy, propionyloxy and benzoyloxy groups.

The alkynyl groups are preferably 2-5C alkynyl groups, with examples including ethynyl, propynyl and butynyl groups.

The alkoxycarbonyl groups include isoprooxycarbonyl, t-butoxycarbonyl, t-amyloxycarbonyl and 1-methyl-1-cyclohexyloxycarbonyl groups, preferably secondary alkoxycarbonyl groups, particularly preferably tertiary alkoxycarbonyl groups.

The halogen atoms include fluorine, chlorine, bromine and iodine atoms.

The alkylene groups are preferably 1-8C alkylene groups, with examples including methylene, ethylene, propylene, butylene, hexylene and octylene groups which may have substituents.

The alkenylene groups are preferably 2-6C alkenylene groups, with examples including ethenylene, propenylene and butenylene groups which may have substituents.

The cycloalkylene groups are preferably 5-8C cycloalkylene groups, with examples including cyclopentylene and cyclohexylene groups which may have substituents.

The arylene groups are preferably 6-15C arylene groups, with examples including phenylene, tolylene and naphthylene groups which may have substituents.

The divalent linkage group represents a divalent, unsubstituted or substituted alkylene, cycloalkylene, alkenylene or arylene group, or a group of formula —O—CO—$R_{22a}$—, —CO—O—$R_{23a}$— or —CO—N($R_{24a}$)—$R_{25a}$—. Herein, $R_{22a}$, $R_{23a}$ and $R_{25a}$ may be the same or different, and they each represent a single bond, or an alkylene, alkenylene, cycloalkylene or arylene group which may contain an ether, ester group, amido, urethane or ureido group. $R_{24a}$ represents a hydrogen atom, or an unsubstituted or substituted alkyl, cycloalkyl, aralkyl or aryl group.

The rings formed by combining $R_0$ with $R_1$ or $R_2$, and $R_3$ with $R_4$ include 5- to 7-membered rings, such as fluorine-substituted cyclopentane, cyclohexane, furan, dioxonol and 1,3-dioxolan rings.

The rings formed by combining any two of $R_{36}$, $R_{37}$ and $R_{38}$, or any two of $R_{36}$, $R_{37}$ and $R_{39}$ include 3- to 8-membered rings, such as cyclopropane, cyclopentane, cyclohexane, furan and pyran rings.

The rings formed by combining any two of $R_{14a}$ to $R_{16a}$, any two of $R_{18a1}$ to $R_{18a3}$, or any two of $R_{18a1}$, $R_{18a2}$ and $R_{18a4}$ are preferably 3- to 8-membered rings, with examples including cyclopropane, cyclopentane, cyclohexane, tetramethylene oxide, pentamethylene oxide, hexamethylene oxide, furan, pyran, dioxonol and 1,3-dioxolan rings.

Z represents atoms forming a mono- or polycyclic alicyclic group. Suitable examples of the monocyclic alicyclic group formed are those containing 3 to 8 carbon atoms, such as cyclopropyl, cyclopentyl, cyclohexyl, cycloheptyl and cyclooctyl groups. And suitable examples of the polycyclic alicyclic group formed are those containing 6 to 20 carbon atoms, such as adamantyl, norbornyl, isobornyl, camphanyl, dicyclopentyl, α-pinenyl, tricyclodecanyl, tetracyclododecyl and androstanyl groups.

As examples of substituents the groups as recited above may have, mention maybe made of alkyl groups, cycloalkyl groups, aryl groups, groups having active hydrogen atoms such as amino, amido, ureido, urethane, hydroxyl and carboxyl groups, halogen atoms (e.g., fluorine, chlorine, bromine, iodine), alkoxy groups (e.g., methoxy, ethoxy, propoxy, butoxy), a thioether group, acyl groups (e.g., acetyl, propanoyl, benzoyl), acyloxy groups (e.g., acetoxy, propanoyloxy, benzoyloxy), alkoxycarbonyl groups (e.g., methoxycarbonyl, ethoxycarbonyl, propoxycarbonyl), a cyano group and a nitro group.

Herein, examples of alkyl, cycloalkyl and aryl groups include the same ones as recited above, respectively. As to the alkyl groups, fluorinated alkyl groups and cycloalkyl-substituted alkyl groups may further be included.

As examples of groups that are contained in the present fluorinated group-containing resins and decompose under the action of acids to show alkali solubility, mention may be made of groups represented by —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C ($R_{01}$)($R_{02}$)COO—C($R_{36}$)($R_{37}$)($R_{38}$) —COO—C ($R_{36}$)($R_{37}$)($R_{38}$), and —COO—C($R_{36}$)($R_{37}$)(O$R_{39}$).

$R_{36}$ to $R_{39}$ have the same meanings as recited above, respectively. $R_{01}$ and $R_{02}$ each represent a hydrogen atom, or an alkyl, cycloalkyl, alkenyl, aralkyl or aryl group which may have substituents as recited above.

Suitable examples of such acid-decomposable groups include ether or ester groups of tertiary alkyl groups (e.g., t-butyl, t-amyl, 1-alkyl-1-cyclohexyl, 2-alkyl-2-adamantyl, 2-adamantyl-2-propyl, 2-(4-methylcyclohexyl)-2-propyl), acetal or acetal ester groups, such as 1-alkoxy-1-ethoxy and tetrahydropyranyl groups, t-alkylcarbonate groups and t-alkylcarbonylmethoxy groups.

The repeating units represented by formulae (I) to (X) are incorporated in a total proportion of generally 10 to 80 mole %, preferably 30 to 70%, particularly preferably 35 to 65 mole %, in the whole composition of polymer.

The repeating units represented by formulae (XI) to (XIII) are incorporated in a total proportion of generally 0 to 70 mole %, preferably 10 to 60%, particularly preferably 20 to 50 mole %, in the whole composition of polymer.

The repeating units represented by formulae (XV) to (XVII) are incorporated in a total proportion of generally 0 to 70 mole %, preferably 10 to 60%, particularly preferably 20 to 50 mole %, in the whole composition of polymer.

Further, it is preferable for the present Resin (B) to contain at least one kind of repeating units selected from those represented by formulae (I) to (III) and at least one kind of repeating units selected from those represented by formulae (IV) to (VI).

Similarly, it is also preferable for the present Resin (B) to contain at least one kind of repeating units selected from those represented by formulae (IV) to (VI) and at least one kind of repeating units selected from those represented by formulae (VIII) to (X).

Likewise, it is also preferable for the present Resin (B) to contain at least one kind of repeating units selected from those represented by formulae (IV) to (VII) and at least one kind of repeating units selected from those represented by formulae (XV) to (XVII).

By having such compositions, the resins can have sufficiently high transparency at 157 nm and the dry etching resistance thereof can be inhibited from lowering.

When the present Resin (B) has at least one kind of repeating units selected from those represented by formulae (I) to (III) and at least one kind of repeating units selected from those represented by formulae (IV) to (VI), the total proportion of the repeating units represented by formulae (I) to (III) is generally from 0 to 70 mole %, preferably from 10 to 60 mole %, particularly preferably from 20 to 50 mole %, of the whole composition of polymer. And the total proportion of the repeating units represented by formulae (IV) to (VI) is generally from 10 to 80 mole %, preferably from 30 to 70 mole %, particularly preferably from 35 to 65 mole %, of the whole composition of polymer.

When the present Resin (B) has at least one kind of repeating units selected from those represented by formulae (VI) to (VI) and at least one kind of repeating units selected from those represented by formulae (VIII) to (X), the total proportion of the repeating units represented by formulae (IV) to (VI) is generally from 10 to 80 mole %, preferably from 30 to 70 mole %, particularly preferably from 35 to 65 mole %, of the whole composition of polymer.

And the total proportion of the repeating units represented by formulae (VIII) to (X) is generally from 0 to 70 mole %, preferably from 10 to 60 mole %, particularly preferably from 20 to 50 mole %, of the whole composition of polymer.

When the present Resin (B) has at least one kind of repeating units selected from those represented by formulae (IV) to (VII) and at least one kind of repeating units selected from those represented by formulae (XV) to (XVII), the total proportion of the repeating units represented by formulae (IV) to (VII) is generally from 10 to 80 mole %, preferably from 30 to 70 mole %, particularly preferably from 35 to 65 mole %, of the whole composition of polymer.

And the total proportion of the repeating units represented by formulae (XV) to (XVII) is generally from 0 to 70 mole %, preferably from 10 to 60 mole %, particularly preferably from 20 to 50 mole %, of the whole composition of polymer.

In the fluorinated group-containing resin having at least repeating units represented by formulae (IA) and (IIA) respectively, the proportion of the repeating units of formula (IA) is generally from 5 to 80 mole %, preferably from 10 to 75 mole %, particularly preferably from 20 to 70 mole %.

In the fluorinated group-containing resin having at least repeating units represented by formulae (IA) and (IIA) respectively, the proportion of the repeating units of formula (IIA) is generally from 5 to 80 mole %, preferably from 10 to 70 mole %, particularly preferably from 20 to 65 mole %.

In the fluorinated group-containing resin having at least repeating units represented by formulae (IIA) and (VIA) respectively, the proportion of the repeating units of formula (IIA) is generally from 5 to 80 mole %, preferably from 10 to 70 mole %, particularly preferably from 20 to 65 mole %.

In the fluorinated group-containing resin having at least repeating units represented by formulae (IIA) and (VIA) respectively, the proportion of the repeating units of formula (VIA) is generally from 5 to 80 mole %, preferably from 10 to 70 mole %, particularly preferably from 20 to 65 mole %.

In those fluorinated group-containing resins, the proportion of repeating units represented by formula (IIIA) is generally from 1 to 40 mole %, preferably from 3 to 35 mole %, particularly preferably from 5 to 30 mole %.

In those fluorinated group-containing resins, the proportion of repeating units represented by formula (VIIA) is generally from 1 to 40 mole %, preferably from 3 to 35 mole %, particularly preferably from 5 to 30 mole %.

In addition to the repeating units as recited above, the present Resin (B) may have repeating units derived from other copolymerizable monomers for the purpose of giving a performance boost to the present positive resist.

Those copolymerizable monomers are compounds containing one addition-polymerizable unsaturated bond per molecule, and can be selected from, excepting the compounds as mentioned above, acrylic acid esters, methacrylic acid esters, acrylamides, methacrylamides, allyl compounds, vinyl ethers, vinyl esters, styrenes and crotonic acid esters.

More specifically, the following monomers are included in those compounds.

Examples of those acrylic acid esters include alkyl acrylates containing 1 to 10 carbon atoms in their respective alkyl moieties (such as methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethyl-hydroxypropyl acrylate, 5-hydroxypentyl acrylate, trimethylolpropane monoacrylate, pentaerythritol monoacrylate, glycidyl acrylate, benzyl acrylate, furfuryl acrylate and tetrahydrofurfuryl acrylate) and aryl acrylates (such as phenyl acrylate).

Examples of those methacrylic acid esters include alkyl methacrylates containing 1 to 10 carbon atoms in their respective alkyl moieties (such as methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylol-propane monomethacrylate, pentaerythritol monomethacrylate, glycidyl methacrylate, furfuryl methacrylate and tetrahydrofurfuryl methacrylate) and aryl methacrylates (such as phenyl methacrylate, cresyl methacrylate and naphthyl methacrylate).

Examples of those acrylamides include acrylamide, N-alkylacrylamides (which each have an alkyl moiety containing 1 to 10 carbon atoms, such as methyl, ethyl, propyl, butyl, t-butyl, heptyl, octyl, cyclohexyl or hydroxyethyl group), N,N-dialkylacrylamides (which each have an alkyl moiety containing 1 to 10 carbon atoms, such as methyl, ethyl, butyl, isobutyl, ethylhexyl or cyclohexyl group), N-arylacrylamides (the aryl moiety of which is, e.g., phenyl, tolyl, nitrophenyl, naphthyl, cyanophenyl, hydroxyphenyl or carboxyphenyl), N,N-dialkylacrylamides (the alkyl moieties of which contain 1 to 10 carbon atoms, such as methyl, ethyl, butyl, isobutyl, ethylhexyl or cyclohexyl group), N,N-diarylmethacrylamides (the aryl moieties of which are, e.g., phenyl), N-methyl-N-phenylacrylamide, N-hydroxyethyl-N-methylacrylamide and N-2-acetamidoethyl-N-acetylacrylamide.

Examples of methacrylamides include methacrylamide, N-alkylmethacrylamides (which each have an alkyl moiety containing 1 to 10 carbon atoms, such as methyl, ethyl, t-butyl, ethylhexyl, hydroxyethyl or cyclohexyl group), N-arylmethacrylamides (the aryl moieties of which include a phenyl group), N,N-dialkylmethacrylamides (the alkyl moieties of which include ethyl, propyl and butyl groups), N,N-diarylmethacrylamides (the aryl moieties of which include a phenyl group), N-hydroxyethyl-N-methylmethacrylamide, N-methyl-N-phenylmethacrylamide, and N-ethyl-N-phenylmeth-acrylamide.

Examples of those allyl compounds include allyl esters (such as allyl acetate, allyl caproate, allyl caprylate, allyl laurate, allyl palmitate, allyl stearate, allyl benzoate, allyl acetacetate and allyl lactate), and allyloxyethanol.

Examples of vinyl ethers include alkyl vinyl ethers (such as hexyl vinyl ether, octyl vinyl ether, decyl vinyl ether, ethylhexyl vinyl ether, methoxyethyl vinyl ether, etoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), and vinyl aryl ethers (such as vinyl phenyl ether, vinyl tolyl ether, vinyl chlorophenyl ether, vinyl 2,4-dichlorophenyl ether, vinyl naphthyl ether and vinyl anthranyl ether).

Examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetacetate, vinyl lactate, vinyl- β-phenylbutyrate, vinyl chlorohexylcarboxylate, vinyl benzoate, vinyl salicylate, vinyl chlorobenzoate, vinyl tetrachlorobenzoate, and vinyl naphthoate.

Examples of those styrenes include styrene, alkylstyrenes (such as methylstyrene, dimethylstyrene, trimethylstyrene, ethylstyrene, diethylstyrene, isoproyl-styrene, butylstyrene, hexylstyrene, cyclohexylstyrene, decylstyrene, benzylstyrene, chloromethylstyrene, trifluoromethylstyrene, ethoxymethylstyrene and acetoxy-methylstyrene), alkoxystyrenes (such as methoxystyrene, 4-methoxy-3-methylstyrene and dimethoxystyrene), halostyrenes (such as chlorostyrene, dichlorostyrene, trichlorostyrene, tetrachlorostyrene, pentachlorostyrene, bromostyrene, dibromostyrene, iodostyrene, fluorostyrene, trifluoro-styrene, 2-bromo-4-trifluoromethylstyrene and 4-fluoro-3-trifluoromethylstyrene), carboxystyrene, and vinyl-naphthalene.

Examples of those crotonic acid esters include alkyl crotonates (such as butyl crotonate, hexyl crotonate and glycerin monocrotonate). Examples of those itaconic acid esters include dialkyl itaconates (such as dimethyl itaconate, diethyl itaconate and dibutyl itaconate.

Further, dialkyl esters of maleic or fumaric acid (e.g., dimethyl maleate, dibutyl fumarate), maleic anhydride, maleimide, acrylonitrile, methacrylonitrile, and maleylonitrile can be used as the comonomers. In addition, any other addition-polymerizable unsaturated compounds may be used as long as they can undergo copolymerization.

Examples of repeating units represented by formulae (I) to (X), respectively, are illustrated below, but these examples should not be construed as limiting the scope of the invention in any way.

(F-1)

(F-2)

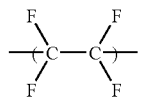

(F-3)

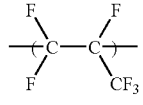

(F-4)

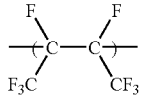

(F-5)

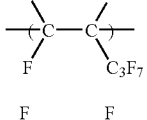

(F-6)

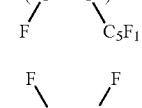

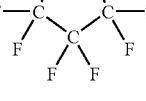

-continued (F-7)

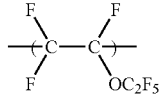

(F-8)

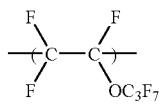

(F-9)

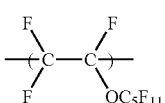

(F-10)

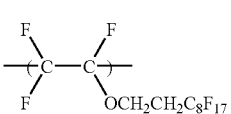

(F-11)

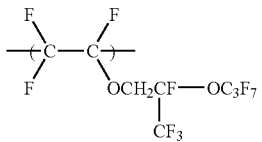

(F-12)

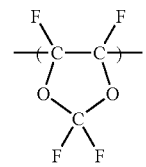

(F-13)

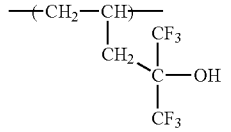

(F-14)

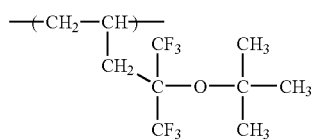

(F-15)

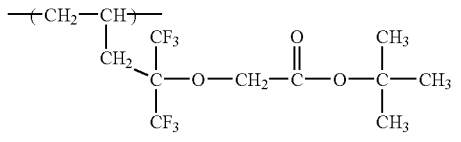

(F-16)

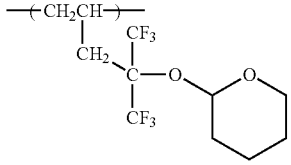

(F-17)

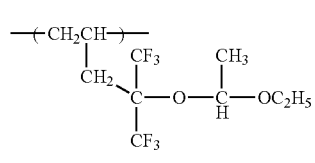

-continued
(F-18) 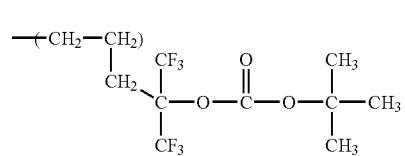
(F-19) 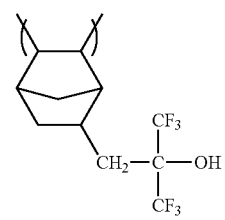
(F-20) 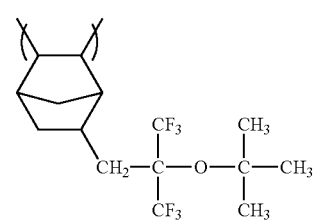
(F-21) 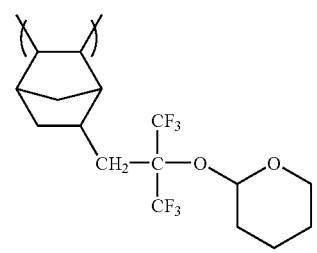
(F-22) 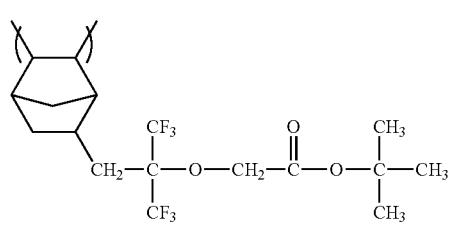
(F-23) 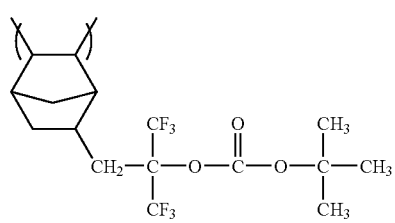
(F-24) 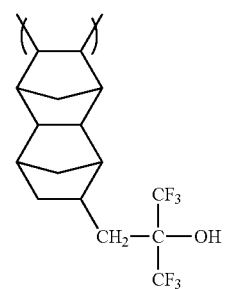
-continued
(F-25) 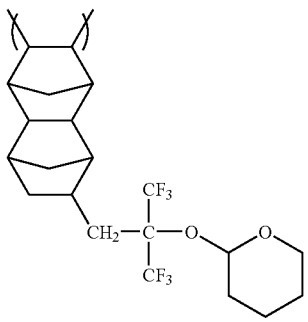
(F-26) 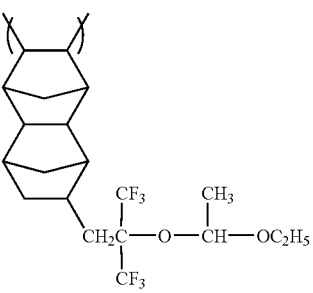
(F-27) 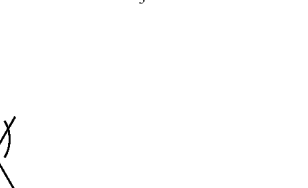
(F-28) 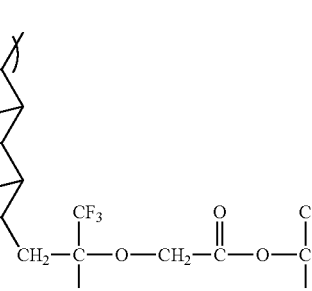
(F-29) 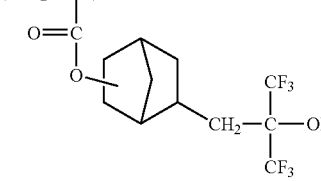

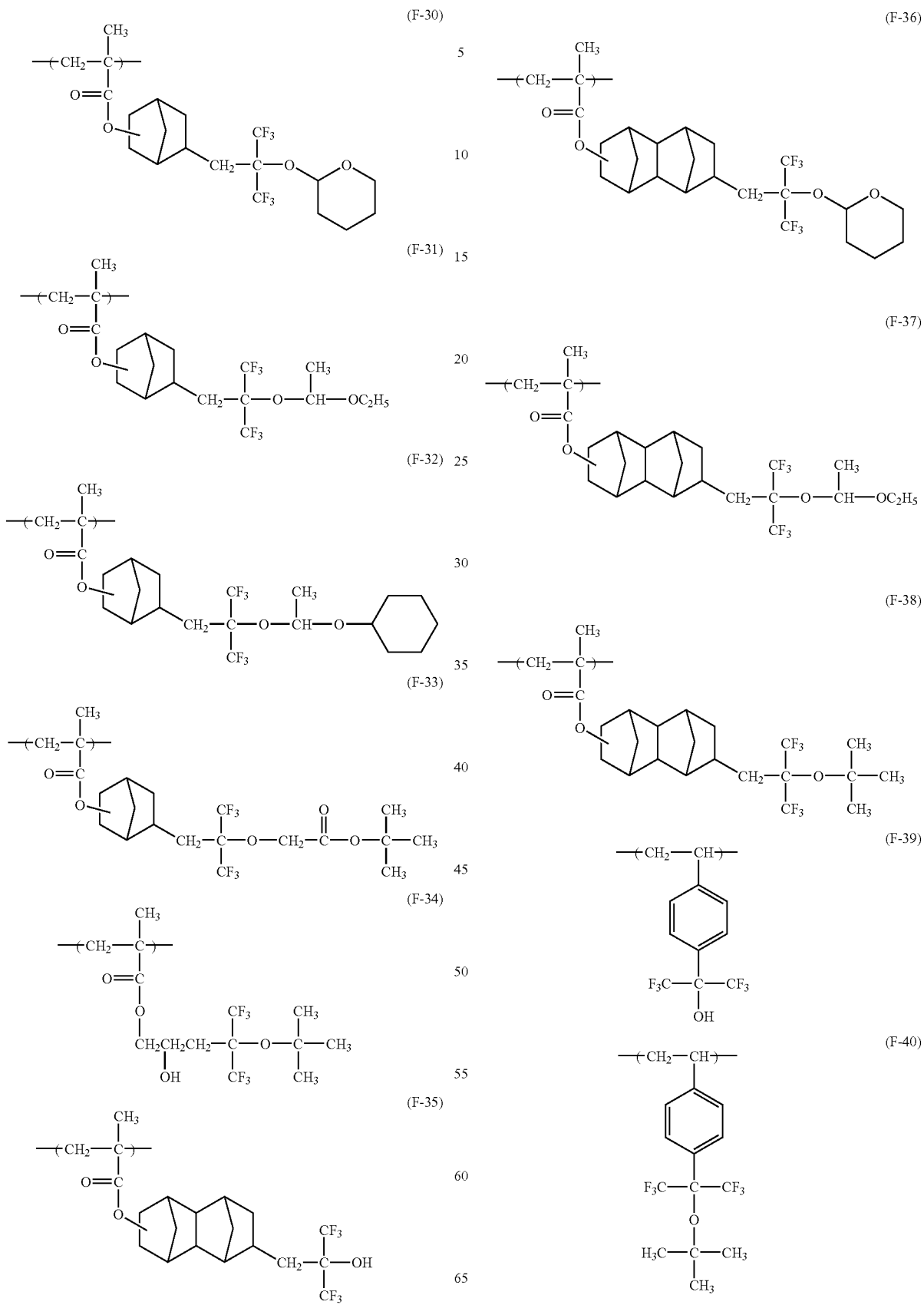

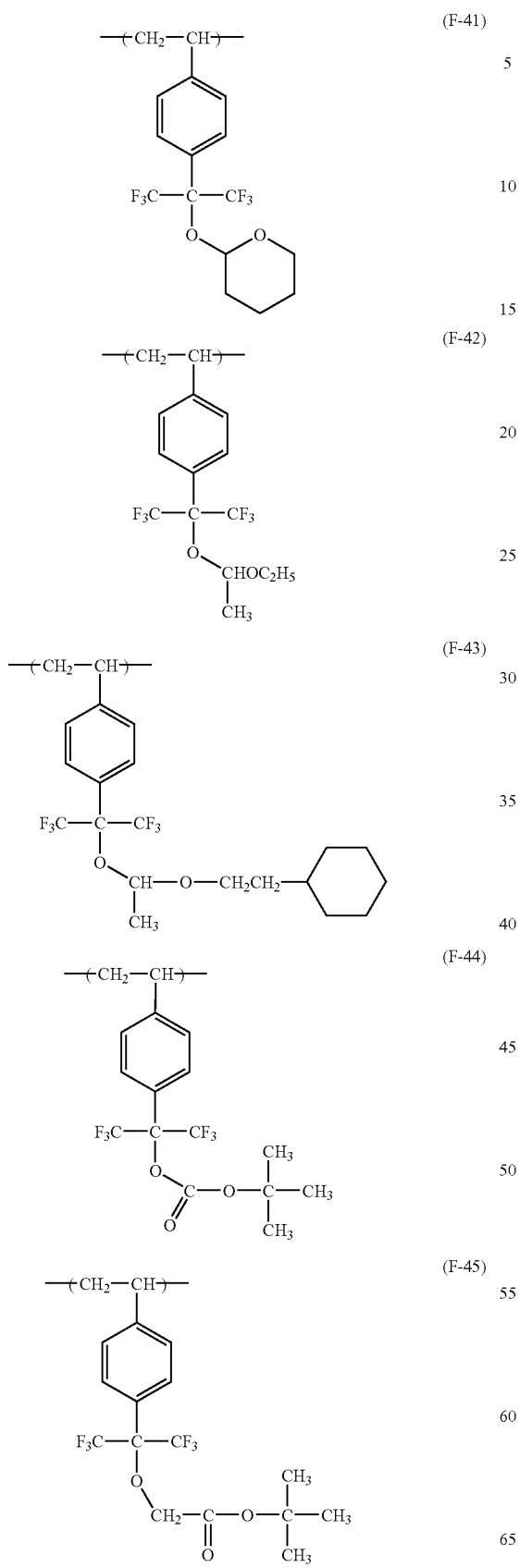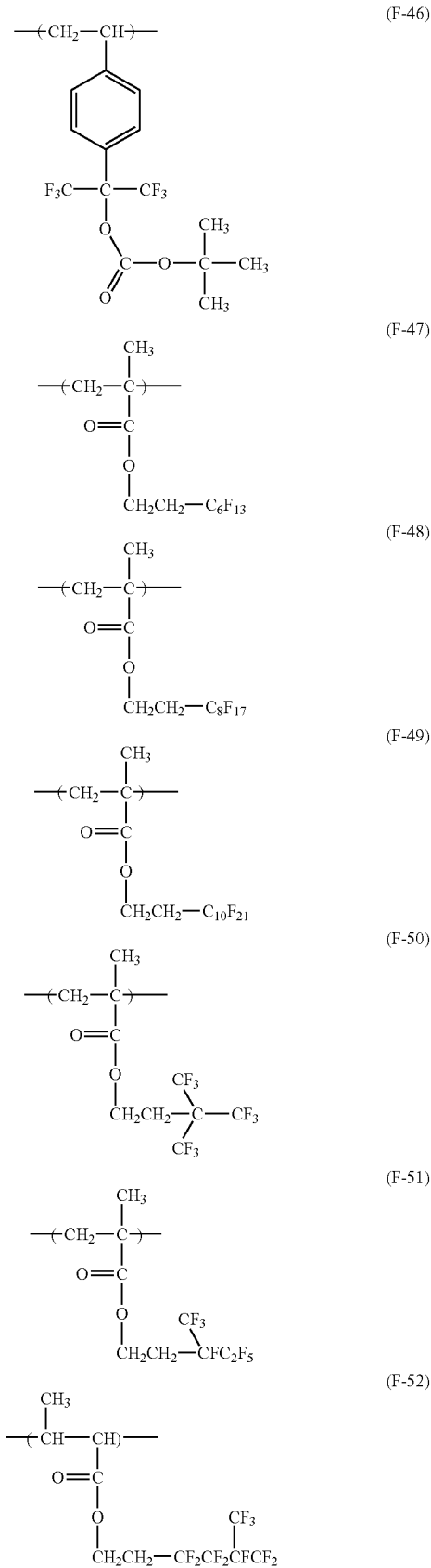

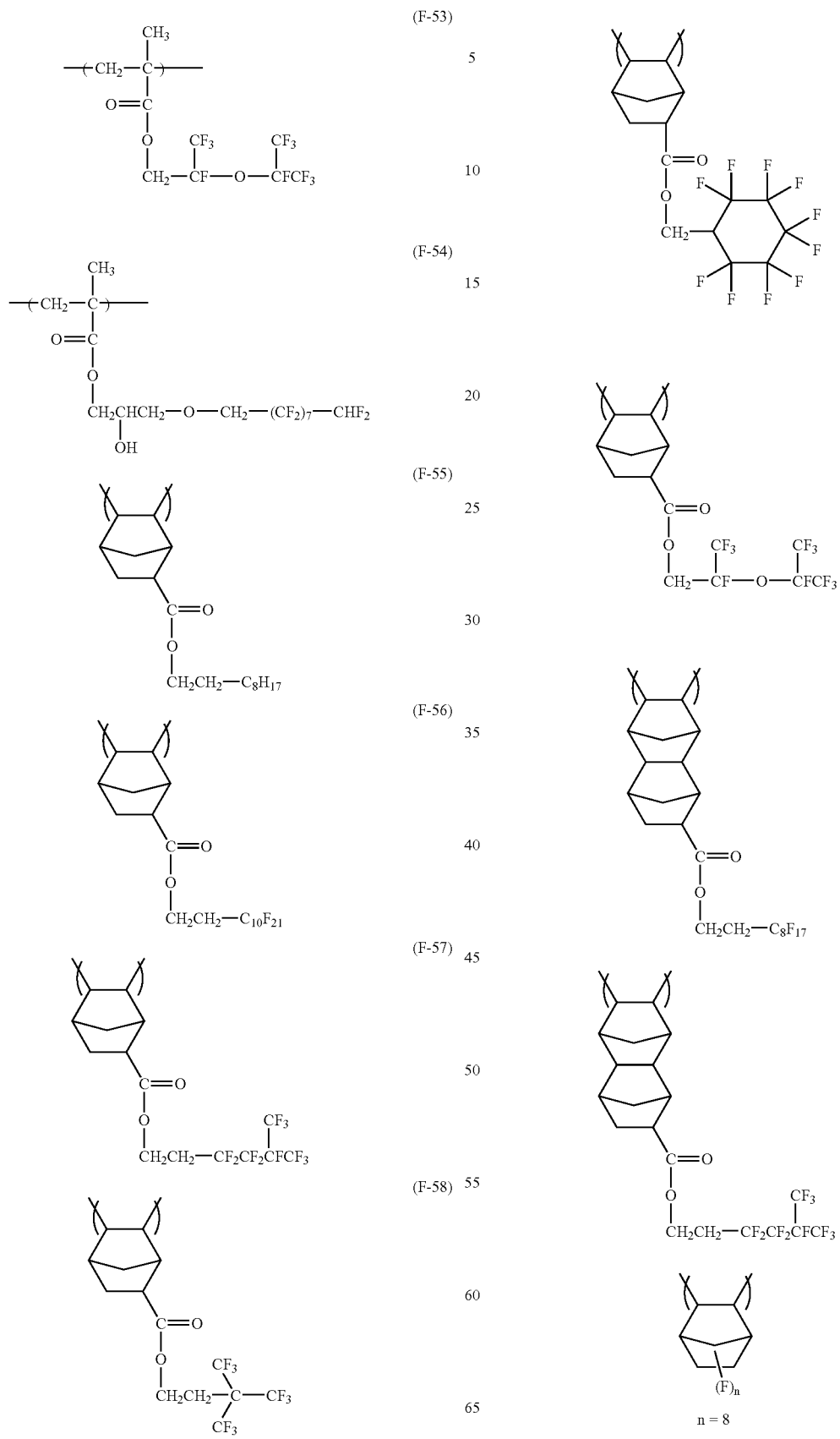

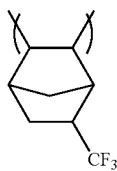
(F-64)
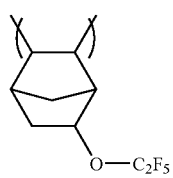
(F-65)
Examples of repeating units represented by formulae (XI) to (XIII), respectively, are illustrated below, but these examples should not be construed as limiting the scope of the invention in any way.
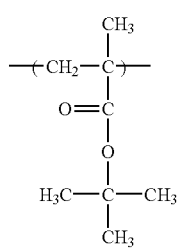
(B-1)
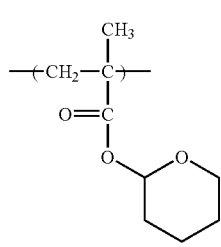
(B-2)
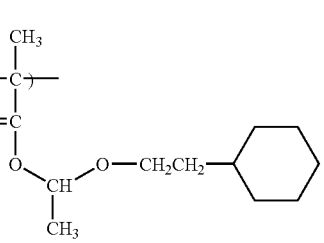
(B-3)
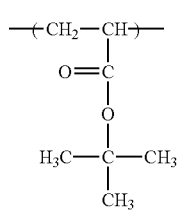
(B-4)
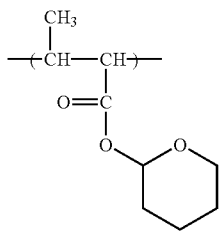
(B-5)
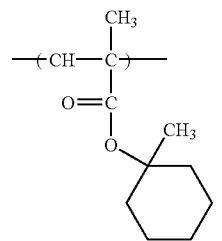
(B-6)
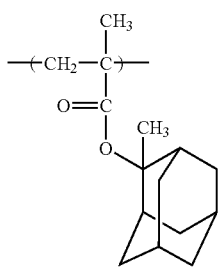
(B-7)
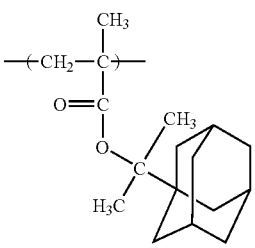
(B-8)
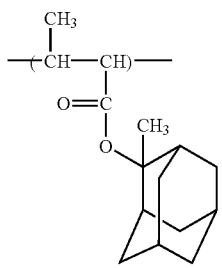
(B-9)
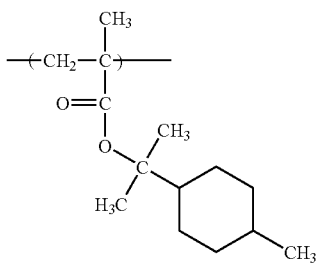
(B-10)

-continued
(B-11) 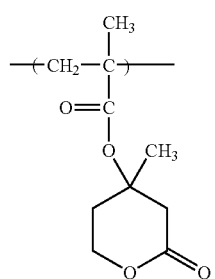
(B-12) 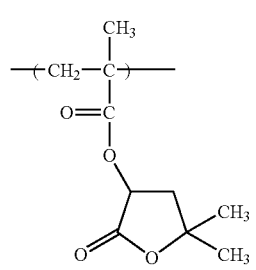
(B-13) 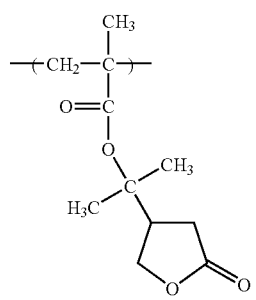
(B-14) 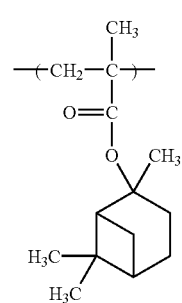
(B-15) 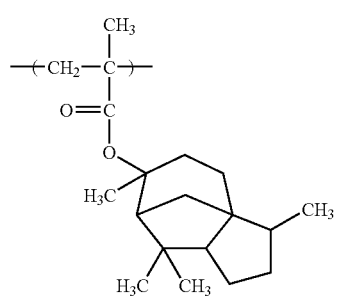
-continued
(B-16) 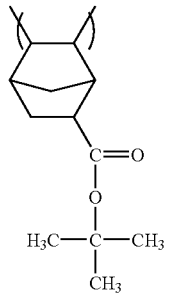
(B-17) 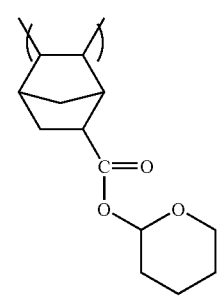
(B-18) 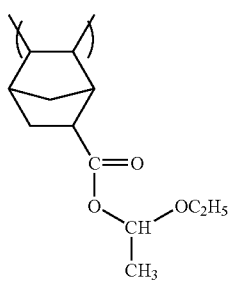
(B-19) 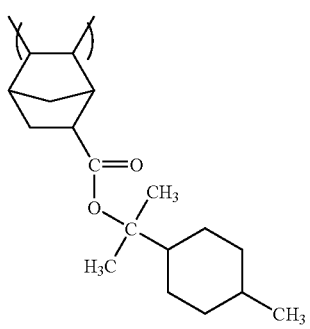
(B-20) 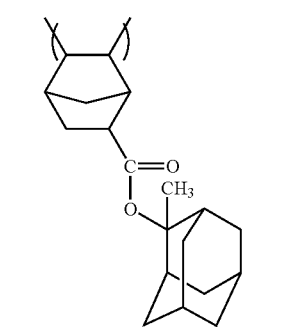

-continued
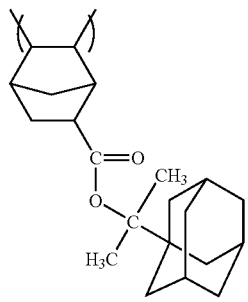
(B-21)
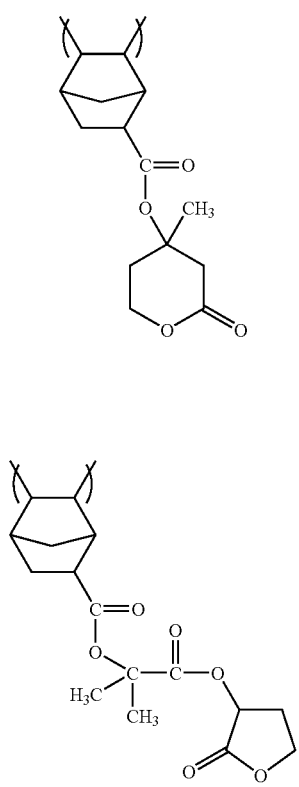
(B-22)
(B-23)
(B-24)
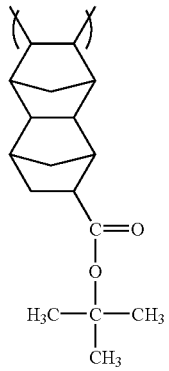
(B-25)
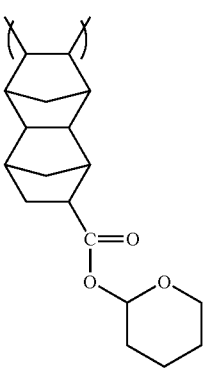
(B-26)
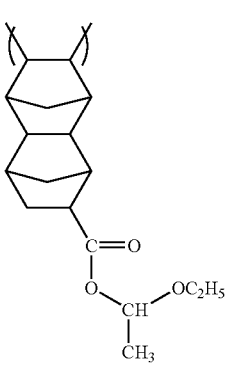
(B-27)
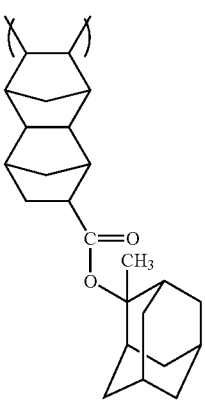
(B-28)

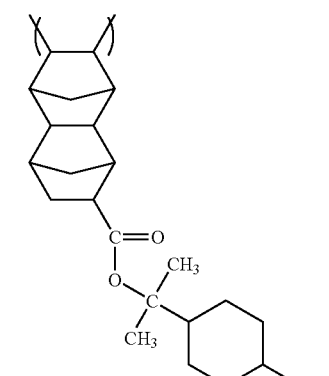
(B-29)
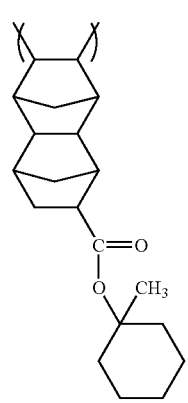
(B-30)
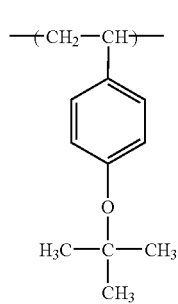
(B-31)
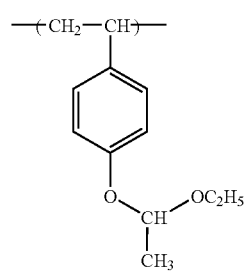
(B-32)
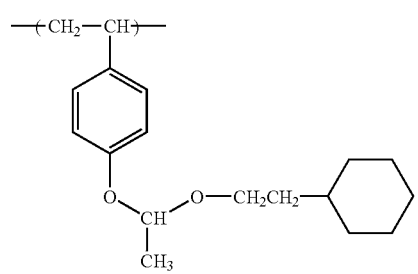
(B-33)
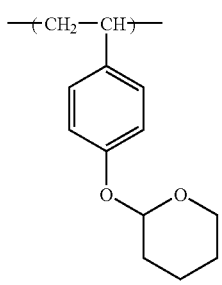
(B-34)
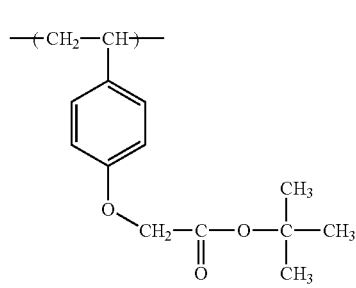
(B-35)
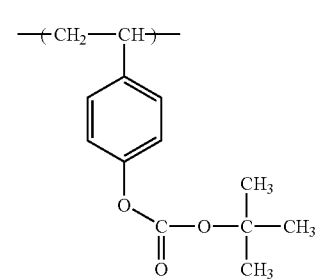
(B-36)
Examples of repeating units represented by formulae (XVI) to (XVII), respectively, are illustrated below, but the invention should not be construed as being limited to these examples.
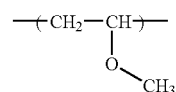
(C-1)
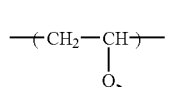
(C-2)
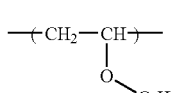
(C-3)
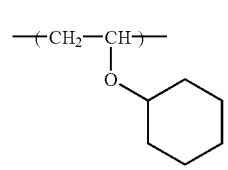
(C-4)

-continued
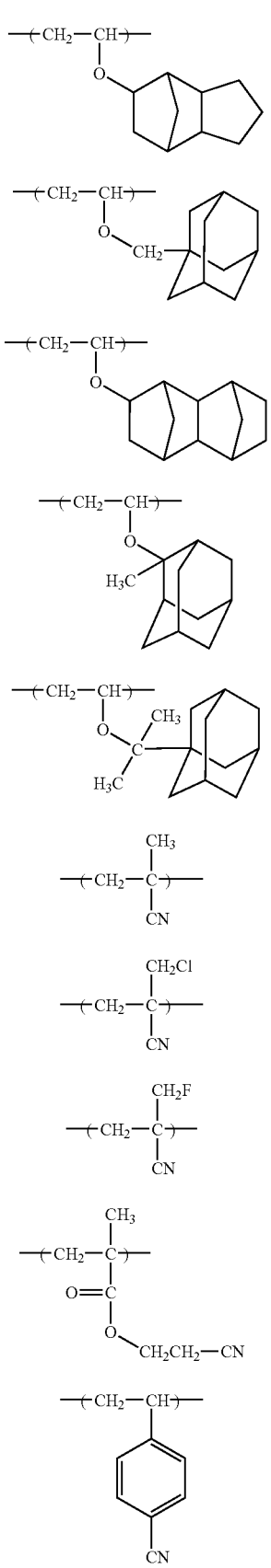
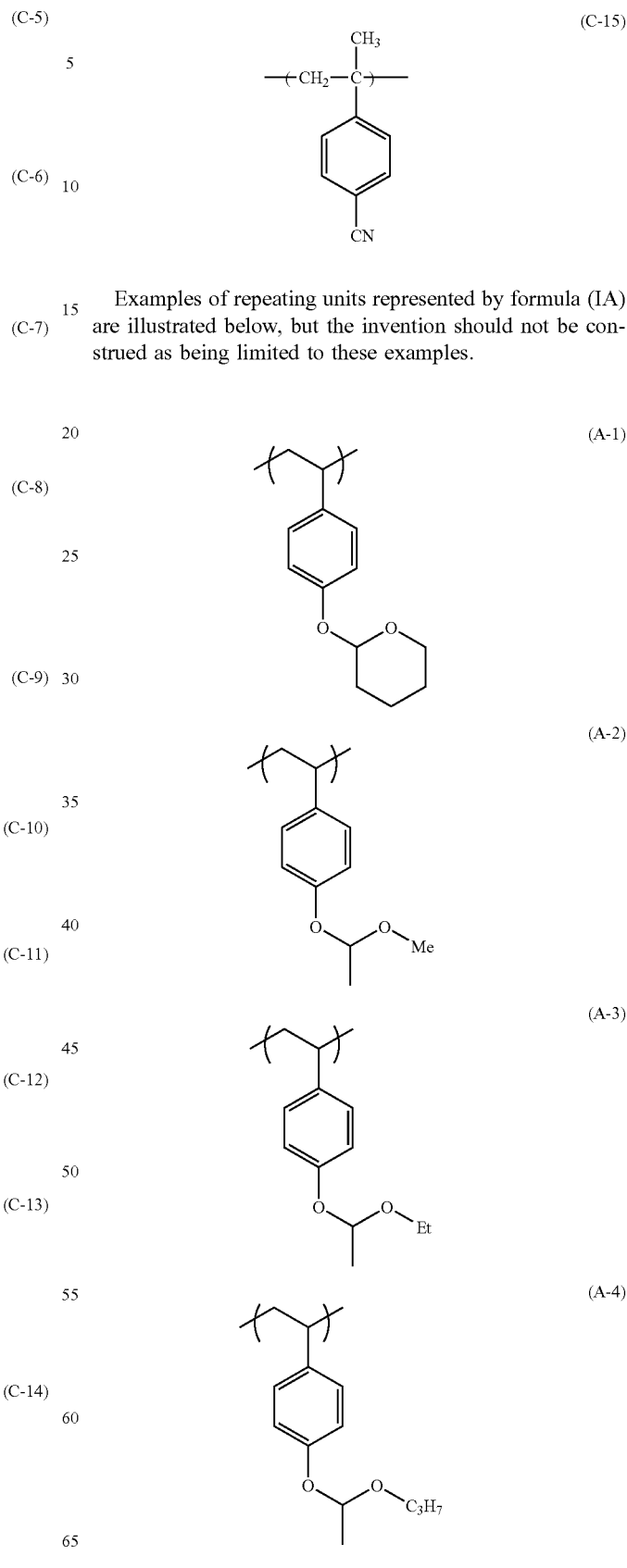
Examples of repeating units represented by formula (IA) are illustrated below, but the invention should not be construed as being limited to these examples.

-continued
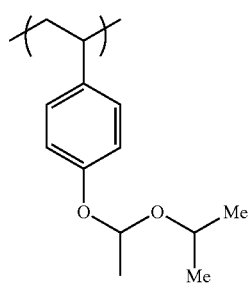 (A-5)
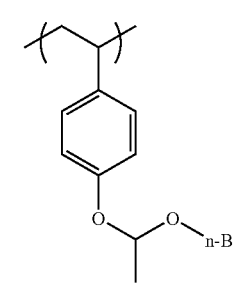 (A-6)
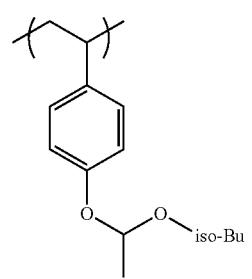 (A-7)
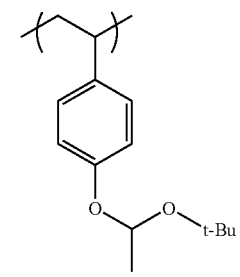 (A-8)
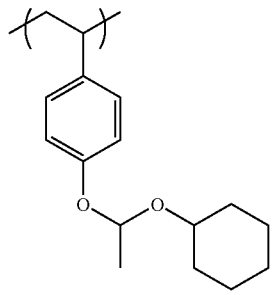 (A-9)
-continued
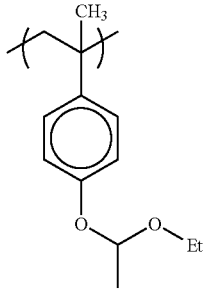 (A-3′)
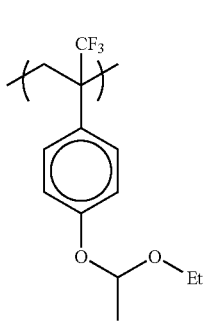 (A-3″)
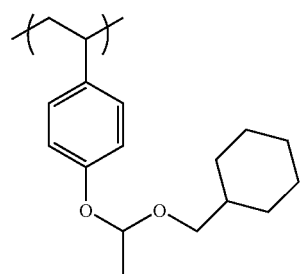 (A-10)
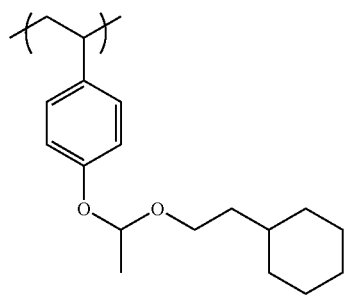 (A-11)
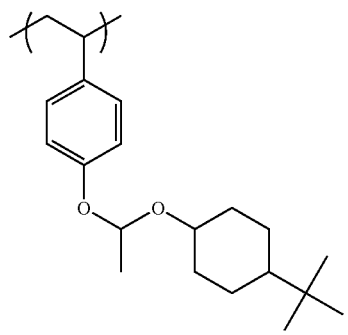 (A-12)

-continued

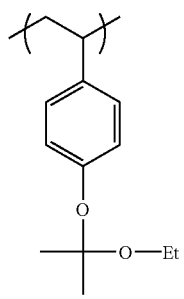
(A-24)
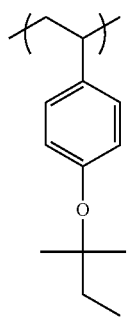
(A-25)
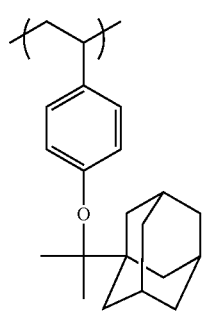
(A-26)
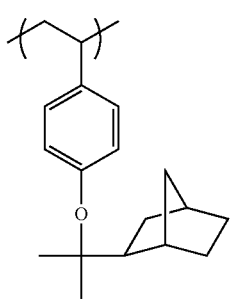
(A-27)
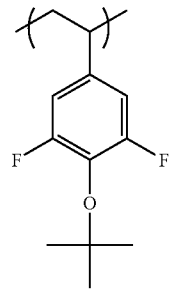
(A-28)
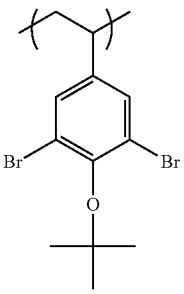
(A-29)
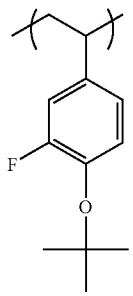
(A-30)
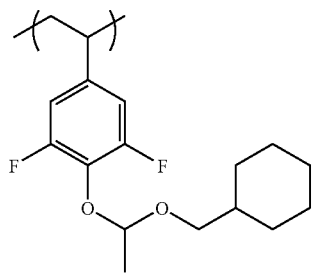
(A-31)
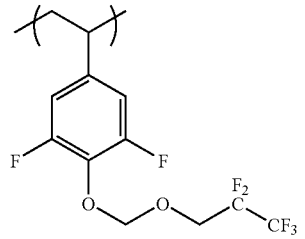
(A-32)
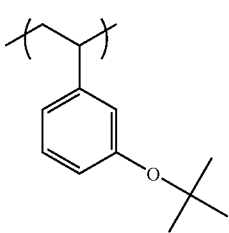
(A-33)

(A-34) 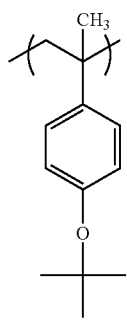
(A-35) 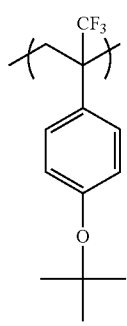
(A-36) 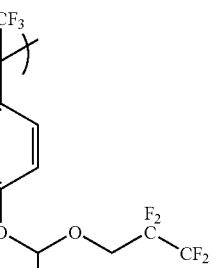
(A-37) 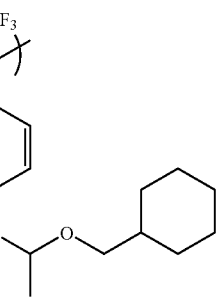
(A-38) 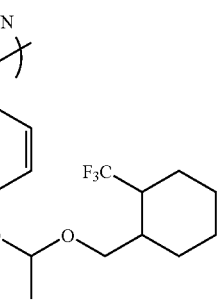
Examples of repeating units represented by formula (IIA) are illustrated below, but the invention should not be construed as being limited to these examples.
(IIa-1) 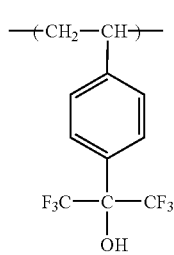
(IIa-2) 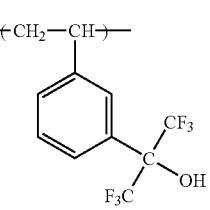
(IIa-3) 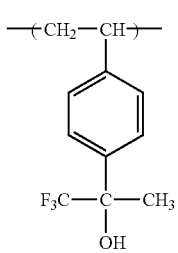
(IIa-4) 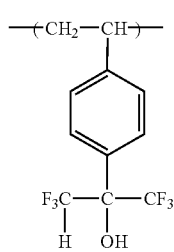
(IIa-5) 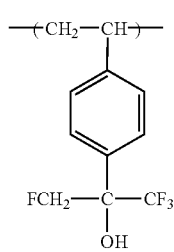
(IIa-6) 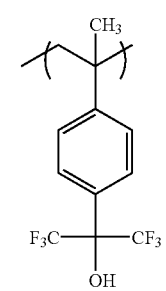

(IIa-7) 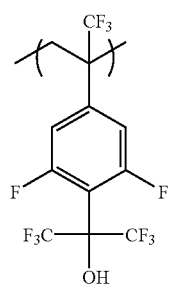
(IIa-8) 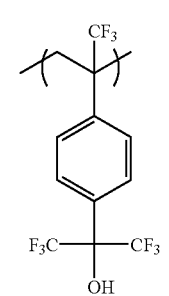
Further, the repeating units (F-40) to (F-45) exemplified hereinbefore can be recited as examples of repeating units represented by formula (IIA).
Examples of repeating units represented by formula (VIA) are illustrated below, but these examples should not be construed as limiting the scope of the invention.
(B-1) 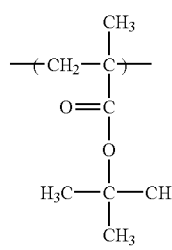
(B-2) 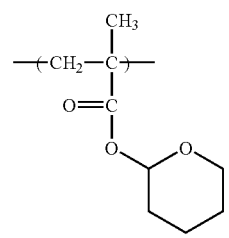
(B-3) 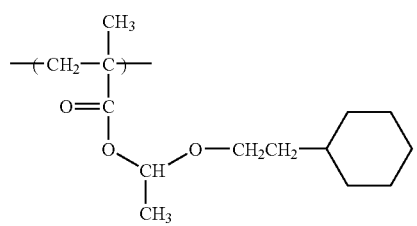
(B-4) 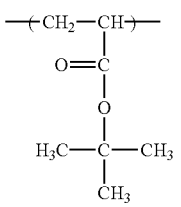
(B-5) 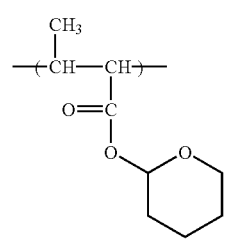
(B-6) 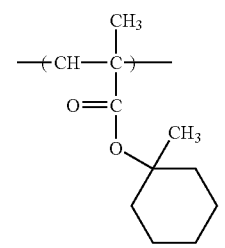
(B-7) 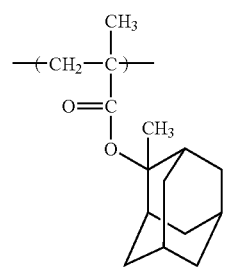
(B-8) 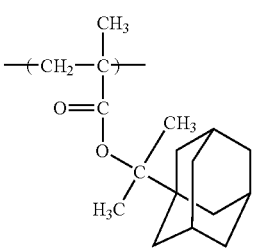
(B-9) 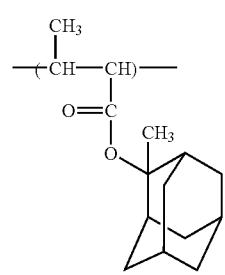

-continued
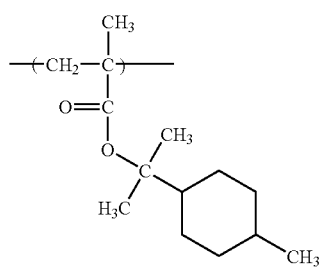
(B-10)
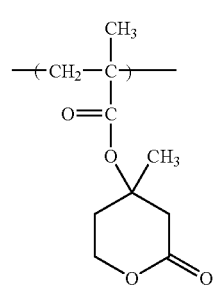
(B-11)
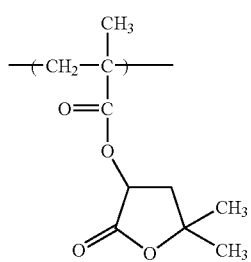
(B-12)
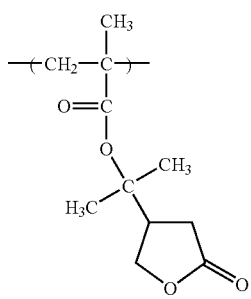
(B-13)
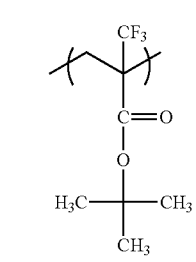
(B-1')
-continued
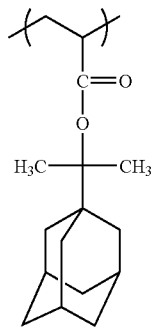
(B-8')
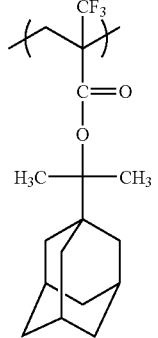
(B-8'')
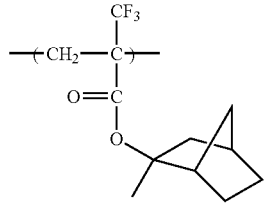
(B-12')
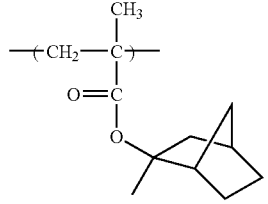
(B-12'')
Further, the repeating units (F-29) to (F-38) and (F-47) to (F-54) exemplified hereinbefore can be recited as examples of repeating units represented by formula (VIA). Examples of repeating units represented by formula (IIIA) are illustrated below, but these examples should not be construed as limiting the scope of the invention.
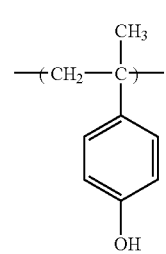
(III-1)

-continued

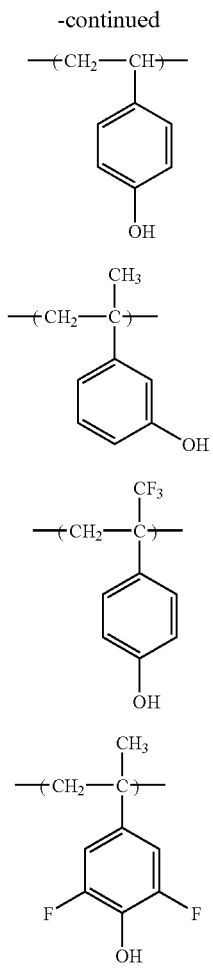

(III-2)
(III-3)
(III-4)
(III-5)

Examples of repeating units represented by formula (VIIA) are illustrated below, but these examples should not be construed as limiting the scope of the invention.

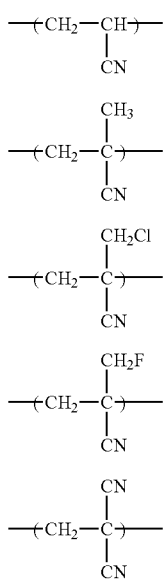

(VII-1)
(VII-2)
(VII-3)
(VII-4)
(VII-5)

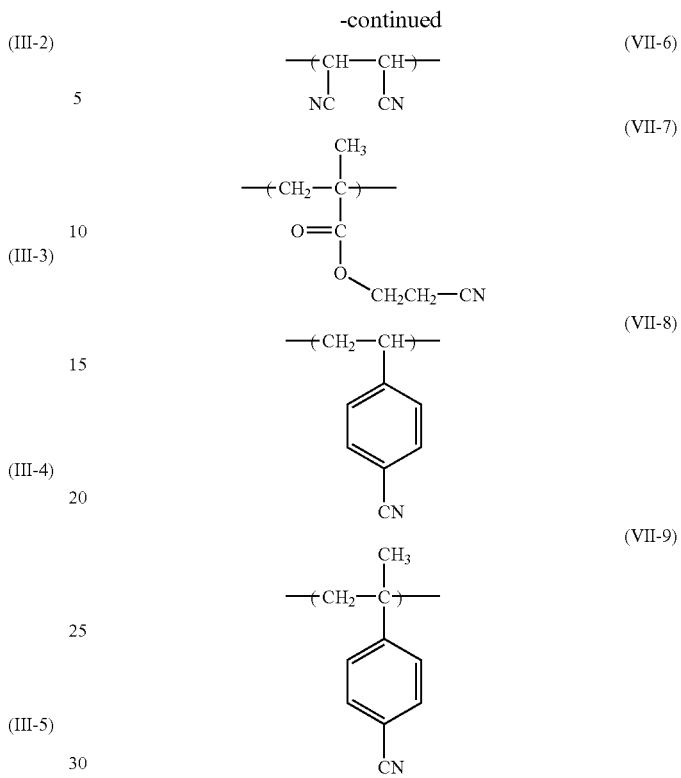

(VII-6)
(VII-7)
(VII-8)
(VII-9)

The acid-decomposable Resin (B) used in the invention can be synthesized by a conventional method (e.g., a radical polymerization method). In a usual synthesis method, for instance, monomer species are placed in a reaction vessel collectively or intermittently, dissolved and homogenized, if needed, in a solvent, e.g., an ether such as tetrahydrofuran, 1,4-dioxane or diisopropyl ether, a ketone such as methyl ethyl ketone or methyl isobutyl ketone, an ester solvent such as ethyl acetate, or a solvent capable of dissolving the present composition, such as propylene glycol monomethyl ether acetate, which is mentioned later, and then the polymerization thereof is initiated by use of a commercially available radical initiator (e.g., an initiator of azo type, peroxide) in an atmosphere of inert gas such as nitrogen or argon and, if needed, under heating. The additional initiator is added by the lump or in several portions, if required. At the conclusion of the reaction, the reaction mixture is poured into a solvent, and the intended polymer is recovered therefrom by a powder or solid recovery method.

The concentration of the reaction solution is at least 20 weight %, preferably at least 30 weight %, particularly preferably at least 40 weight %. The reaction temperature is from 10° C. to 150° C., preferably from 30° C. to 120° C., particularly preferably from 50° C. to 100° C.

The Resin (B) used in the invention may be made up of repeating units of only one kind or two or more kinds selected from those illustrated above as examples.

As the Resin (B) of the invention, one kind of resin or two or more kinds of resins may be used.

The resins relating to the present Resin (B) have weight average molecular weight of 1,000 to 200,000, preferably 3,000 to 20,000, as measured by GPC and calculated in terms of polystyrene. It is not much desirable for those resins to have weight average molecular weight lower than 1,000, because deterioration of thermal resistance and dry etching resistance is observed in the resultant resist. When the resins have weight average molecular weight higher than 200,000, they are responsible for not very good results including lowering of developability and deterioration in film formability due to its too high viscosity.

The suitable molecular weight distribution of the resins is from 1 to 10, preferably from 1 to 5, particularly preferably from 1 to 4. The smaller molecular weight distribution enables the higher resolution, the better resist profile, the smoother side wall of the resist pattern and the less edge roughness.

The suitable proportion of the total resins relating to the invention, which are mixed in the present positive resist composition, are 40 to 99.99%, preferably 50 to 99.97%, of the total solid ingredients in the resist.

<<(C) Basic Compound>>

The present positive resist composition further contains (C) a basic compound. As examples of the basic compound (C), mention may be made of nitrogen-containing basic compounds.

The nitrogen-containing basic compounds include organic amines, basic ammonium salts and basic sulfonium salts, provided that they cause no deterioration in sublimation and resist performance.

Of these nitrogen-containing basic compounds, organic amines are preferred over the others, because they can ensure excellent image properties. Examples of such organic amines include the basic compounds disclosed in Japanese Patent Laid-Open Nos. 149640/1988, 249662/1993, 127369/1993, 289322/1993, 249683/1993, 289340/1993, 232706/1993, 257282/1993, 242605/1994242606/1994, 266100/1994, 266110/1994, 317902/1994, 120929/1995, 146558/1995, 319163/1995, 508840/1995, 333844/1995, 219217/1995, 92678/1995, 28247/1995, 22120/1996, 110638/1996, 123030/1996, 274312/1997, 166871/1997, 292708/1997 and 325496/1997, International Patent Publication No. 508840/1995, and U.S. Pat. Nos. 5,525,453, 5,629,134 and 5,667,938.

Those basic compounds have any of the following structural formulae (A) to (E).

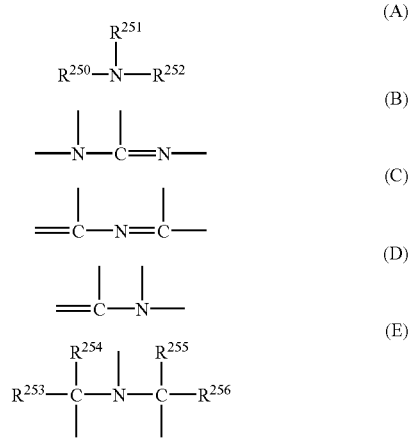

Therein, $R^{250}$, $R^{251}$ and $R^{252}$ independently represent a hydrogen atom, a 1-20C alkyl group, a 1-20C aminoalkyl group, a 1-20C hydroxyalkyl group, or a substituted or unsubstituted 6-20C aryl group. Further, $R^{250}$ and $R^{251}$ may combine with each other to form a ring.

$R^{253}$, $R^{254}$, $R^{255}$ and $R^{256}$ may be the same or different, and they each represent a 1-10C alkyl group.

More appropriate compounds are nitrogen-containing basic compounds which each have at least two nitrogen atoms of different chemical environments, or aliphatic tertiary amines.

Examples of nitrogen-containing basic compounds include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, tri-1-octylamine, tris(ethylhexyl)amine, and tridecylamine.

Of these compounds, organic amines including 1,5-diazabicyclo[4.3.0]-5-nonene, 1,8-diazabicyclo[5.4.0]-7-undecene, 1,4-diazabicyclo-[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, 4,4'-diaminodiphenyl ether, triethylamine, tributylamine, tripentylamine, tri-n-octylamine, tris(ethylhexyl)amine, tridecylamine, N,N-dihydroxyethylamine and N-hydroxyethyl-N-ethylaniline are preferred in particular.

These basic compounds are used alone or as mixtures of two or more thereof. The basic Compound (C) is used in a proportion of generally 0.001 to 10 weight %, preferably 0.01 to 5 weight %, based on solids in the positive resist composition. When the proportion is smaller than 0.001 weight %, the basic compound added can produce no appreciable effect. When the proportion is greater than 10 weight %, on the other hand, there is a tendency to cause deterioration in sensitivity and developability of unexposed areas.

<<(D) Compound Having at Least Three Hydroxyl or Substituted Hydroxyl Groups and at Least One Cyclic Structure>>

The present positive resist composition further contains a compound having at least 3 hydroxyl or substituted hydroxyl groups and at least one cyclic structure.

The expression "compound having at least 3 hydroxyl or substituted hydroxyl groups and at least one cyclic structure" used herein means that the cyclic structure, such as an alicyclic group, may be contained in either main skeleton or side chain of the compound. In this meaning, however, cyclic structures capable of forming cyclic ketal structures represented by the following formula are not included:

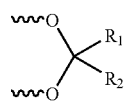

Suitable examples of such cyclic structures include 5- and 6-membered rings, such as a cyclohexane ring, a cyclopentane ring, and ethereal oxygen-containing tetrahydrofuran and tetrahydropyran rings.

The term "substituted hydroxyl group" used herein is intended to include a hydroxyl group substituted by an alkyl group, an aralkyl group, an aryl group or the like, such as an alkoxy group, an aralkyloxy group, an aryloxy group, an acid-decomposable group and an hydroxyl group substituted with an other group to form an ether structure.

The term "acid-decomposable group" used herein means a group decomposing under action of acids, with examples including acetal, ketal, t-butoxycarbonyl group and t-butyl ester group.

In addition, the acid-decomposable group may be formed by combining two hydroxyl groups, as shown below:

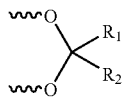

wherein $R_1$ and $R_2$ independently represent an alkyl, aralkyl or aryl group, or they may be combined with each other to form a ring.

It is appropriate that two or more of those acid-decomposable groups be present in one molecule, and it is preferable for at least one of them to have the following structure:

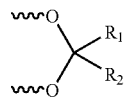

The present compound of Component (D) is required to have at least three hydroxyl or substituted hydroxyl groups. The number of hydroxyl or substituted hydroxyl groups contained therein is preferably from 3 to 10, particularly preferably from 4 to 8.

Although the present compound of Component (D) may be any of the compounds meeting the foregoing requirements, cyclic saccharide derivatives having the structures as illustrated below are preferred.

Examples of skeletons of cyclic saccharide derivatives include arabinose, xylose, fucose, rhamnose, galactose, glucose, fructose, fructopyranose, sorbose, mannose, allopyranose, altrose, talose, tagatose, arabinopyranoside, thiogalactopyranoside, mannopyranoside, glucopyranose, glucopyranoside, mannitol, sucrose, palatinose, lactitol, lactose, maltulose, maltose, maltoside, maltitol, cellobiose, turanose, trehalose, melibiose, maltotriose, melezitose, raffinose, stachyose, maltotetraose, maltohexaose, and cyclodextrin.

Examples of cyclic saccharide derivatives suitable as Component (D) are illustrated below, but the invention should not be construed as being limited to these examples.

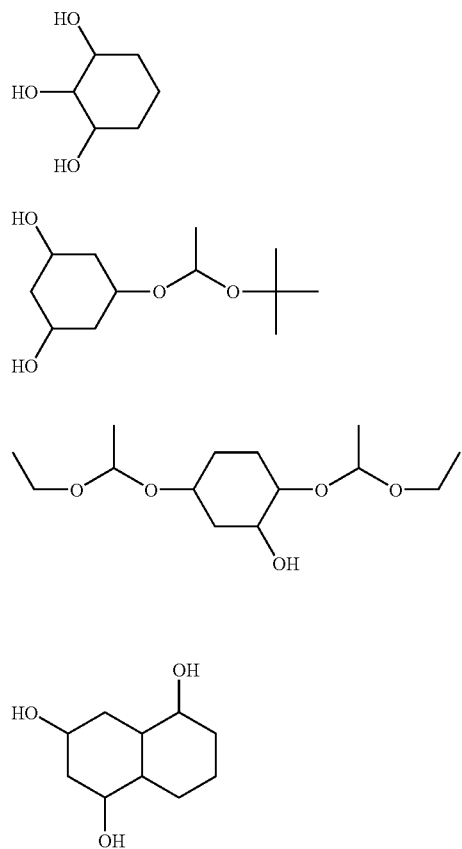

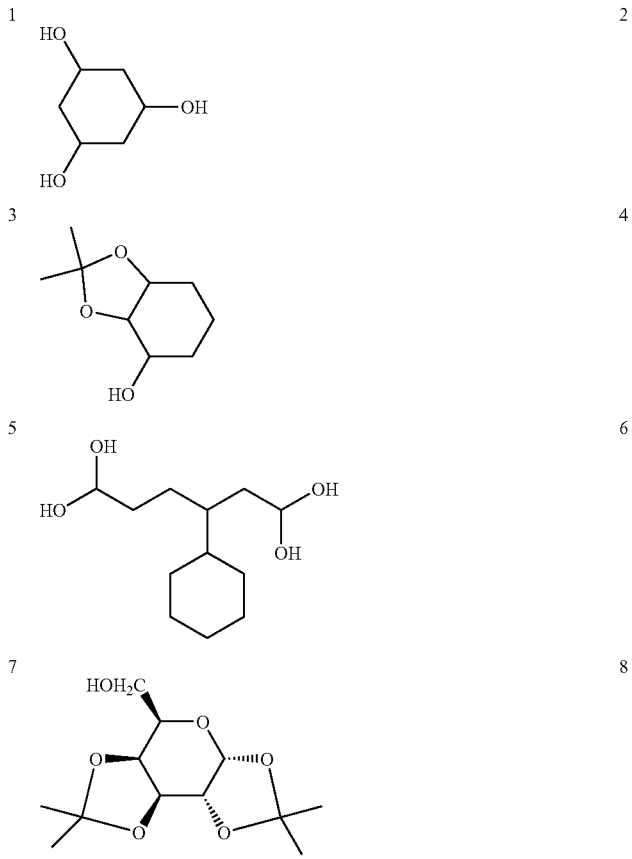

-continued
9
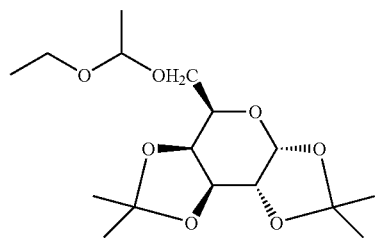
10
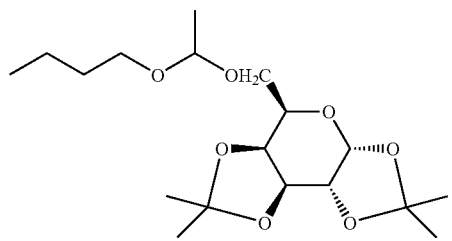
11
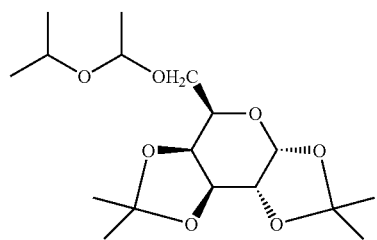
12
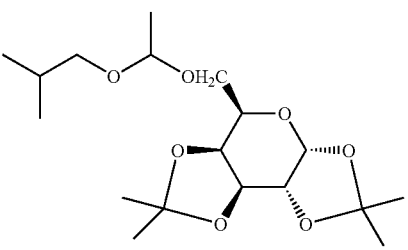
13
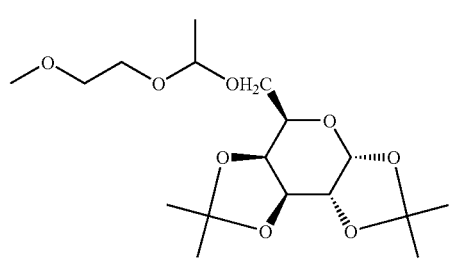
14
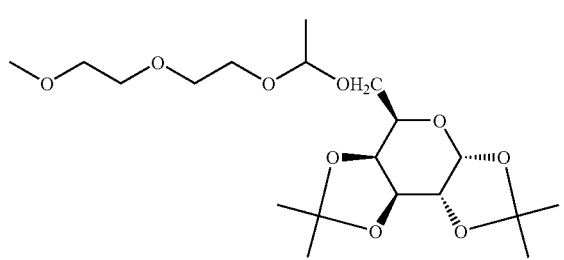
15
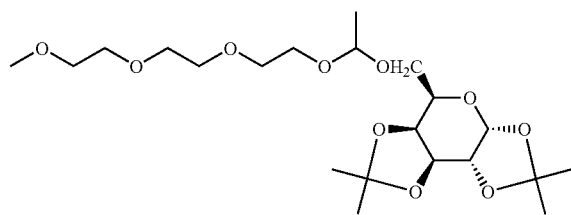
16
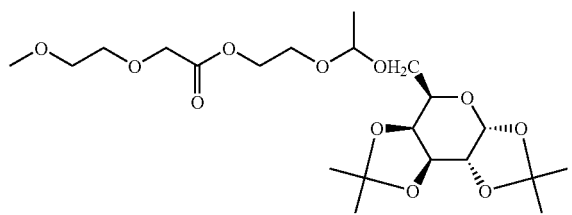
17
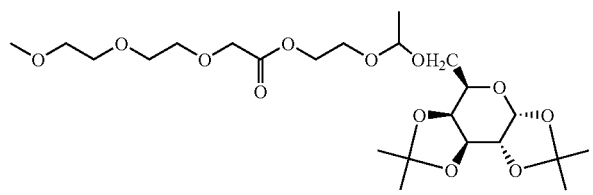
18
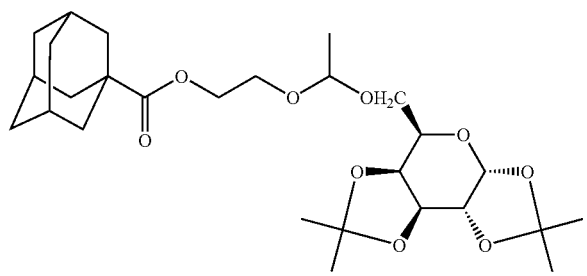
19
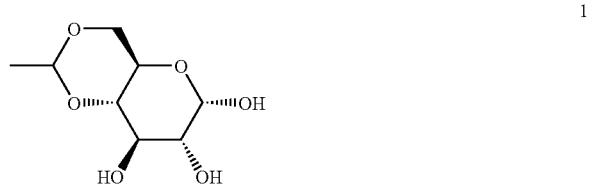
20
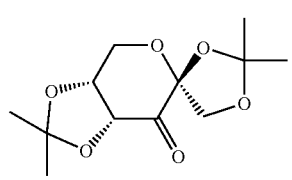

-continued
| | |
|---|---|
| 21 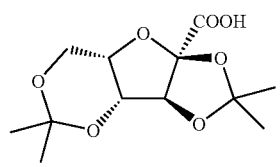 | 22 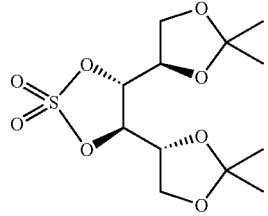 |
| 23 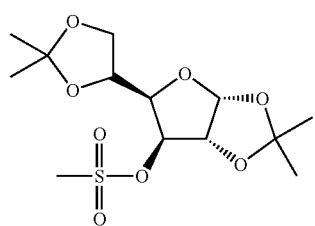 | 24 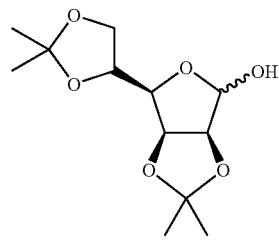 |
| 25 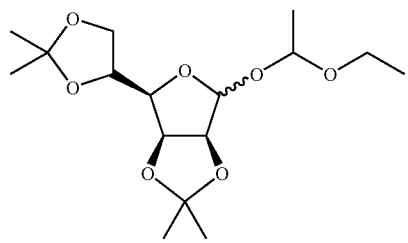 | 26 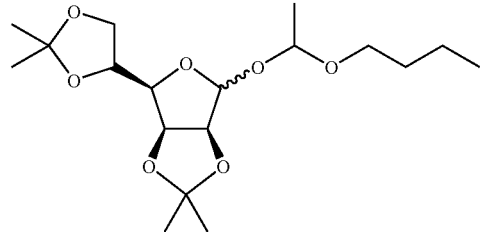 |
| 27 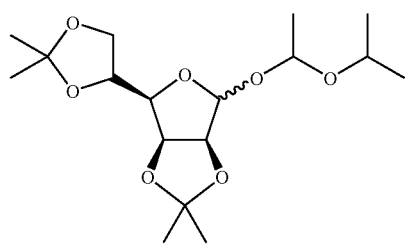 | 28 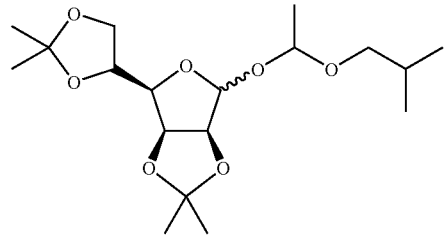 |
| 29 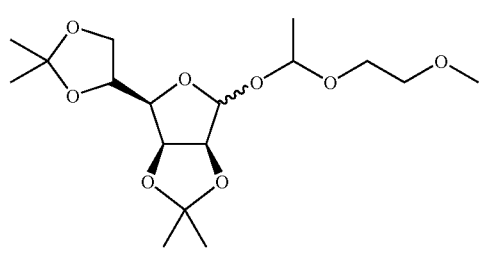 | 30 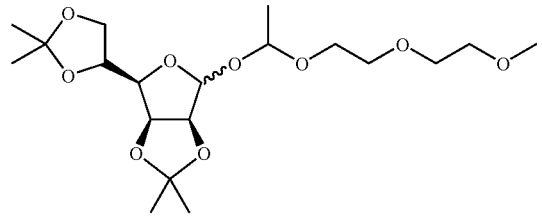 |
| 31 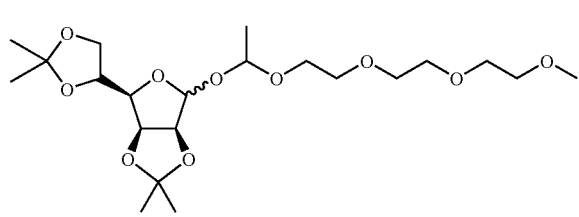 | 32 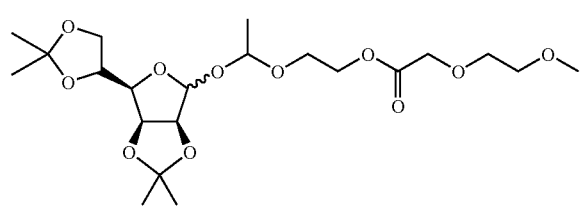 |

33
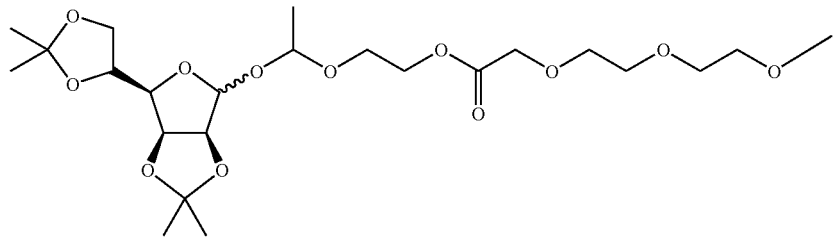
34
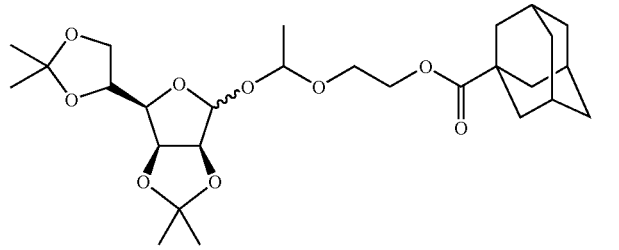
35
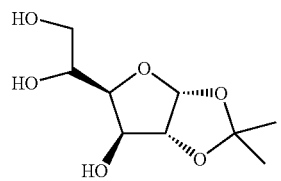
36
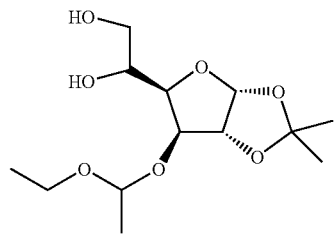
37
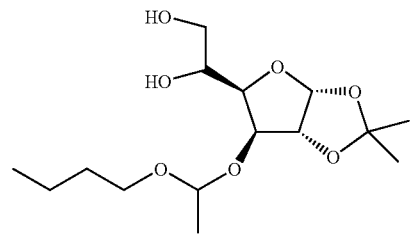
38
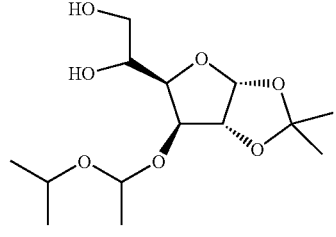
39
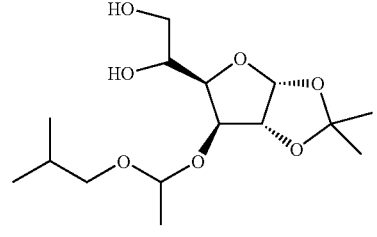
40
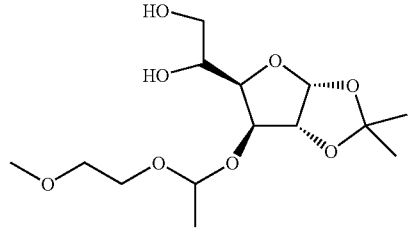
41
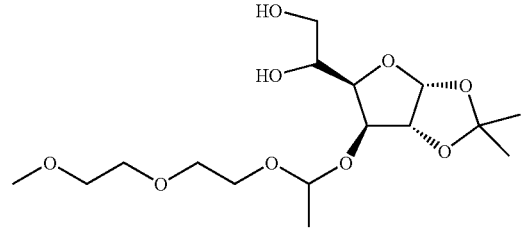
42
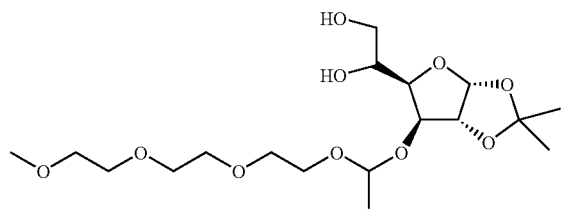
43
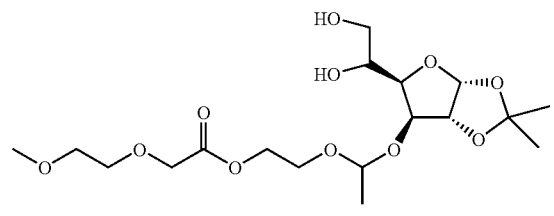

-continued
44
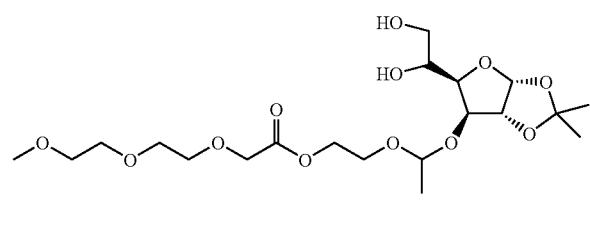
45
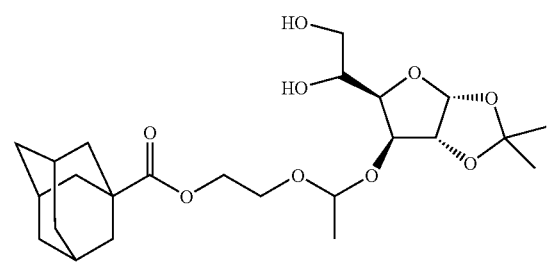
46
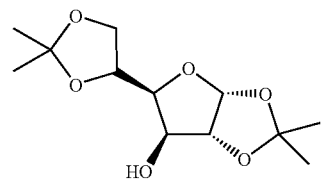
47
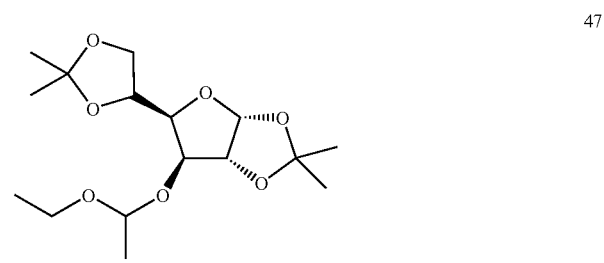
48
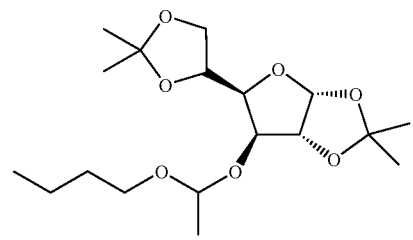
49
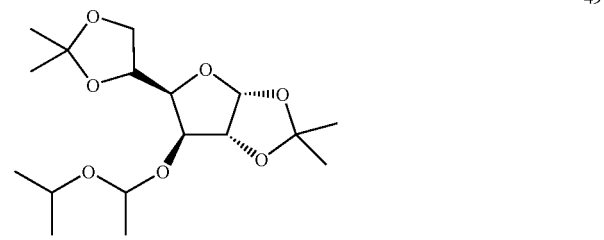
50
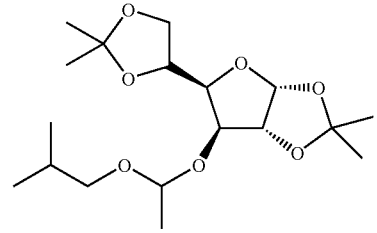
51
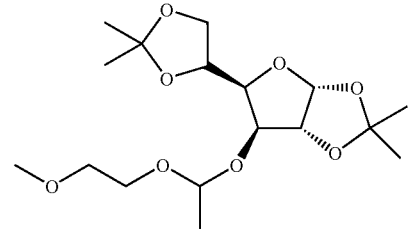
52
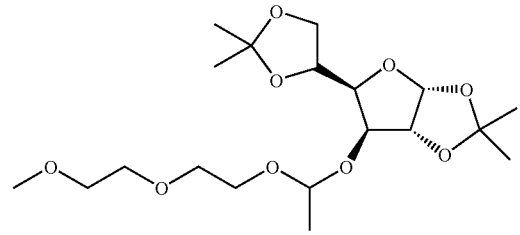
53
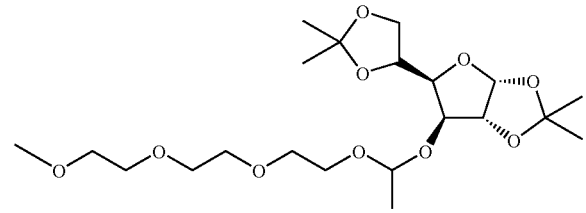
54
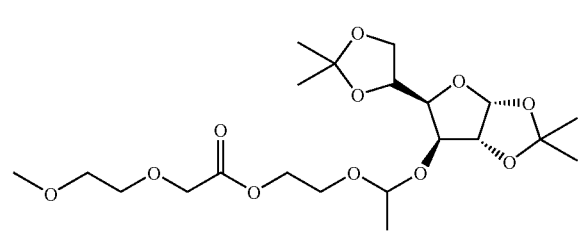
55
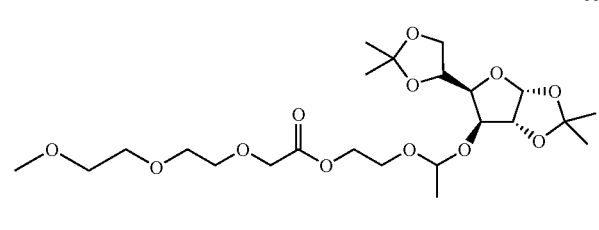

-continued
56
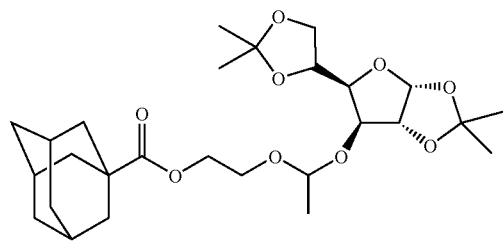
57
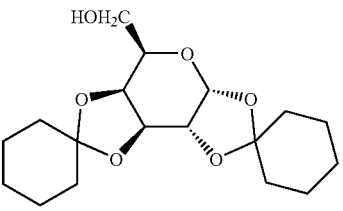
58
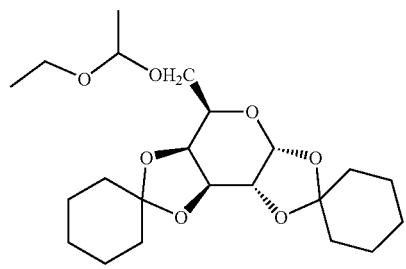
59
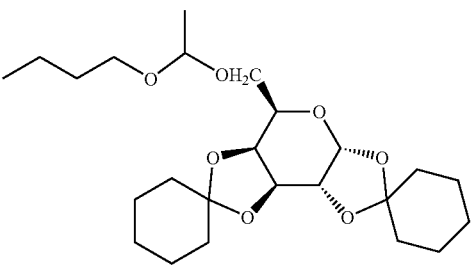
60
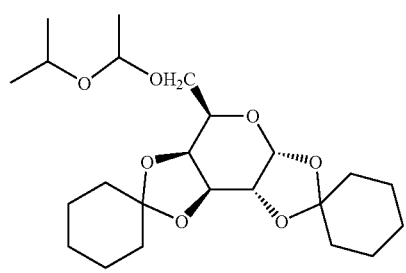
61
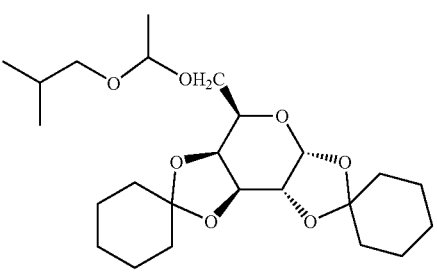
62
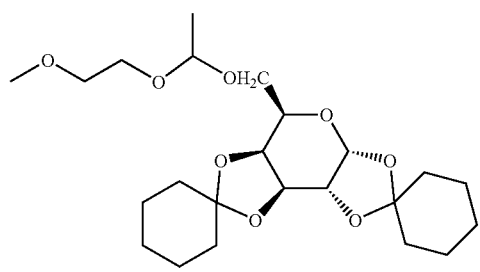
63
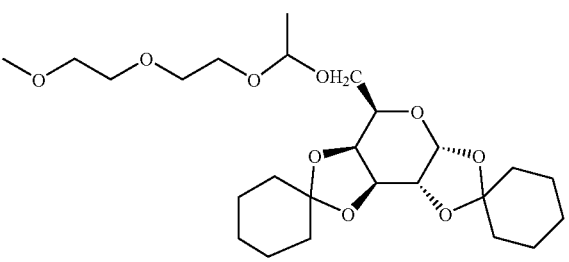
64
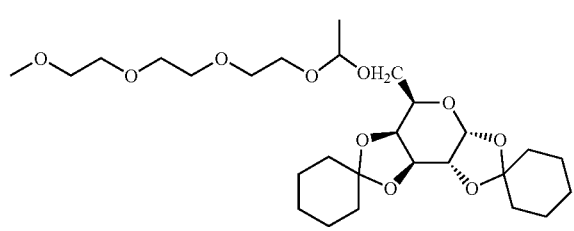
65
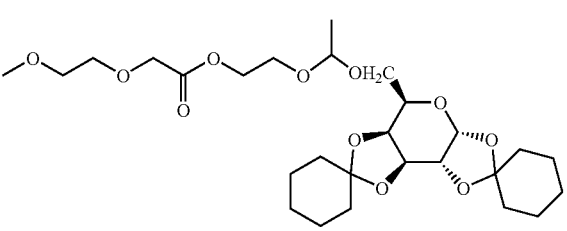
66

-continued
67
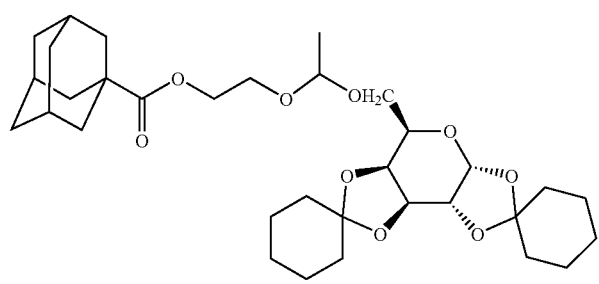
68
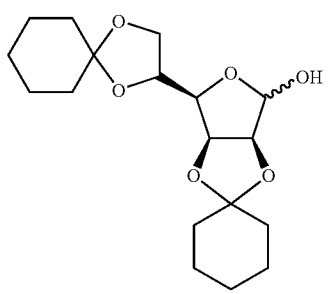
69
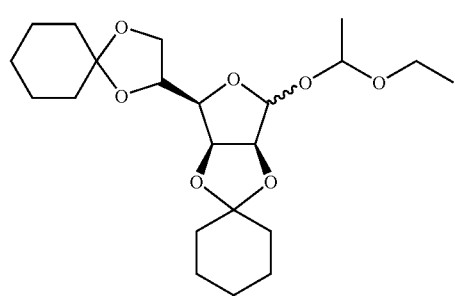
70
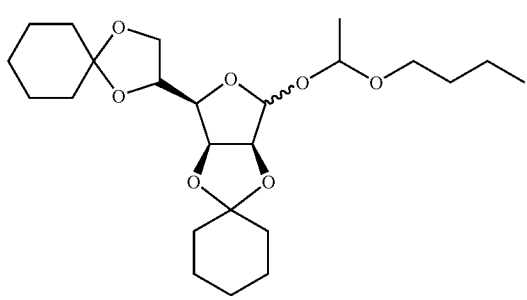
71
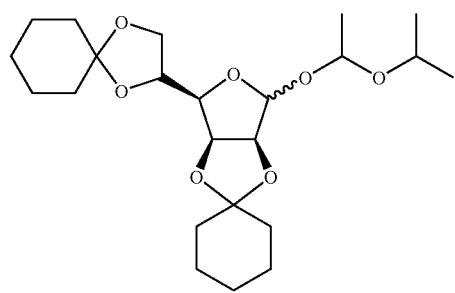
72
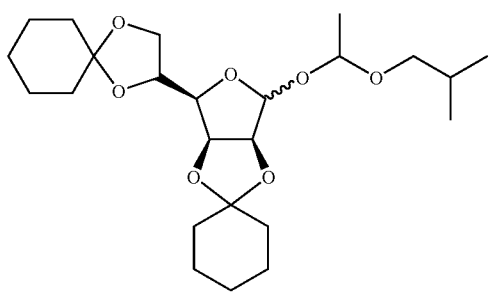
73
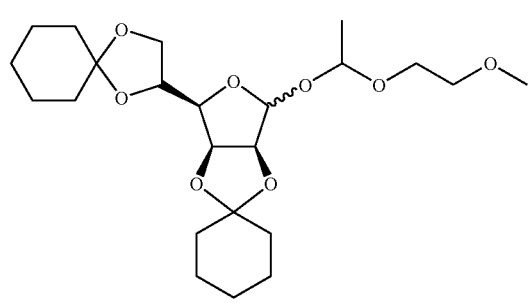
74
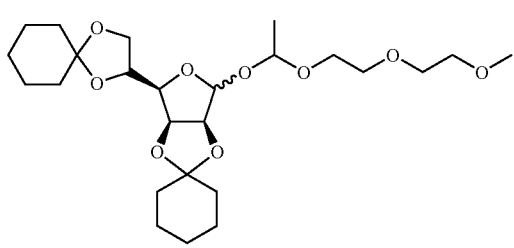
75
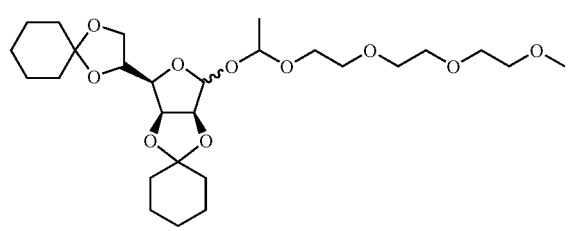
76
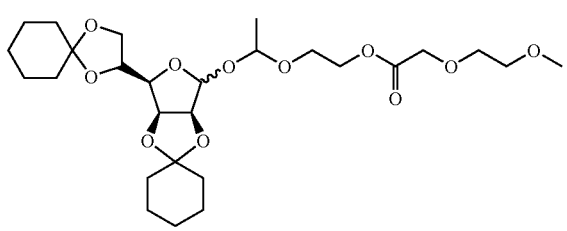

-continued
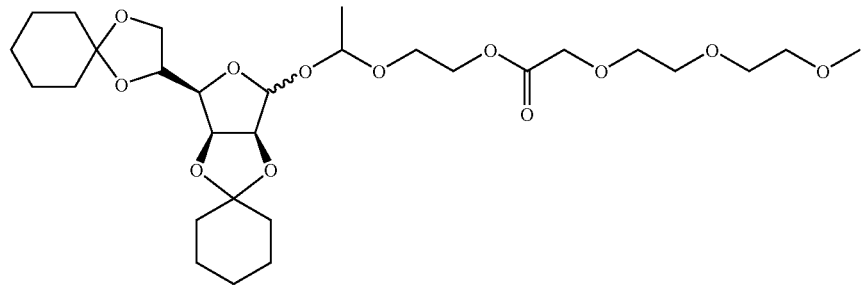
77
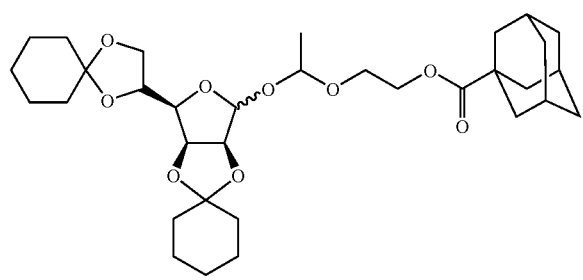
78
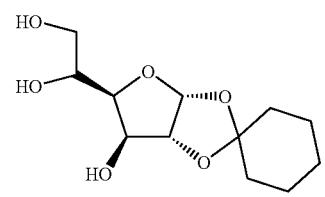
79
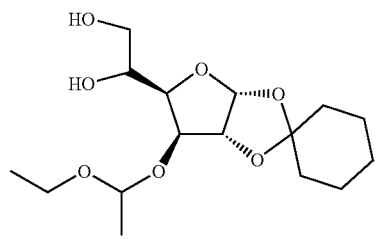
80
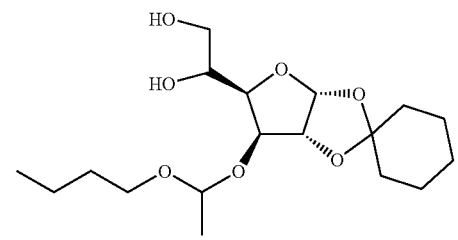
81
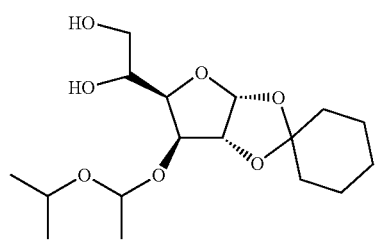
82
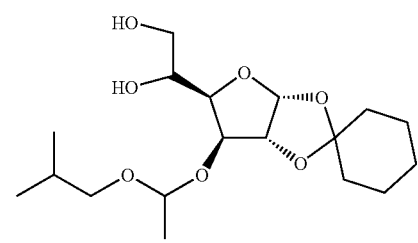
83
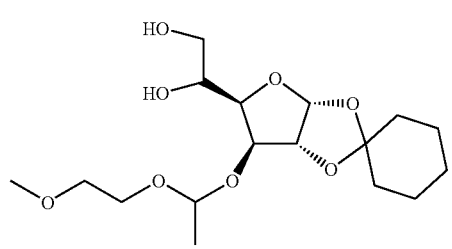
84
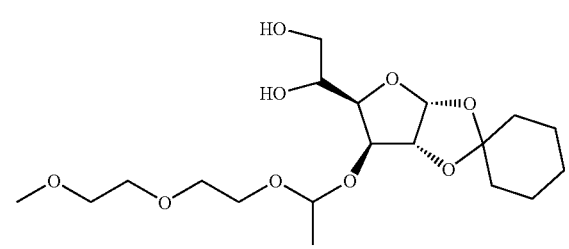
85
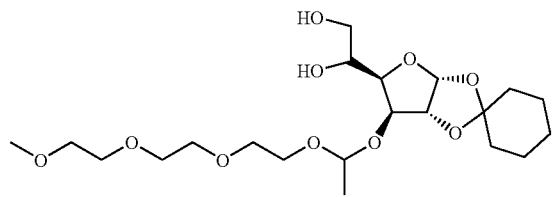
86
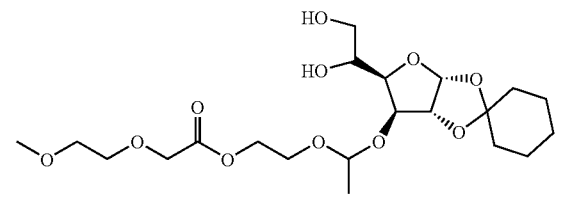
87

-continued
88
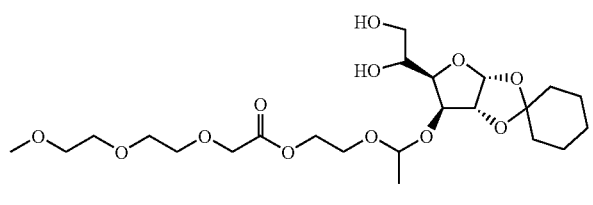
89
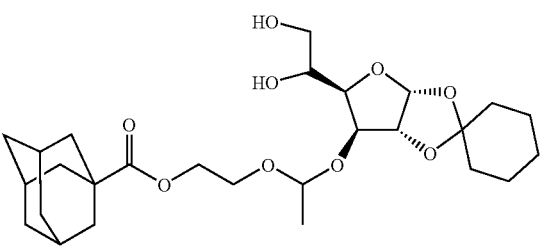
90
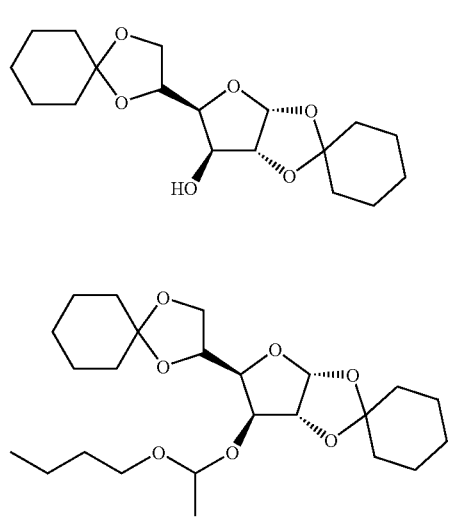
91
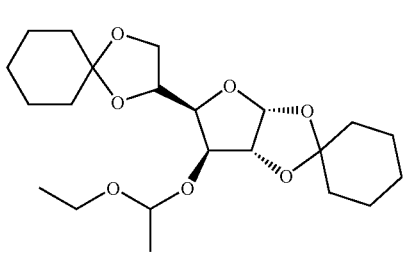
92
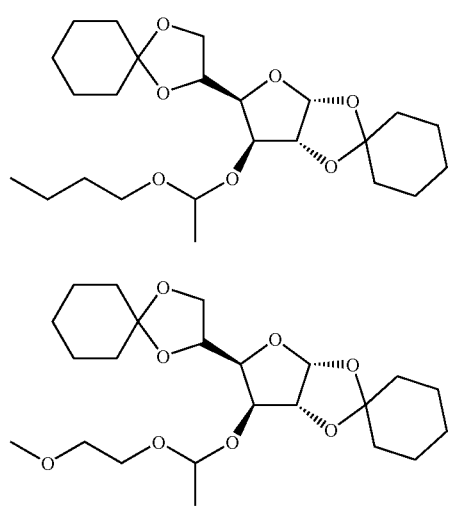
93
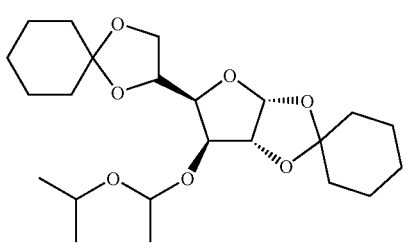
94
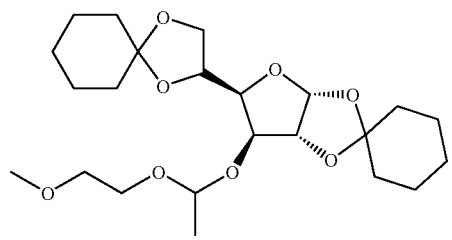
95
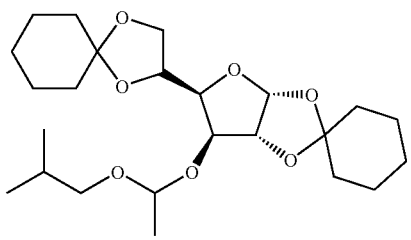
96
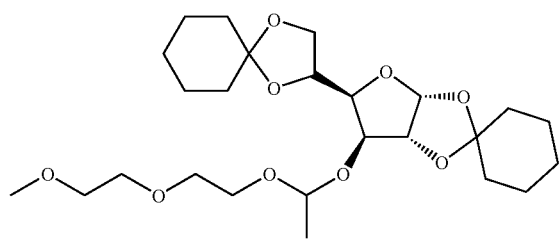
97
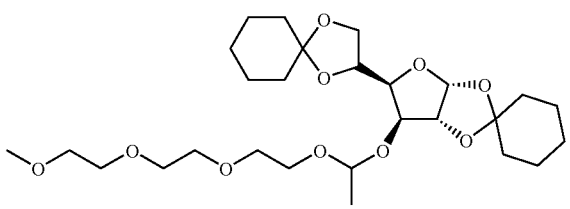
98
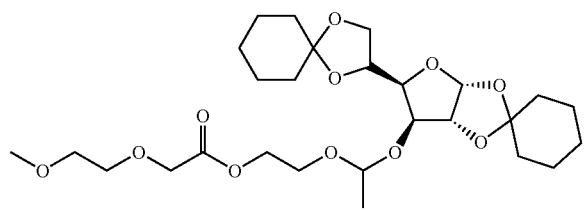

-continued
99
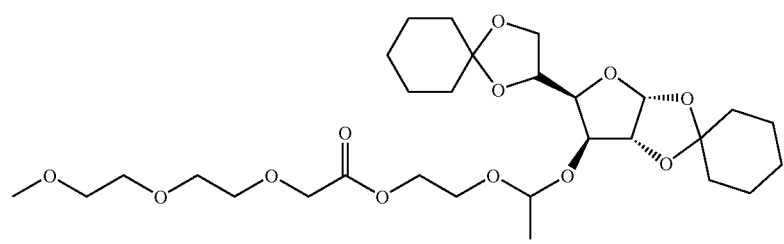
100
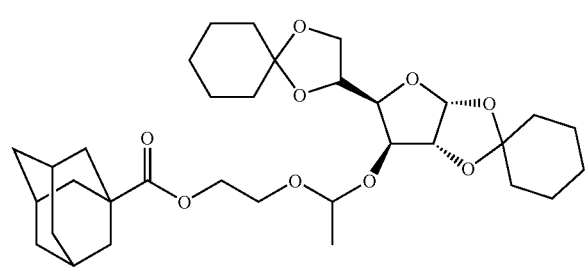
74
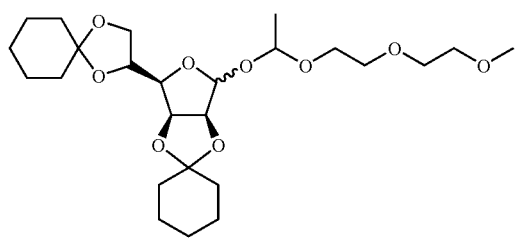
75
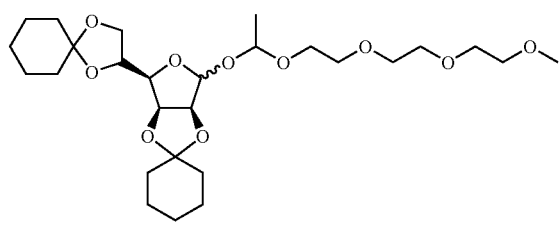
76
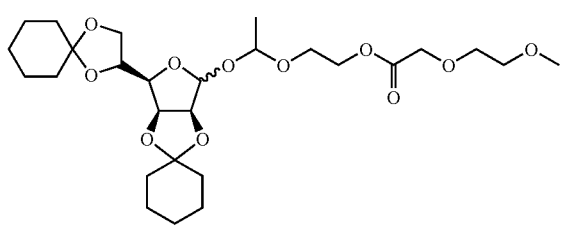
77
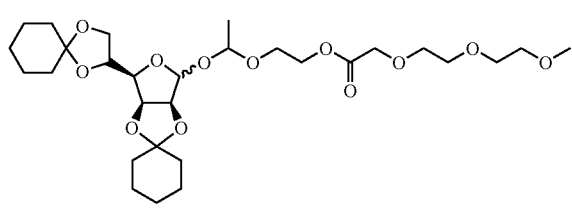

-continued
78
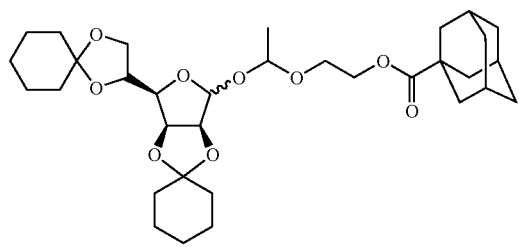
79
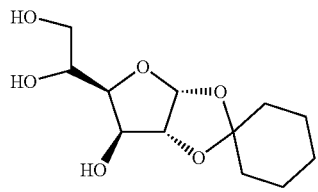
80
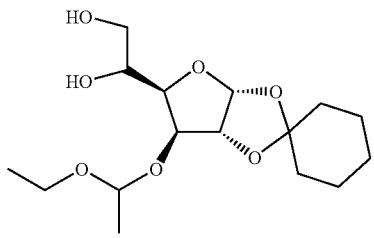
81
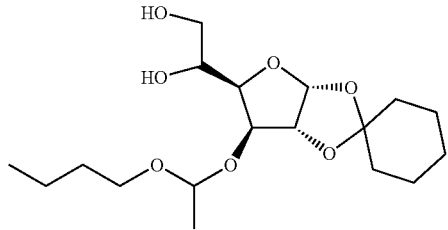
82
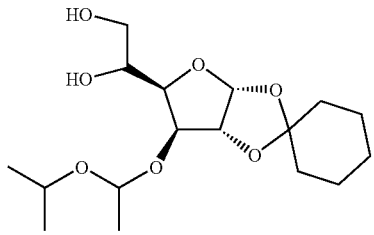
83
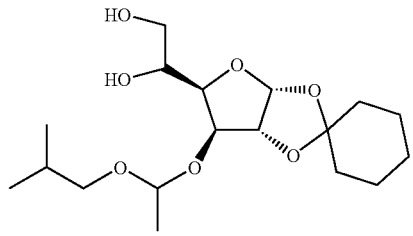

84
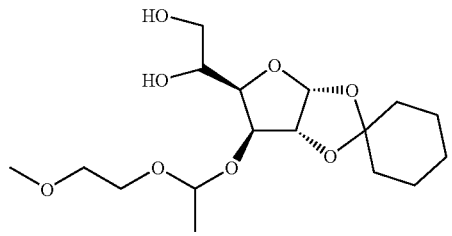
85
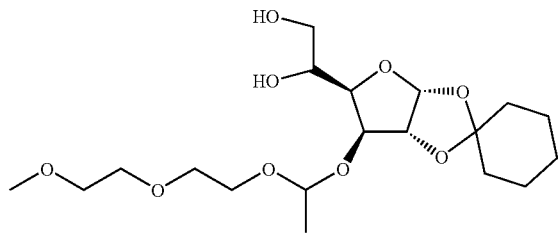
86
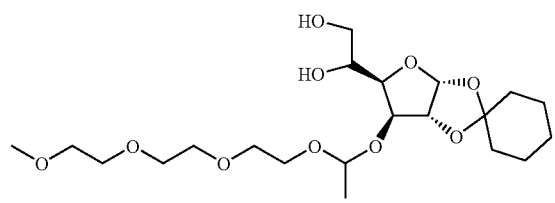
87
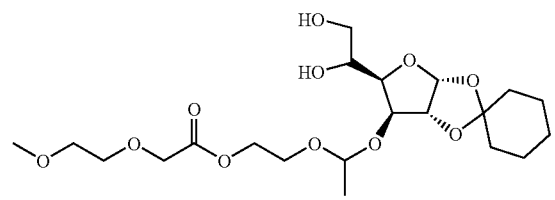
88
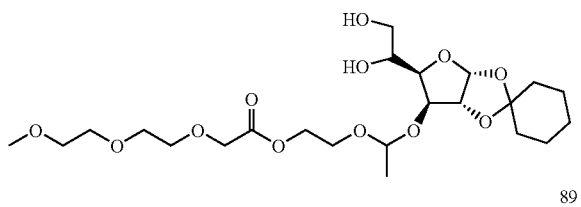
89
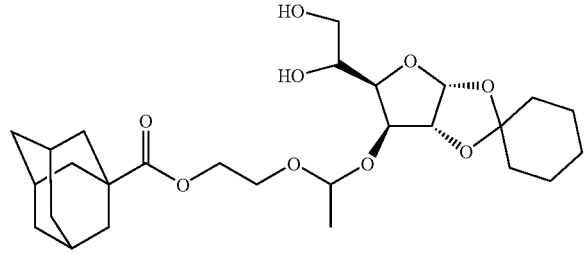
90
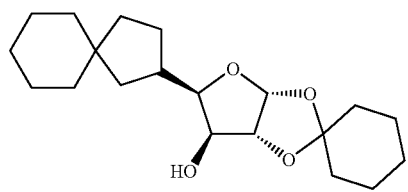

-continued
91
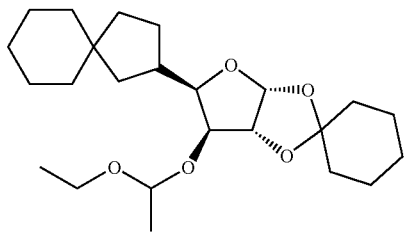
92
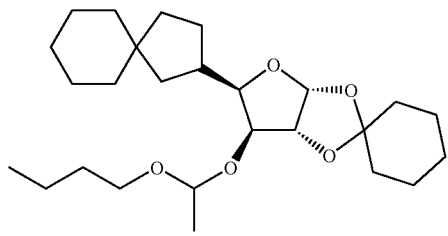
93
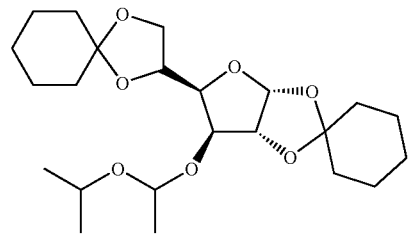
94
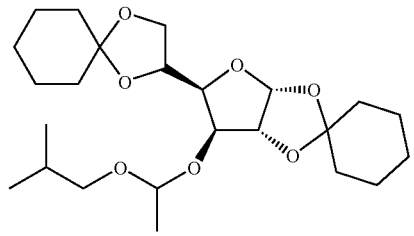
95
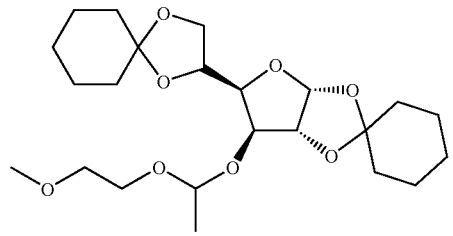
96
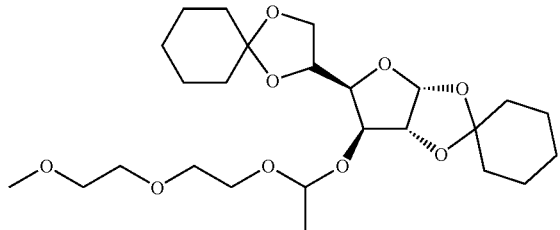

-continued

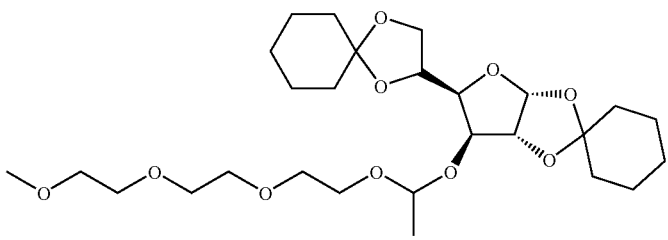
97

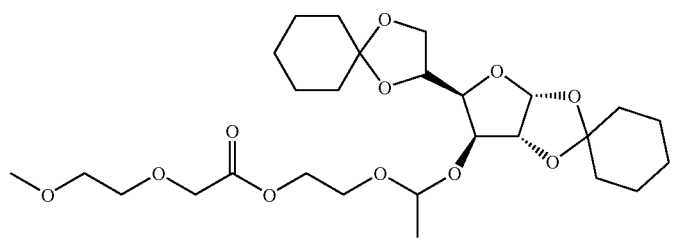
98

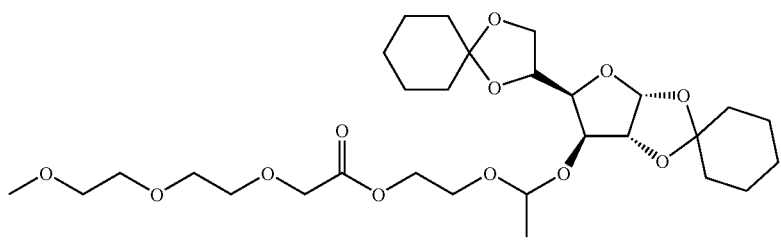
99

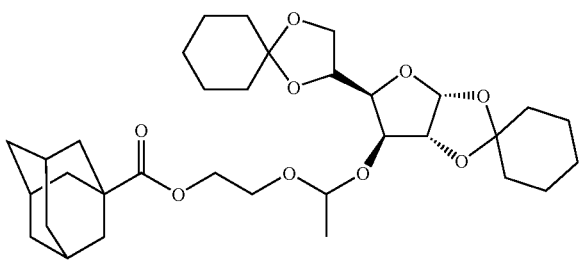
100

The compound having at least three hydroxyl or substituted hydroxyl groups and at least one cyclic structure(D) is used in a proportion of preferably 0.1 to 20 weight % based on solids in the positive resist composition.

<<(E) Surfactant Containing Fluorine and/or Silicon Atoms>>

The present positive resist composition is required to contain at least the components (A) to (D) described above. And it is preferable that the present composition further contain [E] a surfactant containing fluorine and/or silicon atoms, namely any of a fluorine-containing surfactant, a silicon-containing surfactant and a surfactant containing both fluorine and silicon atoms, or a combination of at least two of them.

Incorporation of the surfactant (E) in the present positive resist composition enables resist patterns having strong adhesion and reduced development defects to be formed in high sensitivity and resolution when an exposure light source of 250 nm or shorter, especially 220 nm or shorter, is used.

Examples of such a surfactant (E) include the surfactants as disclosed in Japanese Patent Laid-Open Nos. 36663/1987, 226746/1986, 226745/1986, 170950/1987, 34540/1988, 230165/1995, 62834/1996, 54432/1997 and 5988/1997, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable as fluorine- or silicone-containing ones include Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.), and Troysol S-366 (produced by Troy Chemical Industries, Inc.). Further, organosiloxane polymer KP-341 (produced by Shin-Etsu Chemical Industry Co., Ltd.) can be used as a silicon-containing surfactant.

The surfactants are mixed in a proportion of generally from 0.0001 to 2 weight %, preferably from 0.001 to 1 weight %, to the total ingredients (excepting solvents) in the present positive resist composition.

<<(F) Organic Solvent>>

The present positive resist composition is prepared by dissolving the ingredients recited above in a proper organic solvent.

Examples of an organic solvent usable therein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the invention, it is appropriate that the organic solvent used be a mixture of a solvent containing a hydroxyl group in its structure and a solvent containing no hydroxyl groups. By using such a mixed solvent, it becomes possible to reduce development of particles during storage of the resist solution.

Examples of a hydroxyl group-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are preferred in particular.

Examples of a hydroxyl group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are preferred over the others. In particular, propylene glycol monomethyl ether acetate, ethyl ethoxypropionate and 2-heptanone are advantageous.

The suitable mixing ratio (by weight) between the hydroxyl group-containing solvent and the hydroxyl group-free solvent is from 1/99 to 99/1, preferably from 10/90 to 90/10, particularly preferably from 20/80 to 60/40. The mixed solvent containing a hydroxyl group-free solvent in a proportion of at least 50 weight % is especially desirable from the viewpoint of coating uniformity.

<<(G) Alkali-Soluble Resin>>

The present positive resist composition can further contain (G) a resin insoluble in water, soluble in alkali developers and free of acid-decomposable groups, and thereby the sensitivity can be increased.

In the invention, novolak resins having molecular weight of 1,000 to 20,000 and poly(hydroxystyrene) derivatives having molecular weight of 3,000 to 50,000 can be used as those resins. However, such resins show strong light absorption in the wavelength range of 250 nm or shorter. In using these resins, therefore, it is appropriate that they be subjected to partial hydrogenation or the proportion thereof be controlled to no higher than 30 weight % of the total resins.

In addition, resins containing carboxyl groups as alkali-soluble groups can be used, too. It is preferable for the resins containing carboxyl groups to have mono- or polycyclic aliphatic hydrocarbon groups from the viewpoint of improving the dry etching resistance. Examples of such resins include a copolymer of (meth)acrylic acid and a methacrylic acid ester having an alicyclic hydrocarbon structure suffering no acidolysis and an end-carboxyl resin of (meth) acrylate of alicyclic hydrocarbon group.

<<Other Additives>>

The present positive resist composition can further contain dyes, plasticizers, surfactants other than the component (E) recited hereinbefore, photo-sensitizers, and compounds capable of promoting dissolution in developers, if needed.

The compounds usable as promoter of dissolution in developers in the invention are low molecular compounds having at least two per molecule of phenolic OH groups or at least one per molecule of carboxyl group and molecular weight of 1,000 or below. In the case of the compounds having carboxyl groups, alicyclic or aliphatic compounds are preferred for the same reason as mentioned above.

The dissolution-promoting compounds are added in a proportion of 2 to 50 weight %, preferably from 5 to 30 weight %, to the resin of Component (B). The addition of such compounds in a proportion greater than 50 weight % is undesirable because it exacerbates development residue and offers a new drawback of deforming patterns at the time of development.

Such phenolic compounds having molecular weight of 1,000 or below can be synthesized with ease by reference to the methods described in Japanese Patent Laid-Open Nos. 122938/1992 and 28531/1990, U.S. Pat. No. 4,916,210 and European Patent No. 219294.

Examples of carboxyl group-containing alicyclic or aliphatic compounds include carboxylic acid derivatives having steroid structures, such as cholic acid, deoxycholic acid and lithocholic acid, adamantancarboxylic acid derivatives, adamantandicarboxylic acid, cyclohexanecarboxylic acid and cyclohexanedicarboxylic acid, but compounds usable for this purpose should not to be construed as being limited to these examples.

In addition to the fluorine and/or silicon-containing surfactants as Component (E), nonionic surfactants also can be added. Examples of nonionic surfactants usable herein include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylene-sorbitan monostearate, polyoxyethylene-sorbitan trioleate and polyoxyethylenesorbitan tristearate.

These surfactants may be added alone, or can also be added as some combinations.

<<Way of Using>>

The present positive resist composition is prepared by dissolving the ingredients recited above in a proper organic solvent, preferably the mixed solvent as mentioned above, and coated on the desired substrate in the following manner.

More specifically, the solution dissolving the positive resist composition is coated on a substrate used for production of precision-integrated circuit elements (e.g., silicon/silicon dioxide coating) by means of an appropriate coating machine, such as a spinner or a coater.

The resist composition thus coated is exposed to light via the desired mask, baked, and then development-processed. In this manner, resist patterns of good quality can be obtained. As the exposure light, far ultraviolet light with wavelengths of 250 nm or shorter, preferably 220 nm or shorter, can be used to advantage. Specifically, KrF excimer laser (248 nm), ArF excimer laser (193 nm), F2 excimer laser (157 nm), X-ray and electron beams are included therein.

In the development step, the following developers are usable for the present positive resist composition. Specifically, the developers usable herein are aqueous alkaline solutions containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, or cyclic amines such as pyrrole and piperidine.

To the aqueous alkaline solutions, alcohol and surfactants may further be added in appropriate amounts.

EXAMPLES

The invention will now be illustrated in more detail by reference to the following examples, but these examples should not be construed as limiting the scope of the invention in any way.

Synthesis Example (1)

Synthesis of Resin (1) [Side-Chain Type]

In a reaction vessel, 2-ethyl-2-adamantylmethacrylate and butyrolactone methacrylate were placed in proportions of 55:45 and dissolved in a 5:5 mixture of methyl ethyl ketone and tetrahydrofuran, thereby preparing 100 ml of a solution having a solids concentration of 20%. This solution was mixed with 2 mole % of V-65 produced by Wako Pure Chemical Industries, Ltd., and then added dropwise to 10 ml of methyl ethyl ketone heated to 60° C. over a period of 4 hours in an atmosphere of nitrogen. After the completion of the addition, the reaction solution was heated for additional 4 hours, admixed again with 1 mole % of V-65, and then stirred for 4 hours. At the conclusion of the reaction, the resultant solution was cooled to room temperature, and poured into 3 liters of a 1:1 mixture of distilled water and isopropyl alcohol. A white powdery matter thus deposited was recovered as Resin (1).

The compositional ratio of the monomers in the resin was 46:54 as determined by $C^{13}$-NMR. The resin had a weight average molecular weight of 10,700 as measured by GPC and calculated in terms of standard polystyrene.

Resins (2) to (13) were synthesized in the same manner as in Synthesis Example (1).

The proportions of monomers constituting each of Resins (2) to (13) and the molecular weight of each resin are shown in Table 1. (The arranging order of Repeating Units 1, 2, 3 and 4 in Table 1 corresponds to the sequence starting from the left in each of the following structural formulae).

TABLE 1

| Resin | Repeating Unit 1 (mole %) | Repeating Unit 2 (mole %) | Repeating Unit 3 (mole %) | Repeating Unit 4 (mole %) | Molecular Weight |
|---|---|---|---|---|---|
| 2 | 53 | 40 | 7 | — | 13,400 |
| 3 | 42 | 31 | 27 | — | 8,300 |
| 4 | 42 | 30 | 28 | — | 10,300 |

TABLE 1-continued

| Resin | Repeating Unit 1 (mole %) | Repeating Unit 2 (mole %) | Repeating Unit 3 (mole %) | Repeating Unit 4 (mole %) | Molecular Weight |
|---|---|---|---|---|---|
| 5 | 39 | 35 | 26 | — | 8,900 |
| 6 | 46 | 22 | 30 | 2 | 12,900 |
| 7 | 38 | 32 | 30 | — | 11,300 |
| 8 | 38 | 31 | 29 | 2 | 11,100 |
| 9 | 35 | 6 | 16 | 43 | 13,200 |
| 10 | 46 | 42 | 12 | — | 9,200 |
| 11 | 38 | 32 | 30 | — | 11,300 |
| 12 | 42 | 18 | 38 | 2 | 13,800 |

The structural formulae of Resins (1) to (12) are illustrated below:

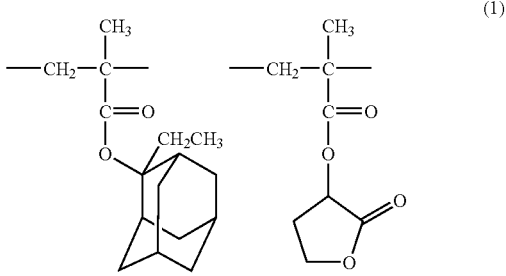

(1)

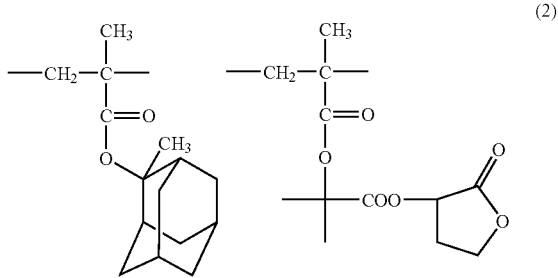

(2)

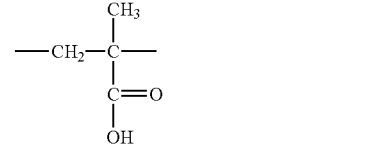

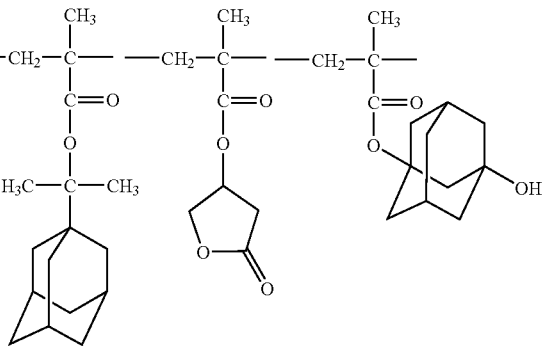

(3)

(4)
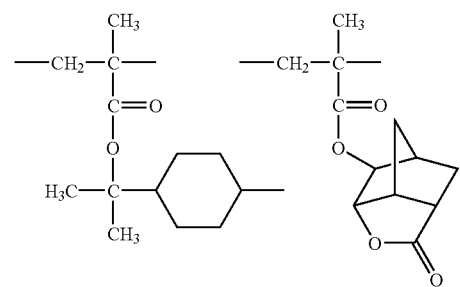
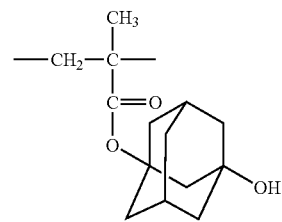
(5)
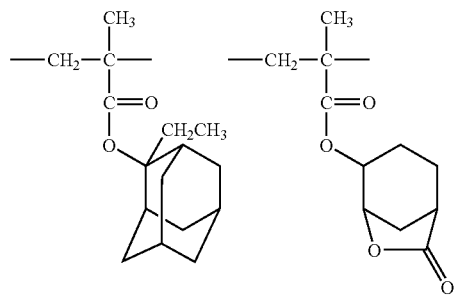
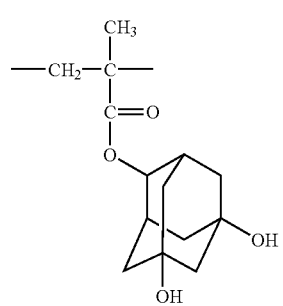
(6)
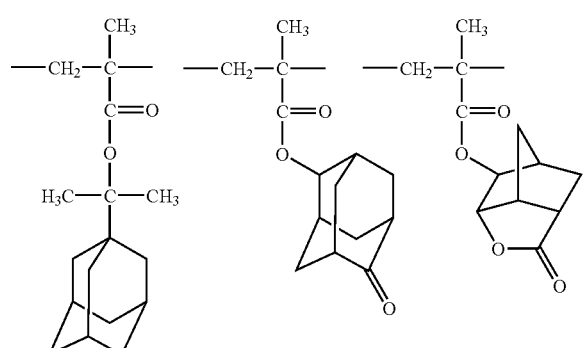
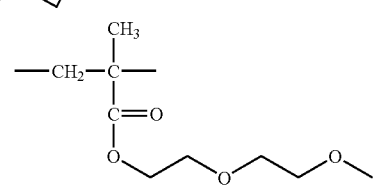
(7)
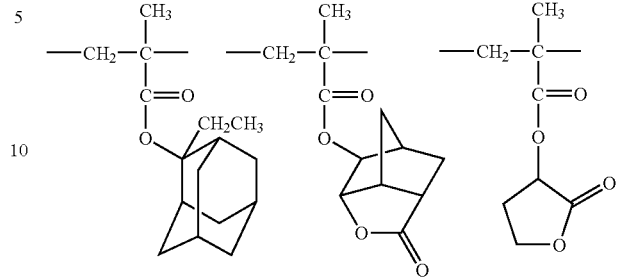
(8)
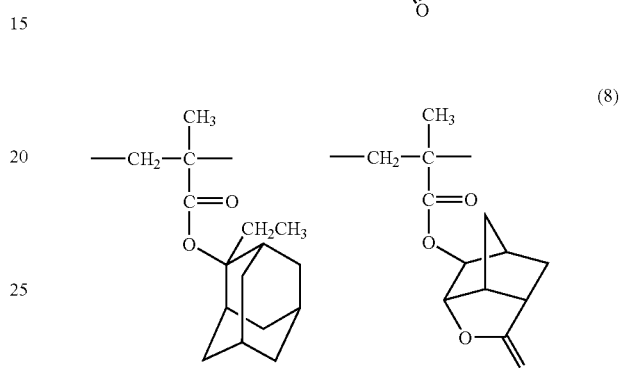
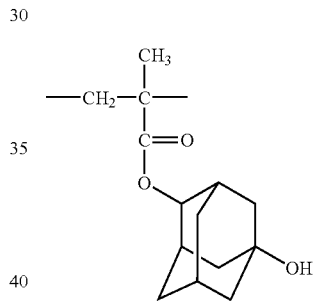
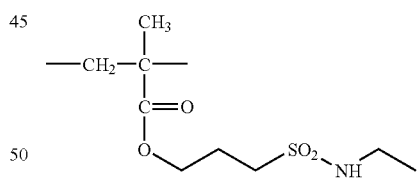
(9)
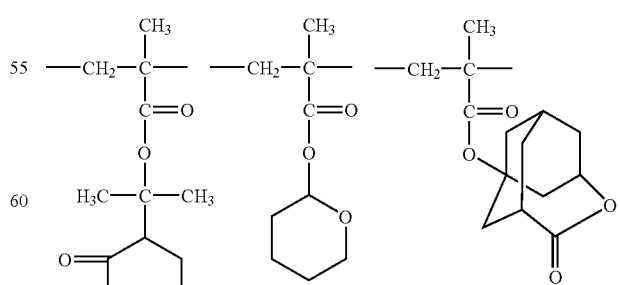

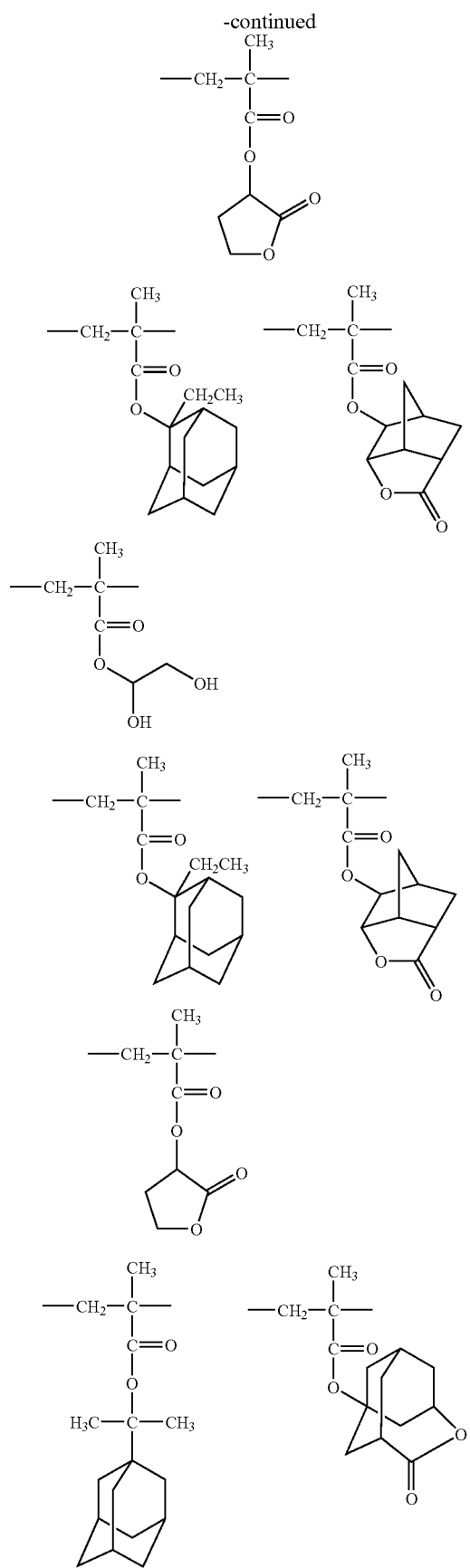

(10)

(11)

(12)

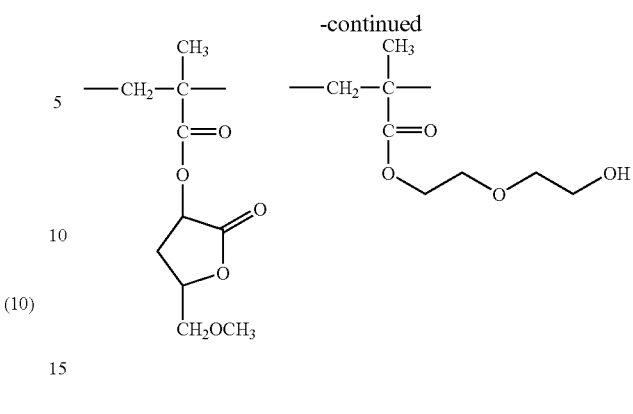

Synthesis Example (2)

Synthesis of Resin (13) [Main-Chain Type]

In a separable flask, norbornene carboxylic acid t-butyl ester, norbornene carboxylic acid butyrolactone ester and maleic anhydride were placed in proportions of 40:10:50 by mole, and thereto THF was added in an amount that the solids concentration was adjusted to 60 weight %. The resultant mixture was heated at 60° C. in a stream of nitrogen. At the time when the reaction system reached thermal stability, the reaction was commenced by addition of 2 mole % of V-601 produced by Wako Pure Chemical Industries, Ltd. And heating was continued for 12 hours. The reaction mixture obtained was diluted with two parts of tetrahydrofuran, and then poured into a 1:1 mixture of hexane and isopropyl alcohol. A white powdery matter thus deposited was filtered off, and then dried to yield the intended Resin (13).

As a result of molecular weight analysis by GPC, it was found that Resin (13) thus synthesized had a weight average molecular weight of 8,300 as calculated in terms of standard polystyrene. And it was confirmed by NMR analysis that the molar ratio between norbornene carboxylic acid t-butyl ester, norbornene carboxylic acid butyrolactone ester and maleic anhydride repeating units was 42:8:50.

Resins (14) to (17) were synthesized in the same manner as in Synthesis Example (2).

The proportions of monomers constituting each of Resins (14) to (17) and the molecular weight of each resin are shown in Table 2. (The arranging order of alicyclic olefin Repeating Units 1, 2 and 3 in Table 2 corresponds to the sequence starting from the left in each of the following structural formulae).

TABLE 2

| Resin | Alicyclic Olefin Unit 1 (mole %) | Alicyclic Olefin Unit 2 (mole %) | Maleic Anhydride (mole %) | Molecular Weight |
|---|---|---|---|---|
| 14 | 35 | 15 | 50 | 8,200 |
| 15 | 31 | 19 | 50 | 7,900 |
| 16 | 38 | 12 | 50 | 8,900 |
| 17 | 40 | 10 | 50 | 9,300 |

The structural formulae of Resins (13) to (17) are illustrated below:

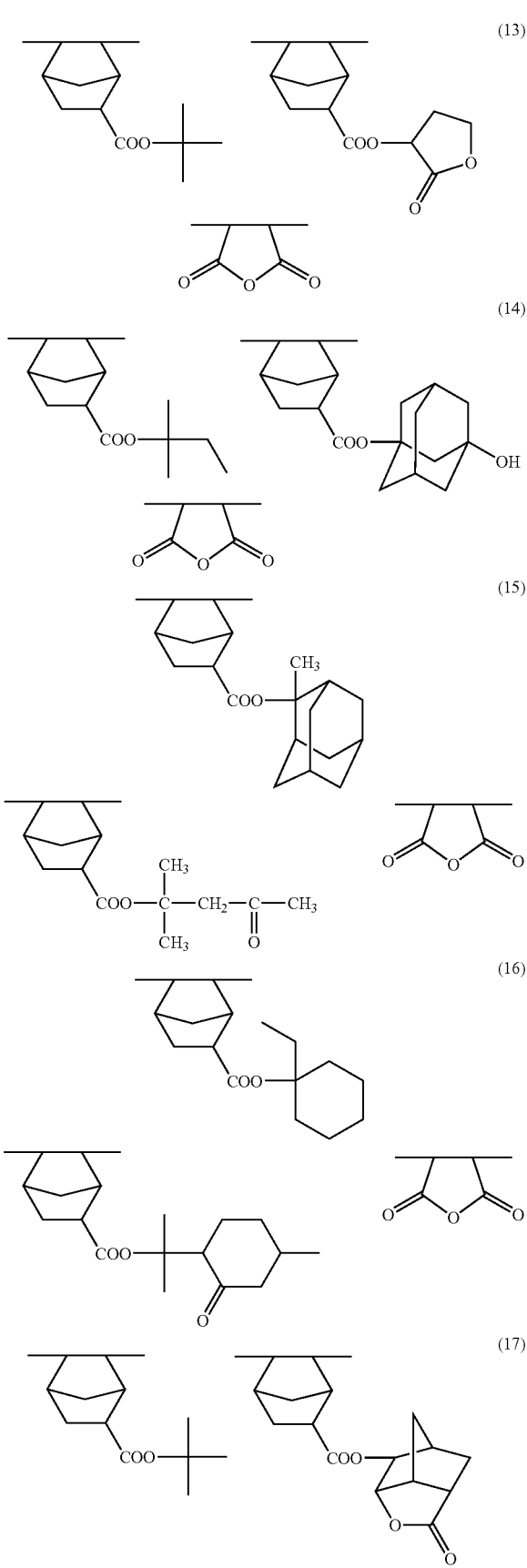

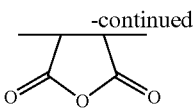

Synthesis Example (3)

Synthesis of Resin (18) [Hybrid Type]

In a reaction vessel, norbornene, maleic anhydride, t-butyl acrylate and 2-methylcyclohexyl-2-propylacrylate were placed in a molar ratio of 35:35:20:10, and dissolved in tetrahydrofuran, thereby preparing a solution having a solids concentration of 60 weight %. This solution was heated at 65° C. in a stream of nitrogen. At the time when the reaction system reached stability in temperature, the reaction was commenced by addition of 1 mole % of V-601 produced by Wako Pure Chemical Industries, Ltd. And heating was continued for 8 hours. The reaction mixture obtained was diluted with two parts of tetrahydrofuran, and then poured into hexane having a volume five times as large as the reaction mixture volume. A white powdery matter thus deposited was filtered off, dissolved in methyl ethyl ketone, reprecipitated from 5 parts of a 1:1 mixed solvent of hexane and t-butyl methyl ether. The thus precipitated white powder was filtered off, and then dried to yield the intended Resin (18).

As a result of molecular weight analysis by GPC, it was found that Resin (18) thus synthesized had a weight average molecular weight of 12,100 as calculated in terms of standard polystyrene. And it was confirmed by NMR analysis that the molar ratio between norbornene, maleic anhydride, t-butyl acrylate and 2-methylcyclohexyl-2-propylacrylate was 32:39:19:10.

Resins (19) to (24) were synthesized in the same manner as in Synthesis Example (3).

The proportions of monomers constituting each of Resins (19) to (24) and the molecular weight of each resin are shown in Table 3.

TABLE 3

| Resin | Norbornenes (mole %) | Acid Anhydride (mole %) | (Meth) acrylate (mole %) | Molecular Weight |
|---|---|---|---|---|
| 19 | 16 | 21 | 36/27 | 13,900 |
| 20 | 15 | 22 | 34/29 | 12,300 |
| 21 | 18 | 24 | 32/26 | 13,000 |
| 22 | 15 | 20 | 29/10/26 | 13,100 |
| 23 | 20 | 22 | 58 | 14,700 |
| 24 | 23 | 28 | 35/14 | 13,300 |

Further, the structural formulae of Resins (18) to (24) are illustrated below:

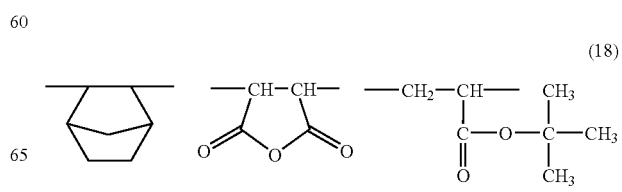

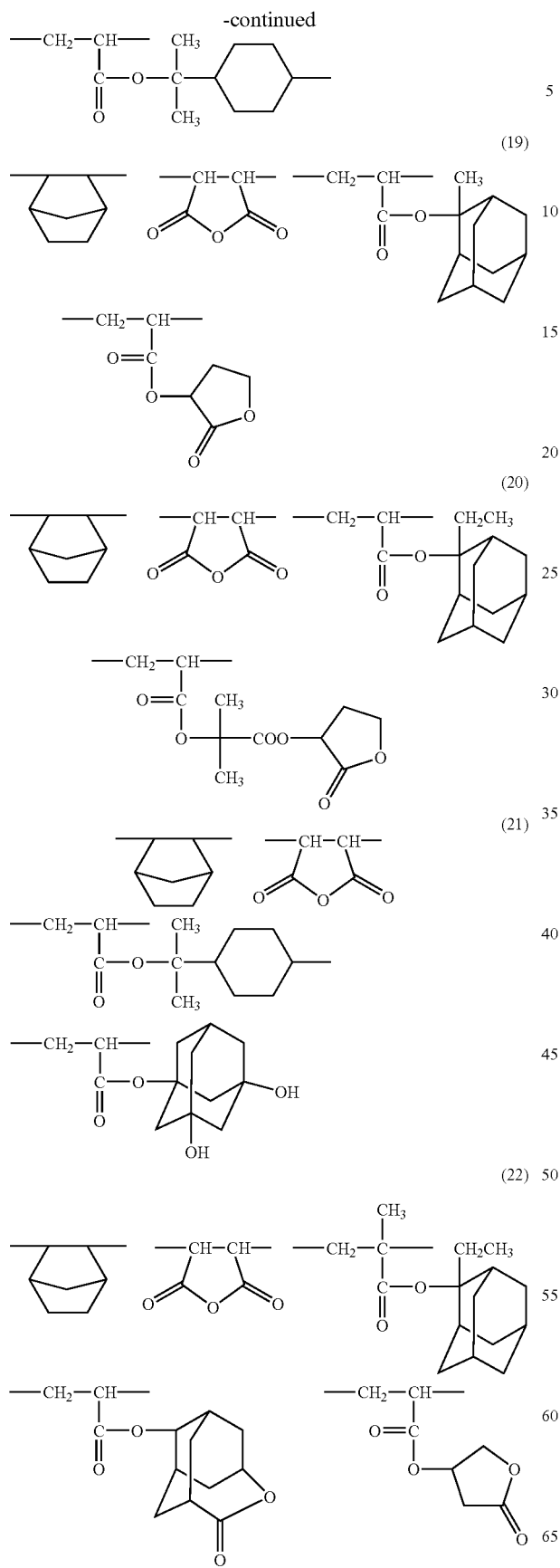
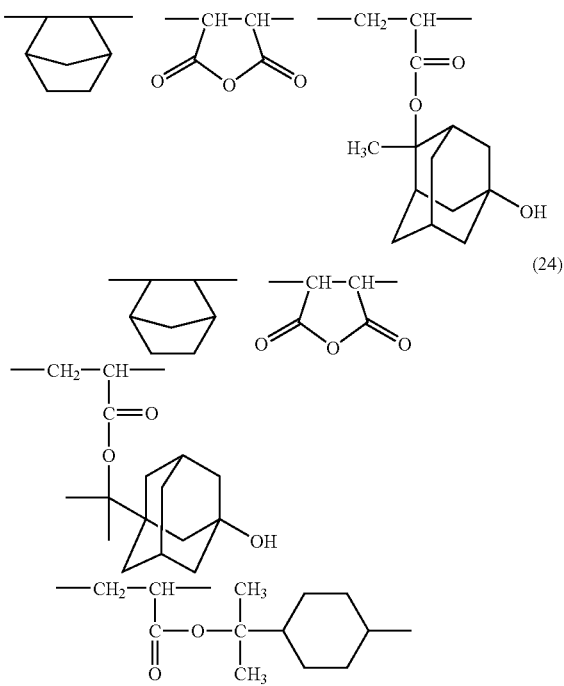

Synthesis Example (4)

Synthesis of Resin (25) [Hybrid Type]

In a reaction vessel, norbornene carboxylic acid t-butyl ester, maleic anhydride, 2-methyl-2-adamantyl acrylate and norbornenelactone acrylate were placed in a molar ratio of 20:20:35:25, and dissolved in a 1:1 mixture of methyl ethyl ketone and tetrahydrofuran, thereby preparing a solution having a solids concentration of 60 weight %. This solution was heated at 65° C. in a stream of nitrogen. At the time when the reaction system reached stability in temperature, the reaction was commenced by addition of 3 mole % of V-601 produced by Wako Pure Chemical Industries, Ltd. And heating was continued for 12 hours. The reaction mixture obtained was poured into five parts of hexane and a white powdery matter was precipitated therefrom. The white powdery matter was dissolved again in a 1:1 mixture of methyl ethyl ketone and tetrahydrofuran, and poured into 5 parts of a mixture of hexane and methyl t-butyl ether, thereby depositing a white powdery matter. Then, the deposited white powdery matter was filtered off. These procedures were repeated again, and dried to yield the intended Resin (25).

As a result of molecular weight analysis (RI analysis) by GPC, it was found that Resin (25) thus synthesized had a weight average molecular weight of 11,600 as calculated in terms of standard polystyrene. The proportion of residual monomers was 0.4%. And it was confirmed by NMR analysis that the molar ratio between norbornene carboxylic acid t-butyl ester, maleic anhydride, 2-methyl-2-adamantyl acrylate and norbornenelactone acrylate was 18:23:34:25.

Resins (26) to (31) were synthesized in the same manner as in Synthesis Example (4).

The proportions of monomers constituting each of Resins (26) to (31) and the molecular weight of each resin are shown in Table 4.
TABLE 4
| Resin | Alicyclic Olefin (mole %) | Monomer of Formula (III) (mole %) | Acrylic Monomers (mole %) | Molecular weight |
|---|---|---|---|---|
| 26 | 24 | 29 | 31/16 | 12,300 |
| 27 | 31 | 35 | 21/13 | 9,200 |
| 28 | 30/6 | 42 | 22 | 7,700 |
| 29 | 38 | 42 | 15/5 | 9,300 |
| 30 | 19 | 24 | 40/17 | 9,500 |
| 31 | 29 | 32 | 34/5 | 10,400 |
The structural formulae of Resins (25) to (31) are illustrated below:
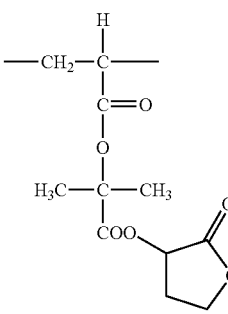
(25)
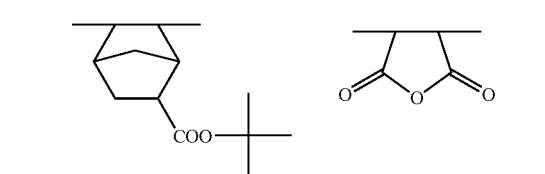
(26)
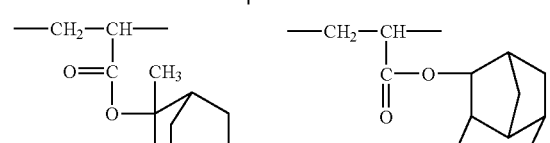
(27)
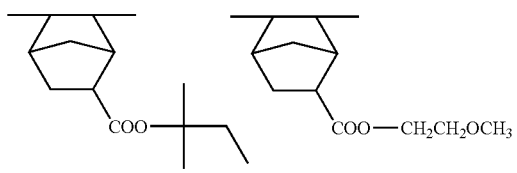
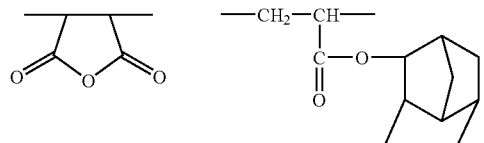
(28)
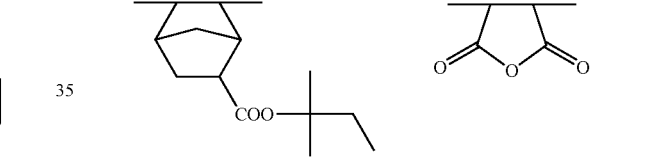
-continued
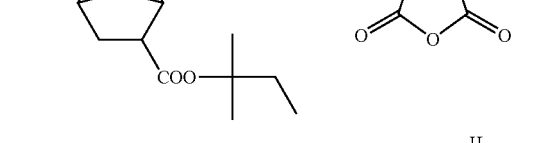
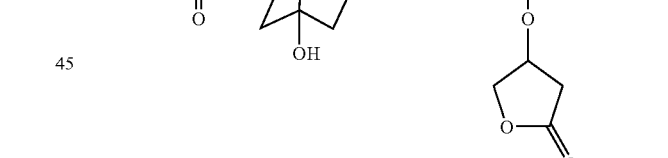
(29)
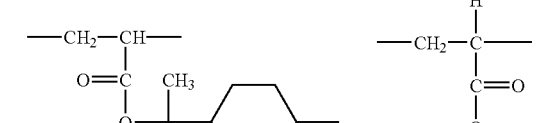
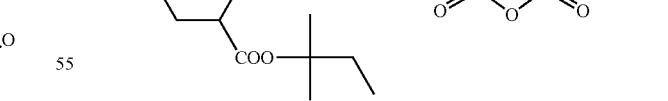
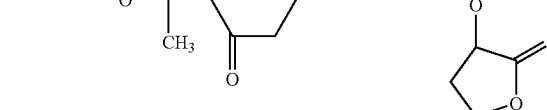
(30)
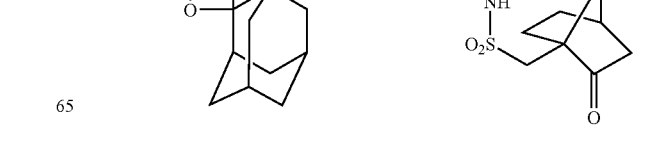
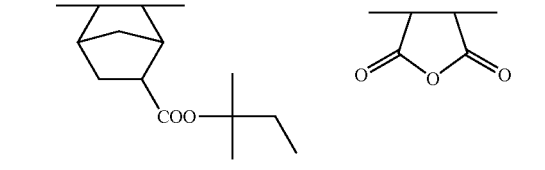

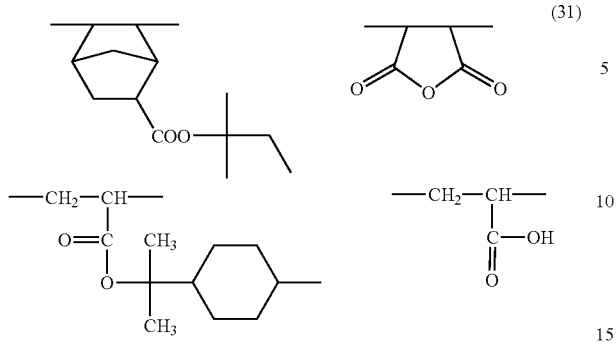

(31)

Synthesis Example (5)

Synthesis of Resin (F1)

In a 1-liter autoclave, 150 ml of a 1,1,2-trichloro-trifluoroethylene containing 9.4 g (0.10 mole) of norbornene and 19.4 g (0.10 mole) of norbornene-2-carboxylic acid t-butyl ester was placed, and thereto 200 psi of pressure was applied under an atmosphere of nitrogen. Further, 20 g (0.20 mole) of tetrafluoroethylene was poured into the autoclave, and the resultant mixture was heated up to 50° C. with stirring. To this reaction solution, 15 ml of a 1,1,2-trichloro-trifluoroethylene solution containing 1.2 g of di(4-t-butylcyclohexyl) peroxycarbonate was added over a 20-minute period, and then the stirring was continued for 20 hours. At the conclusion of the reaction, the reaction solution was poured into 2 liters of methanol with vigorous stirring, thereby depositing a white resin. The resin thus deposited was filtered off, and dried under vacuum to yield 23.5 g of Resin (F1) according to the invention.

By GPC measurement, the weight average molecular weight (Mw) of Resin (F1) was found to be 6,200. When the composition of Resin (F1) was determined by $C^{13}$-NMR measurement, the ratio between the repeating unit (F-1), norbornene and the repeating unit (B-16) was 45:30:25 by mole.

Synthesis Example (6)

Synthesis of Resin (F2)

In 100 ml of MEK, 14.3 g (0.04 mole) of Monomer (a) illustrated below, 3.9 g (0.04 mole) of maleic anhydride and 2.6 g (0.02 mole) of t-butyl acrylate were dissolved, and heated to 70° C. in a stream of nitrogen. Thereto, 0.2 g of V-601 (produced by Wako Pure Chemical Industries, Ltd.) was added as a polymerization initiator, and stirred for 3 hours. Then, 0.2 g of V-601 was further added, and the stirring was continued for additional 4 hours. The resulting reaction solution was poured into 1 liter of t-butyl methyl ether with vigorous stirring to result in deposition of a white resin. The resin thus deposited was filtered off, and dried under vacuum to yield 12.1 g of Resin (F2) according to the invention.

By GPC measurement, the weight average molecular weight (Mw) of Resin (F2) was found to be 8,900. When the composition of Resin (F2) was determined by $C^{13}$-NMR measurement, the ratio between the repeating unit (F-21), maleic anhydride and the repeating unit (B-4) was 39:38:23 by mole.

Synthesis Example (7)

Synthesis of Resin (F3)

In 30 ml of 1-methoxy-2-propanol, 6.7 g (0.015 mole) of Monomer (b) illustrated below, 1.4 g (0.006 mole) of 2-methyl-2-adamantane methacrylate and 1.8 g (0.009 mole) of mevalonic lactone methacrylate were dissolved. Thereto, 70 ml of a 1-methoxy-2-propanol solution containing 0.1 g of 2,2'-azobis(2,4-dimethylvaleronitrile) as a polymerization initiator (V-65, trade name, a product of Wako Pure Chemical Industries, Ltd.), 15.6 g (0.035 mole) of Monomer (b), 3.3 g (0.014 mole) of 2-methyl-2-adamantane methacrylate and 4.2 g (0.021 mole) of mevalonic lactone methacrylate was added dropwise over a 2-hour period. After a lapse of 2 hours, 0.1 g of the initiator was further added, and the reaction was continued for additional two hours. Thereafter, the reaction solution was heated up to 90° C., and stirred for 1 hour. After cooling, the reaction solution was poured into 1 liter of a 1:1 mixture of ion exchange water and methanol with vigorous stirring to result in precipitation of a white resin. The resin obtained was dried under vacuum to yield 15.8 g of Resin (F3) according to the invention.

By GPC measurement, the weight average molecular weight (Mw) of Resin (F3) was found to be 10,200. When the composition of Resin (F3) was determined by $C^{13}$-NMR measurement, the ratio between the repeating units (F-30), (B-7) and (B-11) was 48:21:31 by mole.

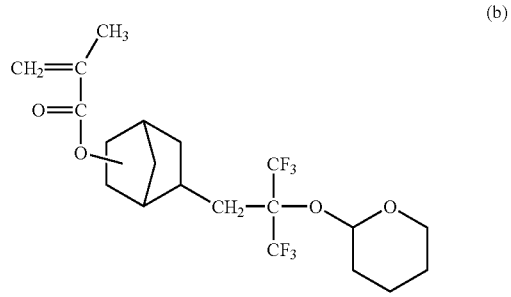

Resins (F4) to (F12) shown in Table 5 were synthesized in manners similar to those in Synthesis Examples (5) to (7).

The proportions of repeating units in each of Resins (F4) to (F12) and the molecular weight of each Resin are shown below.

TABLE 5

Synthesis of Present Resin (B)

| Resin | Composition (Molar Ratio between Repeating Units in Resin) | Molecular weight |
|---|---|---|
| (F4)  | (F-1)/(B-20)/(B-23) = 45/25/30        | 5,800  |
| (F5)  | (F-1)/(F-21)/(B-16) = 48/33/19        | 4,500  |
| (F6)  | (F-22)/maleic anhydride/(B-8) = 48/33/19 | 4,500  |
| (F7)  | (F-30)/(F-48)/(B-2) = 42/17/41        | 12,600 |
| (F8)  | (F-50)/(B-7)/(B-11) = 31/35/34        | 9,200  |
| (F9)  | (F-55)/maleic anhydride/(B-4) = 40/37/23 | 7,400  |
| (F10) | (F-16)/maleic anhydride/(B-8) = 43/34/23 | 6,300  |
| (F11) | (F-26)/maleic anhydride/(B-12) = 40/33/27 | 8,900  |
| (F12) | (F-31)/(F-42)/(B-8) = 44/18/38        | 11,600 |

Synthesis Example (8)

Synthesis of Resin (F13)

In a 1-liter autoclave, 150 ml of a 1,1,2-trichloro-trifluoroethylene containing 9.4 g (0.10 mole) of norbornene and 35.8 g (0.10 mole) of Monomer (a) illustrated below was placed, and thereto 200 psi of pressure was applied under an atmosphere of nitrogen. Further, 20 g (0.20 mole) of tetrafluoroethylene was poured into the autoclave, and the resultant mixture was heated up to 50° C. with stirring. To this reaction solution, 15 ml of a 1,1,2-trichloro-trifluoroethylene solution containing 1.2 g of di(4-t-butylcyclohexyl) peroxycarbonate was added over a 20-minute period, and then the stirring was continued for 20 hours. At the conclusion of the reaction, the reaction solution was poured into 2 liters of methanol with vigorous stirring, thereby depositing a white resin. The resin thus deposited was filtered off, and dried under vacuum to yield 37.4 g of Resin (F13) according to the invention.

By GPC measurement, the weight average molecular weight (Mw) of Resin (F13) was found to be 8,800. When the composition of Resin (F13) was determined by $C^{13}$-NMR measurement, the ratio between the repeating unit (F-1), the repeating unit (F-21) and norbornene was 48:30:22 by mole.

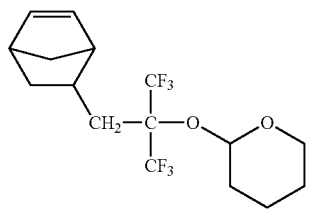
(a)

Synthesis Example (9)

Synthesis of Resin (F14)

In the same manner as in Synthesis Example (8), except that Monomer (c) illustrated below was used in an amount of 32.2 g (0.04 mole) in place of Monomer (a), 34.1 g of Resin (F14) according to the invention was synthesized.

By GPC measurement, the weight average molecular weight (Mw) of Resin (F14) was found to be 7,400. When the composition of Resin (F14) was determined by $C^{13}$-NMR measurement, the ratio between the repeating unit (F-1), the repeating unit (F-15) and norbornene was 49:25:26 by mole.

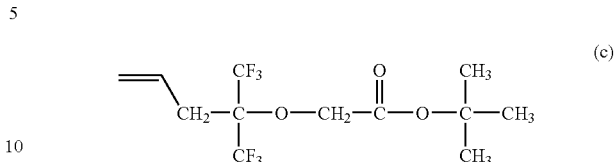
(c)

Resins (F15) to (F22) shown in Table 6 were synthesized in manners similar to those in Synthesis Examples (8) and (9).

The proportions of repeating units in each of Resins (F15) to (F22) and the molecular weight of each Resin are shown below.

TABLE 6

Synthesis of Present Resin (B)

| Resin | Composition (Molar Ratio between Repeating Units in Resin) | Molecular weight |
|---|---|---|
| (F15) | (F-1)/(F-16)/norbornene = 45/26/29 | 8,700 |
| (F16) | (F-1)/(F-20)/(B-4) = 48/30/22 | 9,300 |
| (F17) | (F-2)/(F-22)/(B-4) = 42/39/19 | 7,900 |
| (F18) | (F-7)/(F-20)/norbornene = 35/33/32 | 6,400 |
| (F19) | (F-12)/(F-21)/norbornene = 23/38/39 | 5,800 |
| (F20) | (F-1)/(F-25)/(B-4) = 48/23/29 | 7,200 |
| (F21) | (F-1)/(F-16)/(B-16) = 34/26/40 | 9,500 |
| (F22) | (F-1)/(F-15)/(B-16)/norbornene = 38/21/21/20 | 10,900 |

Synthesis Example (10)

Synthesis of Resin (F23)

In 100 ml of MEK, 14.3 g (0.04 mole) of Monomer (a) illustrated below, 3.9 g (0.04 mole) of maleic anhydride and 11.7 g (0.02 mole) of norbornene-2-carboxylic acid perfluorooctylethyl ester were dissolved, and heated to 70° C. in a stream of nitrogen. Thereto, 0.2 g of V-601 (produced by Wako Pure Chemical Industries, Ltd.) was added as a polymerization initiator, and stirred for 3 hours. Then, 0.2 g of V-601 was further added, and the stirring was continued for additional 4 hours. The resulting reaction solution was poured into 1 liter of t-butyl methyl ether with vigorous stirring to result in deposition of a white resin. The resin thus deposited was filtered off, and dried under vacuum to yield 16.2 g of Resin (F23) according to the invention.

By GPC measurement, the weight average molecular weight (Mw) of Resin (F23) was found to be 8,700. When the composition of Resin (F23) was determined by $C^{13}$-NMR measurement, the ratio between the repeating unit (F-21), the repeating unit (F-55) and maleic anhydride was 42:18:40 by mole.

(a)

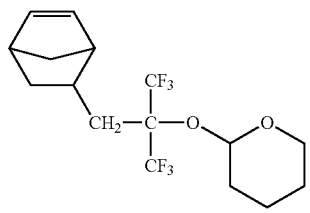

Synthesis Example (11)

Synthesis of Resin (F24)

In 30 ml of 1-methoxy-2-propanol, 6.7 g (0.015 mole) of Monomer (b) illustrated below, 2.7 g (0.005 mole) of perfluotrooctylethyl methacrylate, 1.2 g (0.005 mole) of 2-methyl-2-adamantane methacrylate and 1.0 g (0.005 mole) of mevalonic lactone methacrylate were dissolved. Thereto, 70 ml of a 1-methoxy-2-propanol solution containing 0.1 g of 2,2'-azobis(2,4-dimethylvaleronitrile) as a polymerization initiator (V-65, trade name, a product of Wako Pure Chemical Industries, Ltd.), 15.6 g (0.035 mole) of Monomer (b), 6.4 g (0.012 mole) of perfluorooctylethyl methacrylate, 2.8 g (0.012 mole) of 2-methyl-2-adamantane methacrylate and 2.4 g (0.012 mole) of mevalonic lactone methacrylate was added dropwise over a 2-hour period. After a lapse of 2 hours, 0.1 g of the initiator was further added, and the reaction was continued for additional two hours. Thereafter, the reaction solution was heated up to 90° C., and stirred for 1 hour. After cooling, the reaction solution was poured into 1 liter of a 1:1 mixture of ion exchange water and methanol with vigorous stirring to result in precipitation of a white resin. The resin obtained was dried under vacuum to yield 21.5 g of Resin (F24) according to the invention.

By GPC measurement, the weight average molecular weight (Mw) of Resin (F24) was found to be 10,500. When the composition of Resin (F24) was determined by $C^{13}$-NMR measurement, the ratio between the repeating units (F-30), (F-48), (B-7) and (B-11) was 48:15:18:19 by mole.

(b)

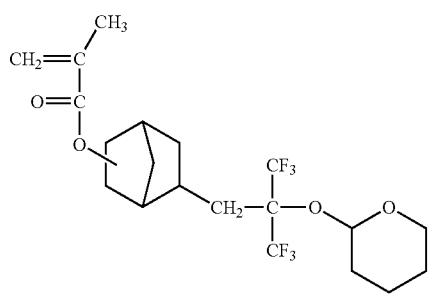

Resins (F25) to (F32) shown in Table 7 were synthesized in manners similar to those in Synthesis Examples (10) and (11).

The proportions of repeating units in each of Resins (F25) to (F32) and the molecular weight of each Resin are shown below.

TABLE 7

Synthesis of Present Resin (B)

| Resin | Composition (Molar Ratio between Repeating Units in Resin) | Molecular weight |
|---|---|---|
| (F25) | (F-15)/(F-58)/maleic anhydride = 30/24/46 | 9,700 |
| (F26) | (F-16)/(F-55)/(B-4)/maleic anhydide = 26/14/22/38 | 10,600 |
| (F27) | (F-21)/(F-60)/(B-4)/maleic anhydride = 28/14/21/37 | 8,500 |
| (F28) | (F-21)/(F-64)/maleic anhydride = 37/23/40 | 9,400 |
| (F29) | (F-25)/(F-55)/(B-4)/maleic anhydride = 21/18/25/36 | 7,800 |
| (F30) | (F-30)/(F-50)/(B-2)/(B-12) = 45/16/15/24 | 10,400 |
| (F31) | (F-30)/(F-53)/(B-8)/(B-11) = 40/18/25/17 | 9,700 |
| (F32) | (F-30)/(F-54)/(B-7)/(B-13) = 38/15/31/16 | 9,900 |

Synthesis Example (12)

Synthesis of Resin (F33)

In 100 ml of N,N-dimethylacetamide, 13.5 g (0.05 mole) of 4-[bis(trifluoromethyl)-hydroxymethyl]styrene and 3.4 g (0.05 mole) methacrylonitrile were dissolved, and heated up to 70° C. in a stream of nitrogen. Thereto, 0.1 g of 2,2'-azobis (2,4-dimethylvaleronitrile) (V-65, trade name, a product of Wako Pure Chemical Industries, Ltd.) was added as a polymerization initiator, and stirred for 3 hours. Further, 0.1 g of V-65 was added, and the stirring was continued for 4 hours. Thereafter, the reaction solution was poured into 1 liter of a mixture of methanol and t-butyl methyl ether with vigorous stirring, resulting in deposition of a white resin. The resin deposited was filtered off, dried under vacuum, and then dissolved in 100 ml of THF. Thereto, 2.9 g (0.04 mole) of ethyl vinyl ether was added, admixed with a catalytic amount of p-toluenesulfonic acid, and stirred for 8 hours at room temperature. To the resulting reaction solution, triethylamine was added in an amount twice as much as the p-toluenesulfonic acid was used, thereby stopping the reaction. The resulting solution was poured into 3 liters of extremely purified water with vigorous stirring. The thus deposited matter was filtered off, and dried to yield 14.1 g of the intended Resin (F33) according to the invention.

By GPC measurement, the weight average molecular weight (Mw) of Resin (F33) was found to be 10,900. When the composition of Resin (F33) was determined by $C^{13}$-NMR and IR measurements, the ratio between the repeating units (F-39), (F-42) and (C-10) was 16:36:48 by mole.

Resins (F34) to (F40) shown in Table 8 were synthesized in the same manner as in Synthesis Example (12).

The proportions of repeating units in each of Resins (F34) to (F40) and the molecular weight of each Resin are shown below.

TABLE 8

Synthesis of Present Resin (B)

| Resin | Composition (Molar Ratio between Repeating Units in Resin) | Molecular weight |
|---|---|---|
| (F34) | (F-39)/(F-41)/(C-10) = 14/38/48 | 11,100 |
| (F35) | (F-44)/(C-10) = 53/47 | 9,800 |
| (F36) | (F-42)/(C-12) = 55/45 | 10,700 |
| (F37) | (F-39)/(F-43)/(C-10) = 13/39/48 | 12,600 |
| (F38) | (F-1)/(F-21)/(C-5) = 40/35/25 | 6,800 |

TABLE 8-continued

Synthesis of Present Resin (B)

| Resin | Composition (Molar Ratio between Repeating Units in Resin) | Molecular weight |
|---|---|---|
| (F39) | (F-19)/maleic anhydride/(C-8) = 35/33/32 | 8,300 |
| (F40) | (F-1)/(B-4)/(C-8) = 43/34/23 | 7,400 |

Synthesis Example (13)

Synthesis of Resin (F42)

In a 100 ml 3-necked flask equipped with a condenser and a nitrogen conduit, 4-(2-hydroxyhexafluoroisopropyl) styrene (produced by Central Glass Co., Ltd.) and 4-(1-methoxyethoxy)styrene (produced by TOSHO CORPORATION) were placed at a ratio of 50/50 by mole, and thereto tetrahydrofuran was added to prepare 30 g of a reaction solution containing the monomers in a concentration of 30 weight %. The reaction solution was heated up to 65° C. with stirring in a stream of nitrogen. Thereto, an azo type of polymerization initiator V-5 (produced by Wako Pure Chemical Industries, Ltd.) was added in a proportion of 5.0 mole % to the total monomers used, and underwent 8 hours reaction with stirring in a stream of nitrogen. By mixing the resulting reaction solution with 200 ml of hexane, the polymer thus precipitated was separated from monomers remaining unreacted, and then underwent purification. By $C^{13}$-NMR measurement, it was found that the polymer thus obtained was composed of the foregoing monomers in proportions of 49:51.

Further, GPC analysis (in THF solvent, calculated in terms of standard polystyrene) of the polymer obtained revealed that the weight average molecular weight was 10,200, the dispersion degree was 2.20 and the proportions of polymers having molecular weight of 1,000 or below was 15 weight %.

Resins (F41) to (F50) shown in Table 9 were synthesized in the same manner as in Synthesis Example (13).

The proportions of repeating units in each of Resins (F41) to (F50) and the molecular weight of each Resin are shown below.

TABLE 9

| Resin | Composition (Molar Ratio between Repeating Units in Resin) | Molecular weight |
|---|---|---|
| (F41) | (IIa-1)/(A-1) = 48/52 | 8,900 |
| (F42) | (IIa-1)/(A-2) = 49/51 | 10,200 |
| (F43) | (IIa-1)/(A-3') = 53/47 | 5,800 |
| (F44) | (IIa-1)/(A-10) = 61/39 | 9,200 |
| (F45) | (IIa-1)/(A-19) = 64/36 | 8,500 |
| (F46) | (IIa-1)/(A-34) = 60/40 | 8,600 |
| (F47) | (IIa-1)/(A-35) = 51/49 | 8,800 |
| (F48) | (IIa-1)/(A-36) = 50/50 | 8,400 |
| (F49) | (IIa-2)/(A-19) = 64/36 | 10,100 |
| (F50) | (IIa-3)/(A-20) = 61/39 | 9,200 |

Synthesis Example (14)

Synthesis of Resin (k-1)

VP15000 (produced by Nippon Soda Co., Ltd.) in an amount of 100 g and propylene glycol monomethyl ether acetate (PGMEA) in an amount of 400 g were placed in a flask, dissolved, and underwent component distillation under reduced pressure to result in removal of water as an azeotropic mixture with PGMEA.

After it was checked that the water content was lowered to a sufficient degree, the resulting solution was admixed with 25.0 g of ethyl vinyl ether and 0.02 g of p-toluenesulfonic acid, and then stirred for one hour at room temperature.

To the reaction solution, 0.03 g of triethylamine was added to stop the reaction. The resulting solution was admixed with 400 ml of water and 800 ml of ethyl acetate, and separated into two phases, followed by washing. From the reaction mixture obtained, ethyl acetate, water and PGMEA as an azeotropic component were removed by vacuum distillation to yield Resin k-1 having substituent groups relating to the invention (30% PGMEA solution).

Resins (k-2) to (k-15) shown in Table 10 were synthesized in the same manner as in Synthesis Example (14).

The proportions of repeating units in each of Resins (k-1) to (k-15) and the molecular weight of each Resin are shown below.

TABLE 10

| Resin | Molecular weight | Proportions of repeating units[*] |
|---|---|---|
| k-1 | 17,000 | 40/60 |
| k-2 | 17,000 | 27/73 |
| k-3 | 17,000 | 23/77 |
| k-4 | 17,000 | 35/65 |
| k-5 | 17,000 | 20/80 |
| k-6 | 17,000 | 35/55/10 |
| k-7 | 17,000 | 27/63/10 |
| k-8 | 17,000 | 18/72/10 |
| k-9 | 17,000 | 30/60/10 |
| k-10 | 17,000 | 20/75/5 |
| k-11 | 12,000 | 70/30 |
| k-12 | 13,000 | 10/60/30 |
| k-13 | 14,000 | 15/60/25 |
| k-14 | 17,000 | 35/65 |
| k-15 | 17,000 | 30/10/60 |

[*]The arranging order of repeating units corresponds to the sequence starting from the left in the structural formula of each resin.

Examples 1 to 49 And Comparative Examples 1 to 10

<Preparation and Evaluation of Positive Resist Composition>

The resins set forth in Tables 11 to 13, which were synthesized in Synthesis Examples (1) to (14), were each weighed out in an amount of 1.03 g, and mixed with one or two of the photo-acid generators as shown in Tables 11 to 13 in amounts as specified in Tables 11 to 13, 0.05 g of one of the present compounds as shown in Tables 11 to 13, 1.65 mg of one of the basic compounds as shown in Tables 11 to 13, and one of the surfactants as shown in Tables 11 to 13 in a proportion of 100 ppm to the total ingredients. Each mixture was dissolved in a 7:3 mixture of propylene glycol monomethyl ether acetate and propylene glycol monomethyl ether so that the resultant solution had a solids concentration of 11 weight %, and then filtered through a 0.1 μm microfilter. Thus, positive resist compositions of Examples 1 to 49 and Comparative Examples 1 to 10 were each prepared.

TABLE 11

| Example | Resin | Photo-Acid Generator (amount added, mg) | Present Compound | N-containing Compound | Surfactant |
|---|---|---|---|---|---|
| 1 | 1 | z34 (16) | 4 | C-1 | W-1 |
| 2 | 2 | z34/z31 (16/32) | 6 | C-2 | W-2 |
| 3 | 3 | z33 (16) | 8 | C-3 | W-3 |
| 4 | 4 | z33 (20) | 18 | C-4 | W-4 |
| 5 | 5 | z34 (16) | 17 | C-5 | W-1 |
| 6 | 6 | z33/z40 (16/32) | 34 | C-6 | W-2 |
| 7 | 7 | z14 (20) | 44 | C-7 | W-3 |
| 8 | 8 | z33/z31 (16/32) | 46 | C-8 | W-4 |
| 9 | 9 | z33/z31 (16/32) | 90 | C-9 | W-1 |
| 10 | 10 | z33/z31 (16/32) | 54 | C-2 | W-2 |
| 11 | 11 | z33/z31 (16/32) | 56 | C-3 | W-3 |
| 12 | 12 | z33/z31 (16/32) | 98 | C-4 | W-4 |
| 13 | 13 | z33/z31 (16/32) | 100 | C-10 | W-1 |
| 14 | 14 | z33/z31 (16/32) | 56 | C-6 | W-1 |
| 15 | 15 | z33/z31 (16/32) | 55 | C-7 | W-2 |
| 16 | 16 | z33/z31 (16/32) | 66 | C-8 | W-3 |
| 17 | 17 | z13 (16) | 78 | C-1 | W-4 |
| 18 | 18 | z13 (16) | 88 | C-2 | W-1 |
| 19 | 19 | z13 (16) | 89 | C-3 | W-2 |
| 20 | 20 | z13 (16) | 91 | C-4 | W-3 |

TABLE 12

| Example | Resin | Photo-Acid Generator (amount added, mg) | Present Compound | N-containing Compound | Surfactant |
|---|---|---|---|---|---|
| 21 | 21 | z13/z19 (20/40) | 99 | C-5 | W-4 |
| 22 | 22 | z13/z19 (16/32) | 100 | C-6 | W-1 |
| 23 | 23 | z3 (16) | 100 | C-7 | W-2 |
| 24 | 24 | z13 (16) | 99 | C-9 | W-1 |
| 25 | 25 | z5 (16) | 90 | C-1 | W-2 |
| 26 | 26 | z5 (16) | 46 | C-2 | W-3 |
| 27 | 27 | z5/z22 (16/32) | 47 | C-3 | W-4 |
| 28 | 28 | z33/z26 (16/32) | 55 | C-4 | W-1 |
| 29 | 29 | z33/z27 (16/32) | 56 | C-5 | W-2 |
| 30 | 30 | z13/z27 (16/48) | 61 | C-10 | W-3 |
| 31 | 31 | z33/z31 (16/32) | 23 | C-7 | W-4 |
| 32 | k-1 | PAG2-1 (24) | 100 | C-8 | W-1 |
| 33 | k-2 | PAG2-3 (24) | 99 | C-1 | W-2 |
| 34 | k-3 | PAG2-4 (24) | 90 | C-2 | W-3 |
| 35 | k-4 | PAG2-26 (24) | 79 | C-3 | W-4 |
| 36 | k-5 | PAG2-29 (24) | 67 | C-4 | W-1 |
| 37 | k-8 | PAG2-3/PAG2-24 (24/12) | 43 | C-7 | W-2 |
| 38 | k-9 | PAG2-4/PAG5-3 (24/24) | 18 | C-8 | W-3 |
| 39 | k-10 | PAG2-18/PAG5-3 (24/24) | 17 | C-1 | W-4 |

TABLE 13

| Example | Resin | Photo-Acid Generator (amount added, mg) | Present Compound | N-containing Compound | Surfactant |
|---|---|---|---|---|---|
| 40 | k-11 | PAG2-21/PAG6A-1 (24/24) | 8 | C-2 | W-1 |
| 41 | k-12 | PAG2-23/PAG6A-23 (24/24) | 4 | C-3 | W-2 |
| 42 | k-13 | PAG2-1/PAG6A-10 (24/24) | 6 | C-4 | W-3 |
| 43 | F1 | z34/z31 (16/32) | 90 | C-6 | W-1 |
| 44 | F27 | z33 (20) | 99 | C-4 | W-2 |
| 45 | F42 | z33/z31 (16/32) | 94 | C-7 | W-3 |
| 46 | F50 | z13 (16) | 100 | C-1 | W-4 |
| 47 | F25 | z13/z19 (20/40) | 46 | C-3 | W-2 |
| 48 | F33 | PAG2-1/PAG2-30 (24/12) | 56 | C-2 | W-3 |
| 49 | F18 | PAG2-1 (24) | 60 | C-9 | W-1 |

| Compar. Example | Resin | Photo-Acid Generator (amount added, mg) | Present Compound | N-containing Compound | Surfactant |
|---|---|---|---|---|---|
| 1 | 10 | z33/z31 (16/32) | — | C-2 | W-2 |
| 2 | 11 | z33/z31 (16/32) | — | C-3 | W-3 |
| 3 | 12 | z33/z31 (16/32) | — | C-4 | W-4 |
| 4 | 13 | z33/z31 (16/32) | — | C-5 | W-1 |
| 5 | k-1 | PAG2-1 (24) | — | C-8 | W-1 |
| 6 | k-8 | PAG2-3/PAG2-24 (24/6) | — | C-7 | W-2 |
| 7 | k-12 | PAG2-23/PAG6A-23 (24/12) | — | C-3 | W-2 |
| 8 | F1 | z34/z31 (16/32) | — | C-7 | W-3 |
| 9 | F27 | z33 (20) | — | C-1 | W-4 |
| 10 | F42 | PAG2-1 (24) | — | C-3 | W-2 |

The basic compounds used are as follows:
C-1: 1,5-diazabicyclo[4.3.0]-5-nonene
C-2: 1,8-diazabicyclo[5.4.0]-7-undecene
C-3: 4-dimethylaminopyridine
C-4: triphenylimidazole
C-5: diisopropylaniline
C-6: tributylamine
C-7: trioctylamine
C-8: tridecylamine
C-9: N,N-bis(hydroxyethyl)aniline
C-10: 2,2,6,6-tetramethyl-4-hydroxypiperizine
The surfactants used were as follows:
W-1: Megafac F176 (produced by Dainippon Ink & Chemicals, Inc.) (a surfactant containing fluorine atoms)
W-2: Megafac R08 (produced by Dainippon Ink & Chemicals, Inc.) (a surfactant containing fluorine and silicon atoms)
W-3: Organosiloxane polymer KP-341 (produced by Shin-Etsu Chemical Industry Co., Ltd.)
W-4: Troysol S-366 (produced by Troy Chemical Industries, Inc.)

(Evaluation Tests)

ARC-25 produced by Brewer Science Inc. was coated in a thickness of 30 nm on a silicon wafer by use of a spin coater, and then dried. On this coating, each of the solutions of positive resist compositions set forth above was further coated, and dried at 115° C. for 90 seconds. Thus, a photoresist film having a thickness of about 0.4 μm was formed. The photoresist films formed in Examples 1 to 31 and Comparative Examples 1 to 4 were each exposed to ArF excimer laser (193 nm), those formed in Examples 32 to 39 and Comparative Examples 5 and 6 were each exposed to KrF excimer laser (248 nm), those formed in Examples 40 to 42 and Comparative Example 7 were each exposed by an EB irradiation apparatus, and those formed in Examples 43 to 49 and Comparative Examples 8 to 10 were each exposed to F2 excimer laser (157 nm).

After the exposure, each photoresist film was heated at 115° C. for 90 seconds, developed with a 2.38% aqueous solution of tetramethylammonium hydroxide, and rinsed with distilled water. Thus, a resist pattern profile was obtained.

Line edge roughness and pattern topple of each of these pattern profiles were evaluated by the following methods respectively. Evaluation results obtained are shown in Table 14.

[Line Edge Roughness]

The edge roughness of isolated patterns (line width: 0.15 μm) was measured by use of a measuring-type scanning electron microscope (SEM). In the measuring monitor, detection of line pattern edge was carried out at a plurality of positions, and the dispersion (3σ) of variations in the detected positions was taken as the indication of edge roughness. The smaller value thereof means the better resist performance.

[Pattern Topple]: The patterns obtained were examined under a scanning electron microscope (SEM) as to whether the pattern topple had occurred or not. When no occurrence of pattern topple or occurrence of slight pattern topple was observed, the pattern topple performance was regarded as good; while, when occurrence of pattern topple was observed, the pattern topple performance was regarded as bad.

TABLE 14

| Example | Line Edge Roughness (μm) | Pattern Topple |
|---|---|---|
| 1 | 4.3 | good |
| 2 | 4.2 | good |
| 3 | 4.5 | good |
| 4 | 4.4 | good |
| 5 | 4.2 | good |
| 6 | 4.2 | good |
| 7 | 4.1 | good |
| 8 | 4.3 | good |
| 9 | 4.1 | good |
| 10 | 4.2 | good |
| 11 | 4.5 | good |
| 12 | 4.2 | good |
| 13 | 4.3 | good |
| 14 | 4.2 | good |
| 15 | 4.1 | good |
| 16 | 4.2 | good |
| 17 | 4.6 | good |
| 18 | 4.5 | good |
| 19 | 4.2 | good |
| 20 | 4.3 | good |
| 21 | 4.4 | good |
| 22 | 4.2 | good |
| 23 | 4.3 | good |
| 24 | 4.1 | good |
| 25 | 4.3 | good |
| 26 | 4.5 | good |
| 27 | 4.2 | good |
| 28 | 4.3 | good |
| 29 | 4.3 | good |
| 30 | 4.2 | good |
| 31 | 4.5 | good |
| 32 | 4.3 | good |
| 33 | 4.5 | good |
| 34 | 4.2 | good |
| 35 | 4.2 | good |
| 36 | 4.3 | good |
| 37 | 4.2 | good |
| 38 | 4.2 | good |
| 39 | 4.3 | good |
| 40 | 4.3 | good |
| 41 | 4.2 | good |
| 42 | 4.5 | good |
| 43 | 4.6 | good |
| 44 | 4.2 | good |
| 45 | 4.8 | good |
| 46 | 4.4 | good |
| 47 | 4.6 | good |
| 48 | 4.4 | good |
| 49 | 4.7 | good |
| Compar. Ex. 1 | 13.5 | bad |
| Compar. Ex. 2 | 14.1 | bad |
| Compar. Ex. 3 | 13.9 | bad |
| Compar. Ex. 4 | 14.2 | bad |
| Compar. Ex. 5 | 13.8 | bad |
| Compar. Ex. 6 | 14.2 | bad |
| Compar. Ex. 7 | 14.1 | bad |
| Compar. Ex. 8 | 15.2 | bad |
| Compar. Ex. 9 | 14.9 | bad |
| Compar. Ex. 10 | 15.2 | bad |

As can be seen from Table 14, the positive resist compositions according to the invention had excellent edge roughness- and pattern topple-preventing capabilities.

The invention can provide positive resist compositions prevented from causing pattern topple and line edge roughness.

This application is based on Japanese Patent application JP 2002-563, filed Jan. 7, 2002, the entire content of which is hereby incorporated by reference, the same as if set forth at length.

What is claimed is:

1. A positive resist composition comprising the components of:
    (A) a compound capable of generating an acid upon irradiation with one of an actinic ray and a radiation;
    (B) a resin that is insoluble or slightly soluble in alkalis, but becomes alkali-soluble under an action of an acid;
    (C) a basic compound;
    (D) a non-polymeric compound comprising at least three alcoholic hydroxyl groups or at least three substituted alcoholic hydroxyl groups, comprising at least one cyclic structure, and comprising at least one ethereal oxygen-containing tetrahydrofuran or tetrahydropyran ring, and
    (E) a surfactant comprising at least one of a fluorine atom and a silicon atom,
    wherein the component (B) is a resin comprising an alicyclic hydrocarbon group that is monocyclic or polycyclic or a resin having a structure wherein at least one fluorine atom is substituted in at least one of a main chain and a side chain of a polymer, and being capable of decomposing by an action of an acid to increase in solubility in an alkaline developer; and
    the component (D) does not contain a phenolic hydroxyl group or a substituted phenolic hydroxyl group.

2. The positive resist composition according to claim 1, wherein the component (D) is a compound comprising at least three alcoholic hydroxyl groups and at least one cyclic structure, and at least one group selected from the alcoholic hydroxyl groups and other groups of the component (D) is protected with at least one acid-decomposable group.

3. The positive resist composition according to claim 1, further comprising a component of: (F) a mixture of a hydroxyl group-containing solvent and a hydroxyl group-free solvent.

4. The positive resist composition according to claim 3, wherein the hydroxyl group-containing solvent is one of ethylene glycol, ethylene glycol monomethyl ether, ethylene glycol monoethyl ether, propylene glycol, propylene glycol monomethyl ether, propylene glycol monoethyl ether, and ethyl lactate.

5. The positive resist composition according to claim 3, wherein the hydroxyl group-free solvent is one of propylene glycol monomethyl ether acetate, ethyl ethoxypropionate, 2-heptanone, γ-butyrolactone, cyclohexanone, butyl acetate, N-methylpyrrolidone, N,N-dimethylacetamide, ad dimethyl sulfoxide.

6. The positive resist composition according to claim 3, wherein the component (F) comprises the hydroxyl group-free solvent in a proportion of 50 weight % or more.

7. The positive resist composition according to claim 1, wherein the component (D) comprises at least one of a cyclohexane ring and a cyclopentane ring.

8. The positive resist composition according to claim 1, wherein the component (D) comprises 3 to 10 alcoholic hydroxyl groups or 3 to 10 substituted alcoholic hydroxyl groups.

9. The positive resist composition according to claim 1, wherein a mount of the component (A) is 0.1% to 20% by weight a amount of the component (B) is 40% to 99.99% by weight a amount of the component (C) is 0.001% to 10% by weight and a amount of the component (D) is 0.1% to 20% by weight based on a solid content of the composition.

10. The positive resist composition according to claim 1, wherein compound (D) is a cyclic saccharide derivative.

11. The positive resist composition according to claim 1, wherein compound (D) contains at least one acid-decomposable protective group of the formula:

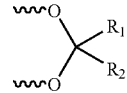

wherein $R_1$ and $R_2$ each independently represent an alkyl, aralkyl or aryl group, or $R_1$ and $R_2$ combine with each other to form a ring.

* * * * *